US008741543B2

(12) United States Patent
Ichikawa et al.

(10) Patent No.: US 8,741,543 B2
(45) Date of Patent: *Jun. 3, 2014

(54) RESIST COMPOSITION AND METHOD FOR PRODUCING RESIST PATTERN

(75) Inventors: Koji Ichikawa, Osaka (JP); Satoshi Yamaguchi, Osaka (JP); Yuki Suzuki, Osaka (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/551,874

(22) Filed: Jul. 18, 2012

(65) Prior Publication Data
US 2013/0022928 A1 Jan. 24, 2013

(30) Foreign Application Priority Data

Jul. 19, 2011 (JP) ................................. 2011-157537

(51) Int. Cl.
G03F 7/039 (2006.01)
G03F 7/20 (2006.01)
G03F 7/30 (2006.01)
G03F 7/38 (2006.01)

(52) U.S. Cl.
USPC ........ 430/270.1; 430/907; 430/910; 430/921; 430/925; 430/311; 430/326; 430/330

(58) Field of Classification Search
None
See application file for complete search history.

(56) References Cited

U.S. PATENT DOCUMENTS

| | | | |
|---|---|---|---|
| 3,779,778 A | 12/1973 | Smith et al. |
| 3,849,137 A | 11/1974 | Barzynski et al. |
| 3,859,099 A | 1/1975 | Petropoulos et al. |
| 4,556,737 A | 12/1985 | Koda et al. |
| 4,576,902 A | 3/1986 | Saenger et al. |
| 4,822,716 A | 4/1989 | Onishi et al. |
| 4,857,437 A | 8/1989 | Banks et al. |
| 5,017,453 A | 5/1991 | Onishi et al. |
| 5,073,476 A | 12/1991 | Meier et al. |
| 5,198,520 A | 3/1993 | Onishi et al. |
| 5,260,410 A | 11/1993 | Schwalm |
| 5,453,341 A | 9/1995 | Schwalm |
| 5,663,035 A | 9/1997 | Masuda et al. |
| 5,916,728 A | 6/1999 | Fukui et al. |
| 5,928,818 A | 7/1999 | Mertesdorf et al. |
| 6,040,112 A | 3/2000 | Yako et al. |
| 6,800,422 B2 | 10/2004 | Thackeray et al. |
| 7,122,542 B2 | 10/2006 | Singh et al. |
| 7,304,175 B2 | 12/2007 | Harada et al. |
| 7,439,006 B2 | 10/2008 | Yoshida et al. |
| 7,452,879 B2 | 11/2008 | Singh et al. |
| 7,511,137 B2 | 3/2009 | Li |
| 7,560,466 B2 | 7/2009 | Singh et al. |
| 7,575,850 B2 | 8/2009 | Takata et al. |
| 7,579,132 B2 | 8/2009 | Harada et al. |
| 7,582,648 B2 | 9/2009 | Singh et al. |
| 7,612,217 B2 | 11/2009 | Sakamoto et al. |
| 7,754,714 B2 | 7/2010 | Li et al. |
| 7,981,589 B2 | 7/2011 | Hasegawa et al. |
| 7,981,989 B2 | 7/2011 | Yan et al. |
| 8,039,200 B2 | 10/2011 | Kodama |
| 8,124,803 B2 | 2/2012 | Yoshida et al. |
| 8,206,886 B2 | 6/2012 | Kodama |
| 8,236,842 B2 | 8/2012 | Yoshida et al. |
| 2002/0058201 A1 | 5/2002 | Miyaji et al. |
| 2005/0113398 A1 | 5/2005 | Argade et al. |
| 2005/0192301 A1 | 9/2005 | Li |
| 2005/0209224 A1 | 9/2005 | Singh et al. |

(Continued)

FOREIGN PATENT DOCUMENTS

| | | |
|---|---|---|
| DE | 3914407 A1 | 10/1990 |
| EP | 0126712 A1 | 11/1984 |

(Continued)

OTHER PUBLICATIONS

Luis et al., "Non Concerted Pathways in the Generation of Dehydroarenes by Thermal Decomposition of Diaryliodonium Carboxylates", Tetrahedron, vol. 45, No. 19, 1989, pp. 6281-6296.
Machine English translation of JP-2010-197413-A dated Sep. 9, 2010.
United States Office Action for copending U.S. Appl. No. 13/551,724 dated May 10, 2013.
United States Office Action for copending U.S. Appl. No. 13/551,855 dated Apr. 25, 2013.
United States Office Action for copending U.S. Appl. No. 13/551,860 dated Mar. 21, 2013.
United States Office Action for copending U.S. Appl. No. 13/551,864 dated Apr. 11, 2013.

(Continued)

*Primary Examiner* — Sin J. Lee
(74) *Attorney, Agent, or Firm* — Birch, Stewart, Kolasch & Birch, LLP

(57) ABSTRACT

A resist composition having a resin having a structural unit represented by the formula (I), a resin being insoluble or poorly soluble in alkali aqueous solution, but becoming soluble in an alkali aqueous solution by the action of an acid and not including the structural unit represented by the formula (I), and an acid generator having an acid labile group,

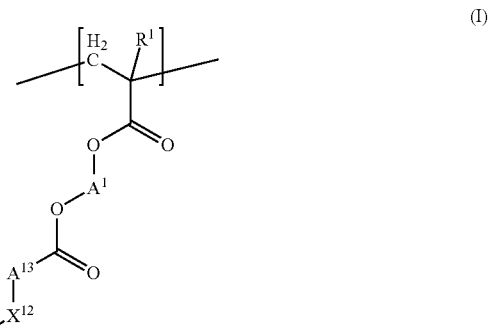

wherein $R^1$, $A^1$, $A^{13}$, $A^{14}$, $X^{12}$ are defined in the specification.

9 Claims, No Drawings

(56) References Cited

U.S. PATENT DOCUMENTS

| | | |
|---|---|---|
| 2005/0234049 A1 | 10/2005 | Singh et al. |
| 2005/0266336 A1 | 12/2005 | Kodama |
| 2006/0035891 A1 | 2/2006 | Li et al. |
| 2006/0167249 A1 | 7/2006 | Argade et al. |
| 2006/0194982 A1 | 8/2006 | Harada et al. |
| 2006/0199100 A1 | 9/2006 | Kanda |
| 2007/0027336 A1 | 2/2007 | Yoshida et al. |
| 2007/0078269 A1 | 4/2007 | Harada et al. |
| 2007/0122750 A1 | 5/2007 | Yamaguchi et al. |
| 2007/0167439 A1 | 7/2007 | Singh et al. |
| 2007/0179140 A1 | 8/2007 | Argade et al. |
| 2007/0225495 A1 | 9/2007 | Singh et al. |
| 2007/0231741 A1 | 10/2007 | Nishi et al. |
| 2007/0299060 A1 | 12/2007 | Li et al. |
| 2008/0009484 A1 | 1/2008 | Argade et al. |
| 2008/0009494 A1 | 1/2008 | Li et al. |
| 2008/0021020 A1 | 1/2008 | Argade et al. |
| 2008/0027045 A1 | 1/2008 | Argade et al. |
| 2008/0044738 A1 | 2/2008 | Harada et al. |
| 2008/0051412 A1 | 2/2008 | Argade et al. |
| 2008/0076063 A1 | 3/2008 | Yoshida et al. |
| 2008/0081925 A1 | 4/2008 | Sakamoto et al. |
| 2008/0193874 A1 | 8/2008 | Takata et al. |
| 2008/0312438 A1 | 12/2008 | Singh et al. |
| 2009/0068591 A1 | 3/2009 | Kawaue et al. |
| 2009/0137589 A1 | 5/2009 | Argade et al. |
| 2009/0176981 A1 | 7/2009 | Argade et al. |
| 2009/0197204 A1 * | 8/2009 | Shiono et al. ............. 430/286.1 |
| 2009/0202945 A1 | 8/2009 | Nakagawa et al. |
| 2009/0208871 A1 | 8/2009 | Kawaue et al. |
| 2009/0317745 A1 | 12/2009 | Mimura et al. |
| 2009/0318687 A1 | 12/2009 | Singh et al. |
| 2010/0035185 A1 | 2/2010 | Hagiwara et al. |
| 2010/0081088 A1 | 4/2010 | Kawaue et al. |
| 2010/0136480 A1 | 6/2010 | Motoike et al. |
| 2010/0203446 A1 | 8/2010 | Ichikawa et al. |
| 2010/0304300 A1 | 12/2010 | Kodama |
| 2011/0020749 A1 * | 1/2011 | Ichikawa et al. ........... 430/270.1 |
| 2011/0039208 A1 | 2/2011 | Hata et al. |
| 2011/0053082 A1 | 3/2011 | Ichikawa et al. |
| 2011/0117495 A1 | 5/2011 | Ichikawa et al. |
| 2011/0171576 A1 | 7/2011 | Yamaguchi et al. |
| 2011/0200935 A1 | 8/2011 | Masuyama et al. |
| 2011/0201823 A1 | 8/2011 | Yoshida et al. |
| 2011/0266534 A1 | 11/2011 | Yan et al. |
| 2011/0318688 A1 | 12/2011 | Hiraoka et al. |
| 2012/0028188 A1 | 2/2012 | Ichikawa et al. |
| 2012/0052443 A1 * | 3/2012 | Masuyama et al. ........ 430/281.1 |
| 2012/0070778 A1 | 3/2012 | Ichikawa et al. |
| 2012/0088190 A1 | 4/2012 | Ichikawa et al. |
| 2012/0100483 A1 | 4/2012 | Masuyama et al. |
| 2012/0135350 A1 | 5/2012 | Kobayashi et al. |
| 2012/0148954 A1 | 6/2012 | Fukumoto et al. |
| 2012/0156620 A1 | 6/2012 | Ichikawa et al. |
| 2012/0219899 A1 | 8/2012 | Ichikawa et al. |
| 2012/0219907 A1 | 8/2012 | Ichikawa et al. |
| 2012/0219909 A1 | 8/2012 | Ichikawa et al. |
| 2012/0219912 A1 | 8/2012 | Ichikawa et al. |
| 2012/0237875 A1 * | 9/2012 | Asano et al. ............... 430/283.1 |
| 2012/0258405 A1 | 10/2012 | Ichikawa et al. |
| 2012/0264059 A1 | 10/2012 | Ichikawa et al. |

FOREIGN PATENT DOCUMENTS

| | | | |
|---|---|---|---|
| JP | 55-164824 | A | 12/1980 |
| JP | 62-69263 | A | 3/1987 |
| JP | 62-153853 | A | 7/1987 |
| JP | 63-26653 | A | 2/1988 |
| JP | 63-146029 | A | 6/1988 |
| JP | 63-146038 | A | 6/1988 |
| JP | 63-163452 | A | 7/1988 |
| JP | 11-52575 | A | 2/1999 |
| JP | 2002-131917 | A | 5/2002 |
| JP | 2002-226436 | A | 8/2002 |
| JP | 2005-221721 | A | 8/2005 |
| JP | 2006-257078 | A | 9/2006 |
| JP | 2006-276851 | A | 10/2006 |
| JP | 2007-119696 | A | 5/2007 |
| JP | 2007-514775 | A | 6/2007 |
| JP | 2007-224008 | A | 9/2007 |
| JP | 2008-013551 | A | 1/2008 |
| JP | 2008-069146 | A | 3/2008 |
| JP | 2008-127367 | A | 6/2008 |
| JP | 2008-209917 | A | 9/2008 |
| JP | 2009-19146 | A | 1/2009 |
| JP | 2009-86358 | A | 4/2009 |
| JP | 2009-145408 | A | 7/2009 |
| JP | 2009-229603 | A | 10/2009 |
| JP | 2010-26478 | A | 2/2010 |
| JP | 2010-111660 | A | 5/2010 |
| JP | 2010-152341 | A | 7/2010 |
| JP | 2010-197413 | A | 9/2010 |
| JP | 2010-204646 | A | 9/2010 |
| JP | 2011-128226 | A | 6/2011 |
| JP | 2012-6907 | A | 1/2012 |
| JP | 2012-8553 | A | 1/2012 |
| WO | WO 2007/116664 | A1 | 10/2007 |
| WO | WO 2008/099869 | A1 | 8/2008 |
| WO | 2011/024953 | A1 | 3/2011 |
| WO | WO 2011/034176 | A1 * | 3/2011 |

OTHER PUBLICATIONS

United States Office Action for copending U.S. Appl. No. 13/551,906 dated Apr. 26, 2013.

United States Office Action for copending U.S. Appl. No. 13/551,980 dated May 9, 2013.

United States Office Action for copending U.S. Appl. No. 13/552,044 dated May 9, 2013.

United States Office Action for copending U.S. Appl. No. 13/552,242 dated May 14, 2013.

United States Office Action for copending U.S. Appl. No. 13/552,273 dated Apr. 23, 2013.

United States Office Action for copending U.S. Appl. No. 13/552,278 dated Apr. 25, 2013.

United States Office Action for copending U.S. Appl. No. 13/552,281 dated Feb. 22, 2013.

United States Office Action for copending U.S. Appl. No. 13/552,315 dated Feb. 25, 2013.

U.S. Restriction Requirement dated Jul. 13, 2012 for U.S. Appl. No. 12/947,349.

* cited by examiner

RESIST COMPOSITION AND METHOD FOR PRODUCING RESIST PATTERN

CROSS-REFERENCE TO RELATED APPLICATIONS

This application claims priority to Japanese Application No. 2011-157537 filed on Jul. 19, 2011. The entire disclosures of Japanese Application No. 2011-157537 is incorporated hereinto by reference.

BACKGROUND OF THE INVENTION

1. Field of the Invention

The present invention relates to a resist composition and a method for producing a resist pattern.

2. Background Information

A resist composition which contains a resin having a polymer containing structural units represented by the formula (u-A) and the formula (u-B), and a polymer containing structural units represented by the formula (u-B), the formula (u-C) and the formula (u-D), as well as an acid generator, is described in Patent document of JP-2010-197413A.

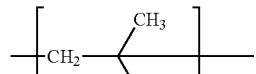
(u-A)

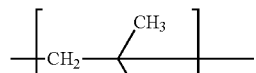
(u-B)

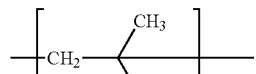
(u-C)

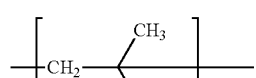
(u-D)

However, with the conventional resist composition, the pattern line edge roughness (LER) and resolution to be provided from the resist composition may be not always satisfied with.

SUMMARY OF THE INVENTION

The present invention provides following inventions of <1> to <10>.

<1> A resist composition having
a resin having a structural unit represented by the formula (I),
a resin being insoluble or poorly soluble in alkali aqueous solution, but becoming soluble in an alkali aqueous solution by the action of an acid and not including the structural unit represented by the formula (I), and
an acid generator having an acid labile group,

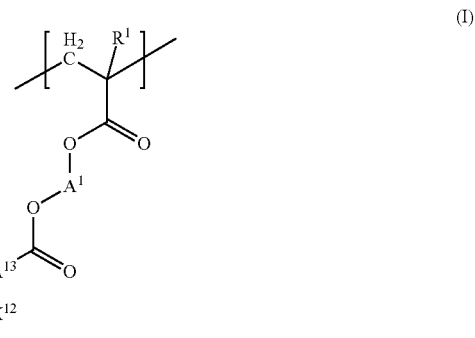
(I)

wherein $R^1$ represents a hydrogen atom or a methyl group;
$A^1$ represents a $C_1$ to $C_6$ alkanediyl group;
$A^{13}$ represents a $C_1$ to $C_{18}$ divalent aliphatic hydrocarbon group that optionally has one or more halogen atoms;
$X^{12}$ represents *—CO—O— or *—O—CO—;
* represents a bond to $A^{13}$;
$A^{14}$ represents a $C_1$ to $C_{17}$ aliphatic hydrocarbon group that optionally has one or more halogen atoms.

<2> The resist composition according to <1>, wherein the acid generator having an acid labile group is an acid generator represented by the formula (II);

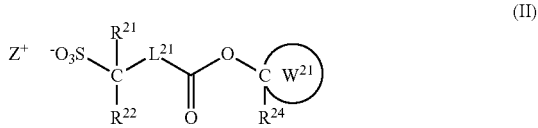
(II)

wherein $R^{21}$ and $R^{22}$ independently represent a fluorine atom or a $C_1$ to $C_6$ perfluoroalkyl group;
$L^{21}$ represents a single bond or a $C_1$ to $C_{20}$ divalent hydrocarbon group, and one or more —$CH_2$— contained in the divalent hydrocarbon group may be replaced by —O— or —CO—;
$R^{24}$ represents a $C_1$ to $C_{12}$ hydrocarbon group;
ring $W^{21}$ represents an optionally substituted $C_3$ to $C_{18}$ hydrocarbon ring;
$Z^+$ represents an organic cation.

<3> The resist composition according to <1> or <2>, wherein $A^1$ in the formula (I) is an ethylene group.

<4> The resist composition according to any one of <1> to <3>, wherein $A^{13}$ in the formula (I) is a $C_1$ to $C_6$ perfluoro alkanediyl group.

<5> The resist composition according to any one of <1> to <4>, wherein $X^{12}$ in the formula (I) is *—CO—O—, * represents a bond to $A^{13}$.

<6> The resist composition according to any one of <1> to <5>, wherein $A^{14}$ in the formula (I) is a cyclopropylmethyl, cyclopentyl, cyclohexyl, norbornyl or adamantyl group.

<7> The resist composition according to any one of <2> to <6>, wherein $L^{21}$ in the formula (II) is a single bond or *—CO—O-$L^{22}$-, $L^{22}$ represents a $C_1$ to $C_6$ alkanediyl group, * represents a bond to the carbon atom of —$CR^{21}R^{22}$—.

<8> The resist composition according to any one of <2> to <7>, wherein $Z^{1+}$ in the formula (II) is a triaryl sulfonium cation.

<9> The resist composition according to any one of <1> to <8>, which further comprises a solvent.

<10> A method for producing a resist pattern comprising steps of;

(1) applying the resist composition any one of <1> to <9> onto a substrate;

(2) drying the applied composition to form a composition layer;

(3) exposing the composition layer;

(4) heating the exposed composition layer, and (5) developing the heated composition layer.

DETAILED DESCRIPTION OF THE PREFERRED EMBODIMENTS

In the chemical structure formulas of the present specification, unless otherwise specified, the suitable choice of carbon number made for the exemplified substituent groups are applicable in all of the chemical structure formulas that have those same substituent groups. Unless otherwise specified, these can include any of straight-chain, branched chain, cyclic structure and a combination thereof. When there is a stereoisomeric form, all stereoisomeric forms included.

"(Meth)acrylic monomer" means at least one monomer having a structure of "$CH_2$=CH—CO—" or "$CH_2$=C($CH_3$)—CO—", as well as "(meth)acrylate" and "(meth) acrylic acid" mean "at least one acrylate or methacrylate" and "at least one acrylic acid or methacrylic acid," respectively.

<Resist Composition>

The resist composition of the present invention contains;
a resin (hereinafter is sometimes referred to as "resin (A)"), and
an acid generator having an acid labile group.

In the specification, the "acid labile group" means a group which has an elimination group and in which the elimination group is detached by contacting with an acid resulting in forming a hydrophilic group such as a hydroxy or carboxy group as described below.

Further, the present resist composition preferably contains a solvent (hereinafter is sometimes referred to as "solvent (E)") and/or an additive such as a basic compound (hereinafter is sometimes referred to as "basic compound (C)") which is known as a quencher in this technical field, as needed.

<Resin (A)>

The resin (A) includes;
a resin having a structural unit represented by the formula (I) (hereinafter is sometimes referred to as "resin (A1)"), and
a resin being insoluble or poorly soluble in alkali aqueous solution, but becoming soluble in an alkali aqueous solution by the action of an acid and not including the structural unit represented by the formula (I) (hereinafter is sometimes referred to as "resin (A2)").

Also, the resin (A) may contain a structural unit other than the resin (A1) and the resin (A2).

<Resin (A1)>

The resin (A1) has a structural unit represented by the formula (I) (hereinafter is sometimes referred to as "structural unit (I)").

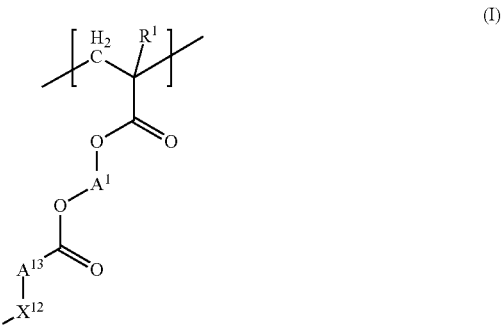

wherein $R^1$ represents a hydrogen atom or a methyl group;
$A^1$ represents a $C_1$ to $C_6$ alkanediyl group;
$A^{13}$ represents a $C_1$ to $C_{18}$ divalent aliphatic hydrocarbon group that optionally has one or more halogen atoms;
$X^{12}$ represents *—CO—O— or *—O—CO—;
* represents a bond to $A^{13}$;
$A^{14}$ represents a $C_1$ to $C_{17}$ aliphatic hydrocarbon group that optionally has one or more halogen atoms.

In the formula (I), examples of the alkanediyl group of $A^1$ include a chain alkanediyl group such as methylene, ethylene, propane-1,3-diyl, propane-1,2-diyl, butane-1,4-diyl, pentane-1,5-diyl, hexane-1,6-diyl; a branched alkanediyl group such as 1-methylpropane-1,3-diyl, 2-methylpropane-1,3-diyl, 2-methylpropane-1,2-diyl, 1-methylbutane-1,4-diyl, 2-methylbutane-1,4-diyl groups.

Examples of the halogen atom of $A^{13}$ include a fluorine, chlorine, bromine and iodine atoms. The fluorine atom is preferable.

The divalent aliphatic hydrocarbon group of $A^{13}$ may be any of a chain and cyclic aliphatic hydrocarbon groups, and a combination of two or more such groups. The aliphatic hydrocarbon group may include a carbon-carbon double bond, is preferably a saturated aliphatic hydrocarbon group, and more preferably an alkanediyl group and a divalent alicyclic hydrocarbon group.

The aliphatic hydrocarbon group that optionally has one or more halogen atoms of $A^{13}$ is preferably a saturated aliphatic hydrocarbon group that optionally has one or more fluorine atoms.

Examples of the chain divalent aliphatic hydrocarbon group that optionally has one or more halogen (preferably fluorine) atoms include methylene, difluoromethylene, ethylene, perfluoroethylene, propanediyl, perfluoropropanediyl, butanediyl, perfluorobutanediyl, pentanediyl, perfluoropentanediyl, dichloromethylene and dibromomethylene groups.

The cyclic divalent aliphatic hydrocarbon group that optionally has one or more halogen (preferably fluorine) atoms may be either monocyclic or polycyclic hydrocarbon group. Examples thereof include a monocyclic aliphatic hydrocarbon group such as cyclohexanediyl, perfluorocyclohexanediyl and perchlorocyclohexanediyl; a polycyclic aliphatic hydrocarbon group such as adamantanediyl, norbornanediyl and perfluoro adamantanediyl groups.

The aliphatic hydrocarbon group of $A^{14}$ may be any of a chain and cyclic aliphatic hydrocarbon groups, and a combination of two or more such groups. The aliphatic hydrocarbon group may include a carbon-carbon double bond, is preferably a saturated aliphatic hydrocarbon group, and more preferably an alkyl group and an alicyclic hydrocarbon group.

The aliphatic hydrocarbon group that optionally has one or more halogen atoms of $A^{14}$ is preferably a saturated aliphatic hydrocarbon group that optionally has one or more fluorine atoms.

Examples of the chain aliphatic hydrocarbon group that optionally has one or more halogen (preferably fluorine) atoms include difluoromethyl, trifluoromethyl, methyl, 1,1,1-trifluoroethyl, 1,1,2,2-tetrafluoroethyl, ethyl, perfluoroethyl, perfluoropropyl, 1,1,1,2,2-pentafluoropropyl, propyl, perfluorobutyl, 1,1,2,2,3,3,4,4-octafluorobutyl, butyl, perfluoropentyl, 1,1,1,2,2,3,3,4,4-nonafluoropentyl, pentyl, hexyl, perfluorohexyl, heptyl, perfluoroheptyl, octyl, perfluorooctyl, trichloromethyl, and tribromomethyl groups.

The cyclic aliphatic hydrocarbon group that optionally has one or more halogen (preferably fluorine) atoms may be either monocyclic or polycyclic hydrocarbon group. Examples thereof include the monocyclic aliphatic hydrocarbon group such as cyclopentyl, cyclohexyl, perfluorocyclohexyl and perchlorocyclohexyl; polycyclic aliphatic hydrocarbon group such as adamantyl, norbornyl and perfluoro adamantyl groups.

Examples of the combination of the chain and cyclic aliphatic hydrocarbon groups include cyclopropylmethyl, cyclopentylmethyl, cyclohexylmethyl, adamantylmethyl and perfluoro adamantylmethyl groups.

$A^1$ in the formula (I) is preferably a $C_2$ to $C_4$ alkanediyl group, and more preferably an ethylene group.

The aliphatic hydrocarbon group of $A^{13}$ is preferably a $C_1$ to $C_6$ aliphatic hydrocarbon group, and more preferably a $C_2$ to $C_3$ aliphatic hydrocarbon group.

The aliphatic hydrocarbon group of $A^{14}$ is preferably a $C_3$ to $C_{12}$ aliphatic hydrocarbon group, and more preferably a $C_3$ to $C_{10}$ aliphatic hydrocarbon group. Among these, $A^{14}$ is preferably a $C_3$ to $C_{12}$ aliphatic hydrocarbon group which include an alicyclic hydrocarbon group, and still more preferably cyclopropylmethyl, cyclopentyl, cyclohexyl, norbornyl and adamantyl groups.

Specific examples of the structural units (I) include as follows.

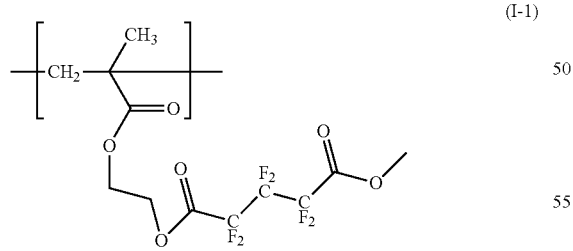
(I-1)

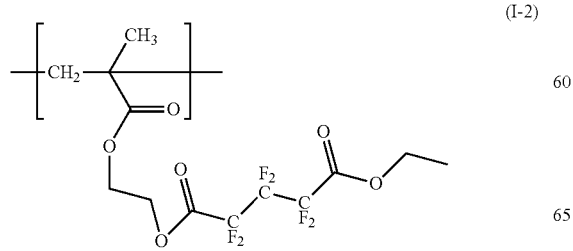
(I-2)

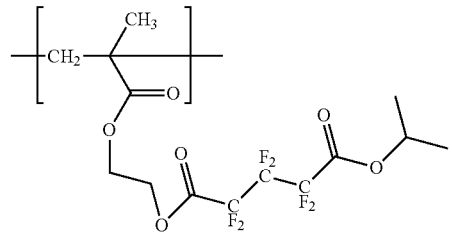
(I-3)

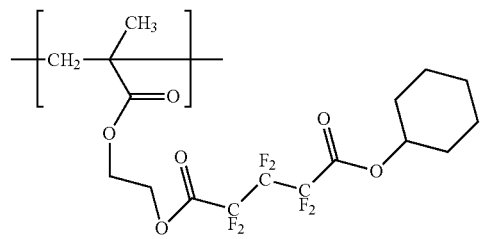
(I-4)

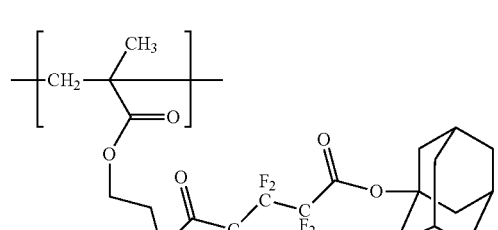
(I-5)

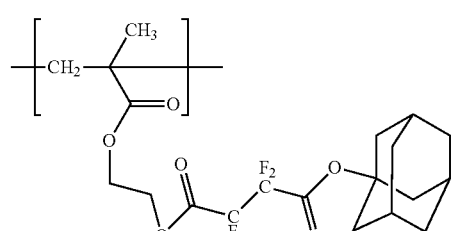
(I-6)

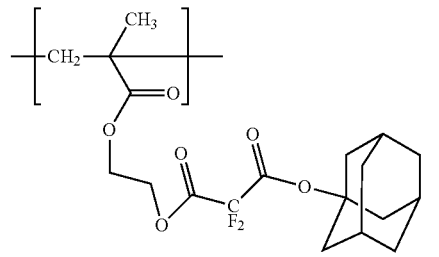
(I-7)

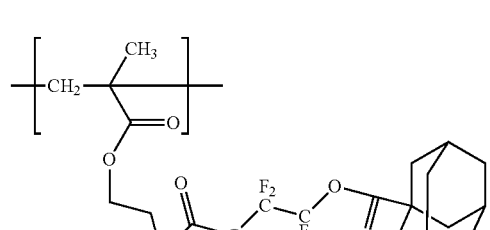
(I-8)

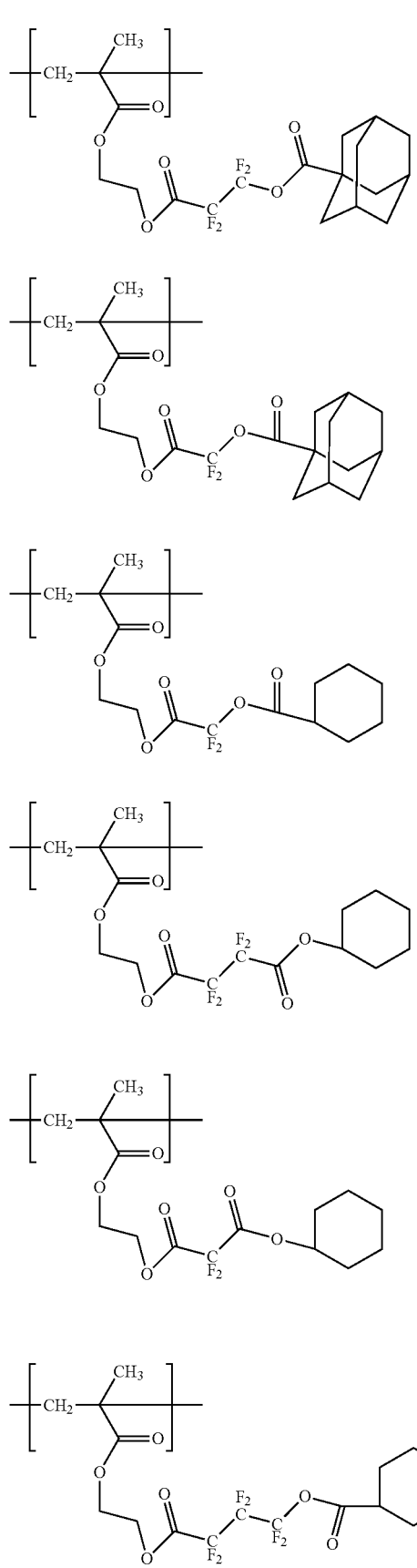

(I-21)
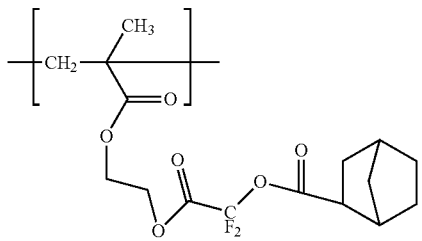

(I-22)
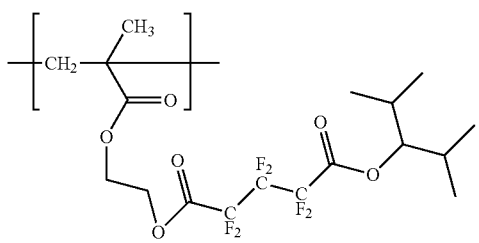

(I-23)
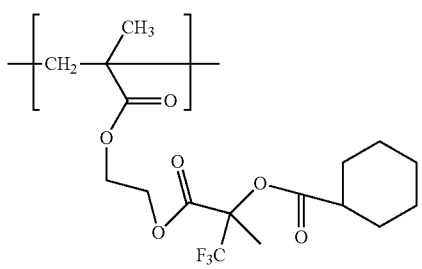

(I-24)
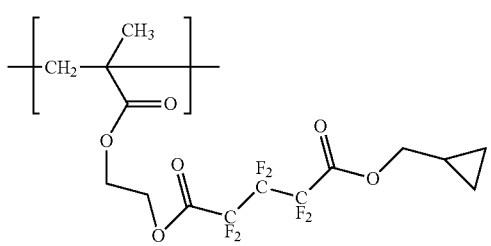

(I-25)
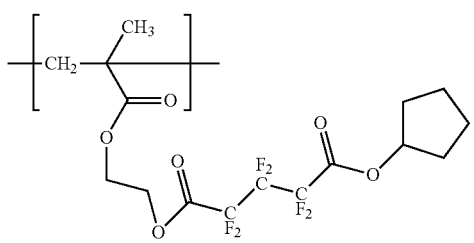

Also, examples of the structural units (I) include structural units in which a methyl group corresponding to $R^1$ in the structural units represented by the above is replaced by a hydrogen atom.

The structural unit (I) is derived from a compound represented by the formula (I'), hereinafter is sometimes referred to as "compound (I')".

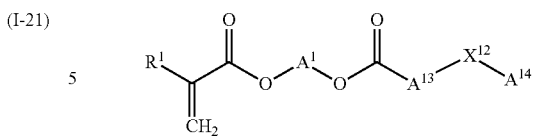
(I')

wherein $R^1$, $A^1$, $A^{13}$, $X^{12}$ and $A^{14}$ have the same definition of the above.

The compound (I') can be produced by a method below.

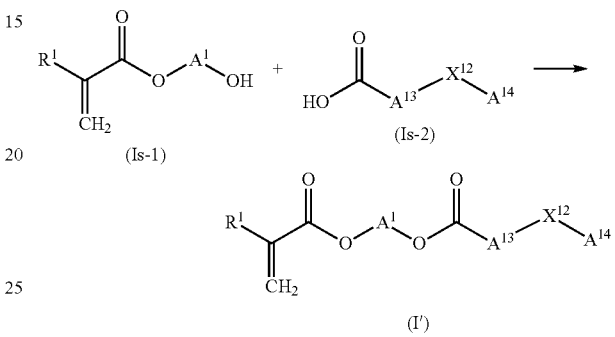

wherein $R^1$, $A^1$, $A^{13}$, $X^{12}$ and $A^{14}$ have the same definition of the above.

The compound (I') can be obtained by reacting a compound represented by the formula (Is-1) with a carboxylic acid represented by the formula (Is-2). This reaction is usually performed in presence of a solvent. Preferred examples of the solvent include tetrahydrofuran and toluene. This reaction may be coexistent with a known esterification catalyst, for example, an acid catalyst, carbodiimide catalyst.

As the compound represented by the formula (Is-1), a marketed product or a compound which is produced by a known method may be used. The known method includes a method condensing (meth)acrylic acid or derivatives thereof, for example, (meth)acrylic chloride, with a suitable diol (HO-$A^1$-OH). The hydroxyethyl methacrylate can be used as a marketed product.

The carboxylic acid represented by the formula (Is-2) can be produced by a known method. Examples of the carboxylic acid represented by the formula (Is-2) include compounds below.

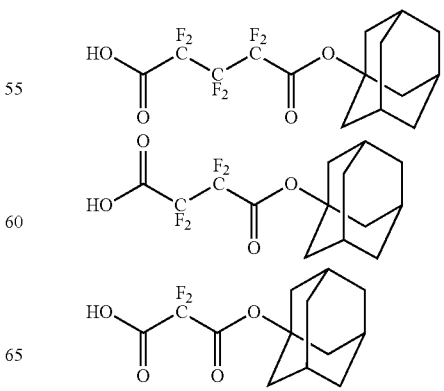

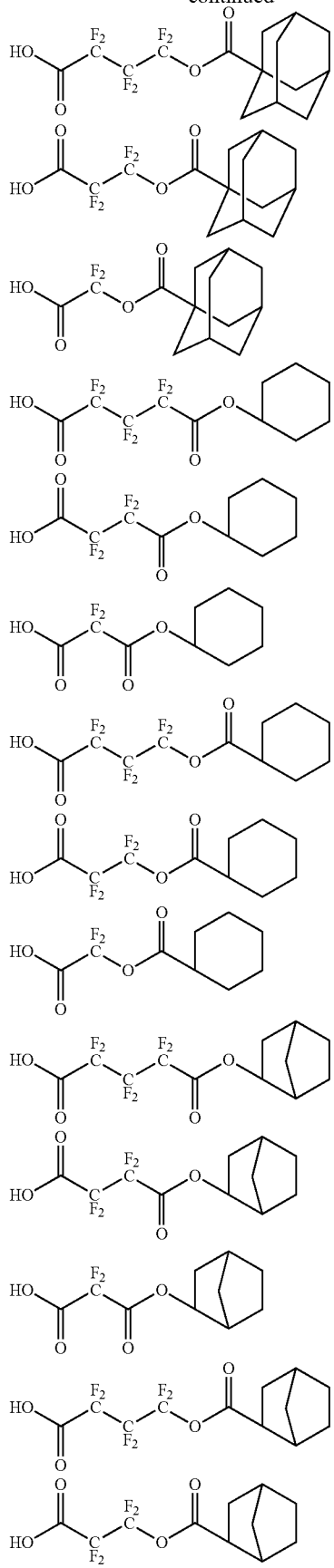

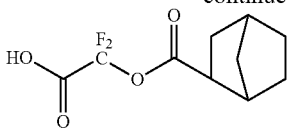

The resin (A1) may include a structural unit other than the structural unit (I).

Examples of the structural unit other than the structural unit (I) include a structural unit derived from a monomer having an acid labile group described below (hereinafter is sometimes referred to as "acid labile monomer (a1)"), a structural unit derived from a monomer not having an acid labile group described below (hereinafter is sometimes referred to as "acid stable monomer"), a structural unit represented by the formula (III-1) (hereinafter is sometimes referred to as "structural unit (III-1)") described below, a structural unit represented by the formula (III-2) (hereinafter is sometimes referred to as "structural unit (III-2)") described below, a structural unit derived from a known monomer in this field. Among these, the structural unit (III-1) and the structural unit (III-2) are preferable.

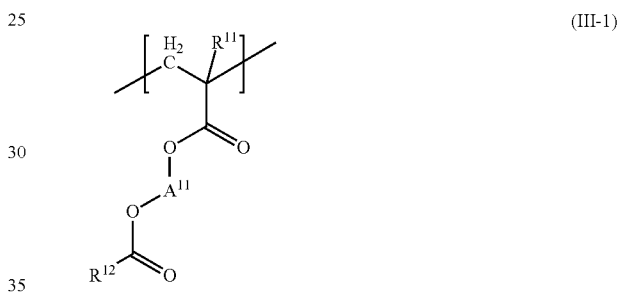

(III-1)

wherein $R^{11}$ represents a hydrogen atom or a methyl group;
$A^{11}$ represents a $C_1$ to $C_6$ alkanediyl group;
$R^{12}$ represents a $C_1$ to $C_{10}$ hydrocarbon group having a fluorine atom.

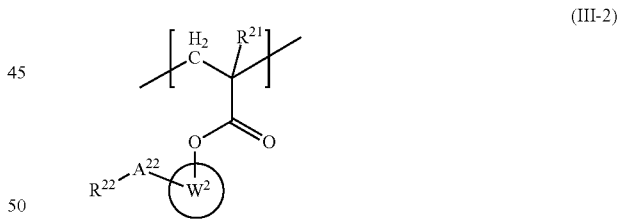

(III-2)

wherein $R^{21}$ represents a hydrogen atom or a methyl group;
ring $W^2$ represents a $C_6$ to $C_{10}$ hydrocarbon ring;
$A^{22}$ represents —O—, *—CO—O— or *—O—CO—, * represents a bond to ring $W^2$;
$R^{22}$ represents a $C_1$ to $C_6$ alkyl group having a fluorine atom.

In the formula (III-1), examples of the alkanediyl group of $A^{11}$ include a chain alkanediyl group such as methylene, ethylene, propane-1,3-diyl, propane-1,2-diyl, butane-1,4-diyl, pentane-1,5-diyl, hexane-1,6-diyl; a branched alkanediyl group such as 1-methylpropane-1,3-diyl, 2-methylpropane-1,3-diyl, 2-methylpropane-1,2-diyl, 1-methylbutane-1,4-diyl and 2-methylbutane-1,4-diyl groups.

The hydrocarbon group having a fluorine atom of $R^{12}$ may be an alkyl group having a fluorine atom and an alicyclic hydrocarbon group having a fluorine atom.

Examples of the alkyl group include methyl, ethyl, n-propyl, iso-propyl, n-butyl, sec-butyl, tert-butyl, iso-butyl, n-pentyl, iso-pentyl, tert-pentyl, neo-pentyl and hexyl groups.

Examples of the alkyl group having a fluorine atom include a fluorinated alkyl group such as, groups described below, difluoromethyl, trifluoromethyl, 1,1-difluoroethyl, 2,2-difluoroethyl, 2,2,2-trifluoroethyl, perfluoroethyl, 1,1,2,2-tetrafluoropropyl, 1,1,2,2,3,3-hexafluoropropyl, perfluoroethylmethyl, 1-(trifluoromethyl)-1,2,2,2-tetrafluoroethyl, perfluoropropyl, 1,1,2,2-tetrafluorobutyl, 1,1,2,2,3,3-hexafluorobutyl, 1,1,2,2,3,3,4,4-octafluorobutyl, perfluorobutyl, 1,1-bis(trifluoro)methyl-2,2,2-trifluoroethyl, 2-(perfluoropropyl)ethyl, 1,1,2,2,3,3,4,4-octafluoropentyl, perfluoropentyl, 1,1,2,2,3,3,4,4,5,5-decafluoropentyl, 1,1-bis(trifluoromethyl)-2,2,3,3,3-pentafluoropropyl, perfluoropentyl, 2-(perfluorobutyl)ethyl, 1,1,2,2,3,3,4,4,5,5-decafluorohexyl, 1,1,2,2,3,3,4,4,5,5,6,6-dodecafluorohexyl, perfluoropentylmethyl and perfluorohexyl groups.

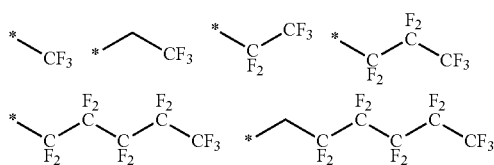

The alicyclic hydrocarbon group is preferably a saturated ring of an aliphatic hydrocarbon group in which a hydrogen atom is removed. Examples of the saturated ring of an aliphatic hydrocarbon group include groups below.

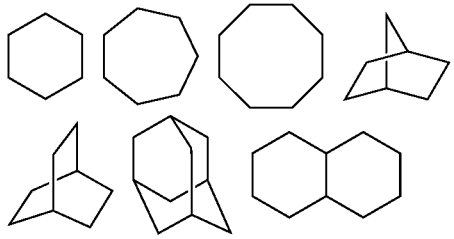

Examples of the alicyclic hydrocarbon group having a fluorine atom include a fluorinated cycloalkyl group such as perfluorocyclohexyl and perfluoroadamantyl groups.

The hydrocarbon ring of ring $W^2$ may be an alicyclic hydrocarbon ring, and preferably a saturated alicyclic hydrocarbon ring. Examples of the saturated alicyclic hydrocarbon ring include adamantane and cyclohexane rings, and adamantane ring is preferable.

Examples of the structural unit (III-1) include structural units below.

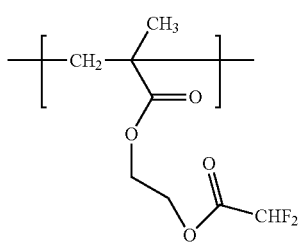
(III-1-1)

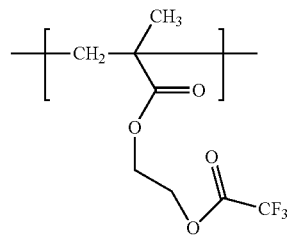
(III-1-2)

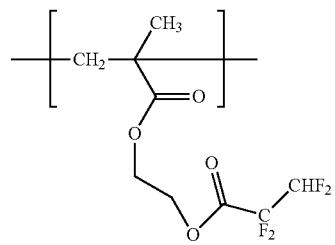
(III-1-3)

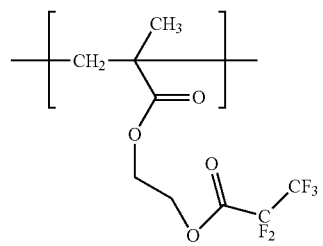
(III-1-4)

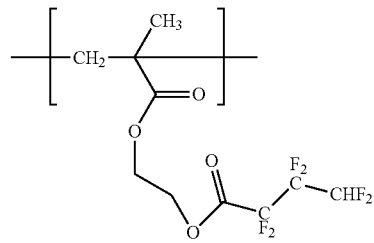
(III-1-5)

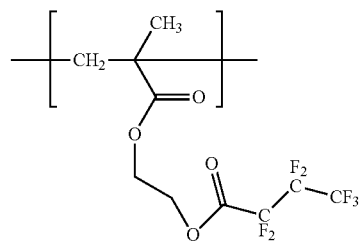
(III-1-6)

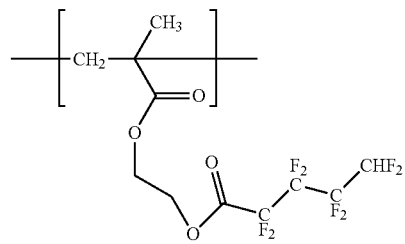
(III-1-7)

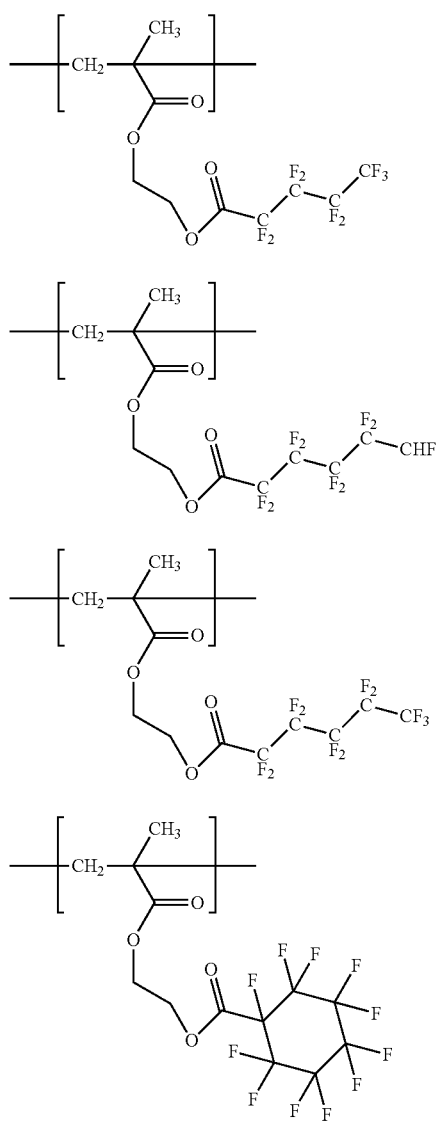
Also, examples of the structural units (III-1) include structural units in which a methyl group corresponding to $R^{11}$ in the structural units represented by the above is replaced by a hydrogen atom.
Examples of the structural unit (III-2) include structural units below.
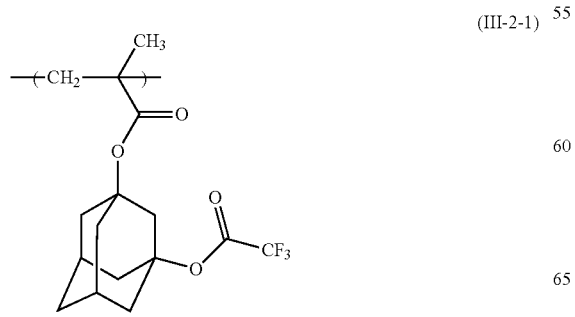
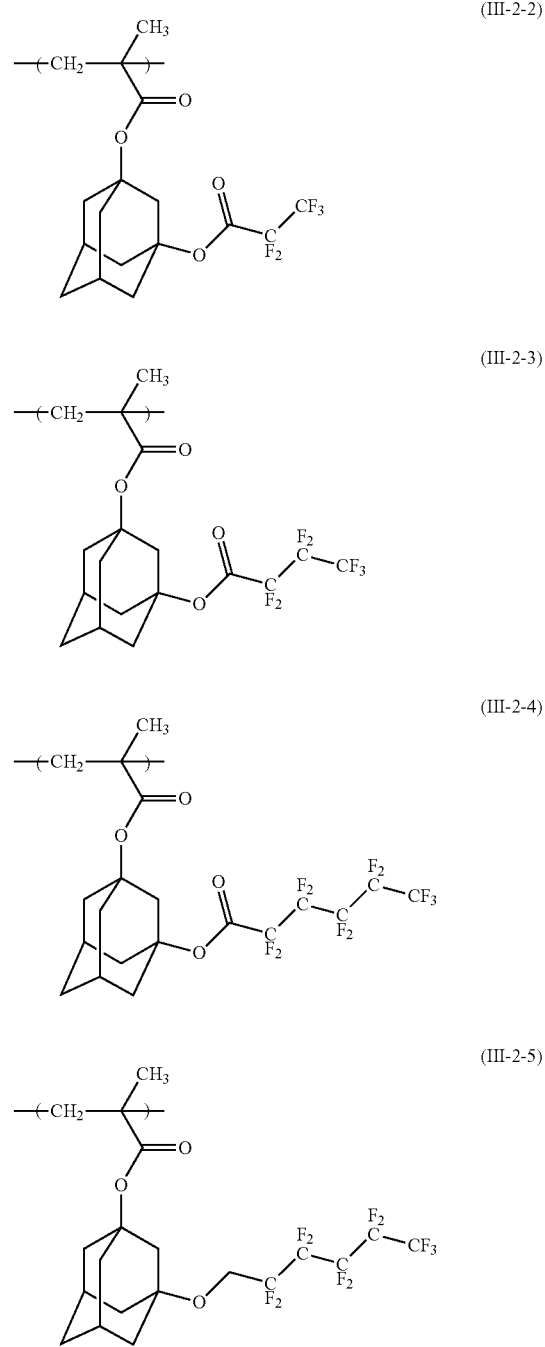
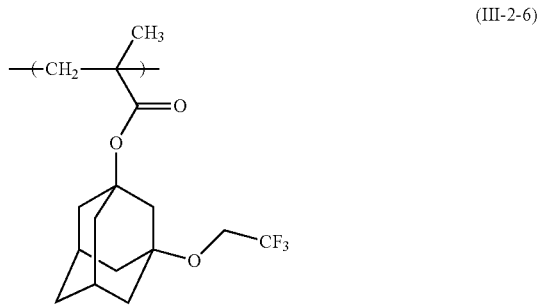

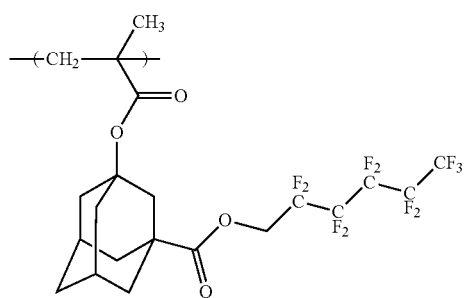
(III-2-7)

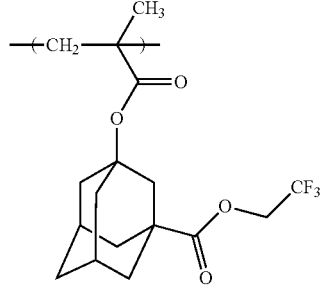
(III-2-8)

Also, examples of the structural units (III-2) include structural units in which a methyl group corresponding to $R^{21}$ in the structural units represented by the above is replaced by a hydrogen atom.

The proportion of the structural unit (I) in the resin (A1) is generally 5 to 100 mol %, preferably 10 to 100 mol %, with respect to the total structural units (100 mol %) constituting the resin (A1).

When the resin (A1) contains the structural unit (III-1) and/or the structural unit (III-2), the total proportion thereof in the resin (A1) is generally 1 to 95 mol %, preferably 2 to 80 mol %, more preferably 5 to 70 mol %, still more preferably 5 to 50 mol % and in particular preferably 5 to 30 mol %, with respect to the total structural units (100 mol %) constituting the resin (A1).

The weight ratio of the structural unit (III-1): the structural unit (III-2) is preferably, for example, 0:100 to 100:0, more preferably 3:97 to 97:3, still more preferably 50:50 to 95:5.

For achieving the proportion of the structural unit (I), the structural unit (III-1) and/or the structural unit (III-2) in the resin (A1) within the above range, the amount of the compound (I'), a monomer giving the structural unit (III-1) and/or a monomer giving the structural unit (III-2) to be used can be adjusted with respect to the total amount of the monomer to be used when the resin (A1) is produced (the same shall apply hereinafter for corresponding adjustment of the proportion).

The resin (A1) can be produced by a known polymerization method, for example, radical polymerization method, using at least one of the compound (I'), at least one monomer giving the structural unit (III-1) and/or at least one of the monomer giving the structural unit (III-2), as well as optionally at least one of the acid labile monomer (a1), at least one of the acid stable monomer and/or at least one of a known compound, described below.

The weight average molecular weight of the resin (A1) is preferably 5,000 or more (more preferably 7,000 or more, and still more preferably 10,000 or more), and 80,000 or less (more preferably 50,000 or less, and still more preferably 30,000 or less).

The weight average molecular weight is a value determined by gel permeation chromatography using polystyrene as the standard product. The detailed condition of this analysis is described in Examples.

<Resin (A2)>

The resin (A2) is a resin having properties which is insoluble or poorly soluble in alkali aqueous solution, but becomes soluble in an alkali aqueous solution by the action of an acid. Here "a resin becoming soluble in an alkali aqueous solution by the action of an acid" means a resin that has an acid labile group and is insoluble or poorly soluble in aqueous alkali solution before contact with the acid, and becomes soluble in aqueous alkali solution after contact with an acid.

Therefore, the resin (A2) is preferably a resin having at least one structural unit derived from an acid labile monomer (a1).

Also, the resin (A2) may include a structural unit other than the structural unit having the acid labile group as long as the resin (A2) has above properties and does not have the structural unit (I).

Examples of the structural unit other than the structural unit having the acid labile group include a structural unit derived from the acid stable monomer, the structural unit derived from a known monomer in this field, structural unit (III-1) and/or the structural unit (III-2) described above.

<Acid Labile Monomer (a1)>

The "acid labile group" means a group which has an elimination group and in which the elimination group is detached by contacting with an acid resulting in forming a hydrophilic group such as a hydroxy or carboxy group. Examples of the acid labile group include a group represented by the formula (1) and a group represented by the formula (2). Hereinafter a group represented by the formula (1) sometimes refers to as an "acid labile group (1)", and a group represented by the formula (2) sometimes refers to as an "acid labile group (2)".

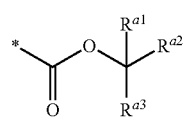
(1)

wherein $R^{a1}$ to $R^{a3}$ independently represent a $C_1$ to $C_8$ alkyl group or a $C_3$ to $C_{20}$ alicyclic hydrocarbon group, or $R^{a1}$ and $R^{a2}$ may be bonded together to form a $C_2$ to $C_{20}$ divalent hydrocarbon group, * represents a bond. In particular, the bond here represents a bonding site (the similar shall apply hereinafter for "bond").

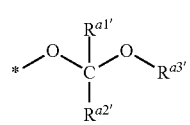
(2)

wherein $R^{a1'}$ and $R^{a2'}$ independently represent a hydrogen atom or a $C_1$ to $C_{12}$ hydrocarbon group, $R^{a3'}$ represents a $C_1$ to $C_{20}$ hydrocarbon group, or $R^{a2'}$ and $R^{a3'}$ may be bonded together to form a divalent $C_2$ to $C_{20}$ hydrocarbon group, and one or more —$CH_2$—contained in the hydrocarbon group or the divalent hydrocarbon group may be replaced by —O— or —S—, * represents a bond.

Examples of the alkyl group of $R^{a1}$ to $R^{a3}$ include methyl, ethyl, propyl, butyl, pentyl and hexyl groups.

Examples of the alicyclic hydrocarbon group of $R^{a1}$ to $R^{a3}$ include monocyclic hydrocarbon groups such as a cycloalkyl group, i.e., cyclopentyl, cyclohexyl, methylcyclohexyl, dimethylcyclohexyl, cycloheptyl, cyclooctyl groups; and polycyclic hydrocarbon groups such as decahydronaphtyl, adamantyl, norbornyl (i.e., bicyclo[2.2.1]heptyl), and methyl norbornyl groups as well as groups below.

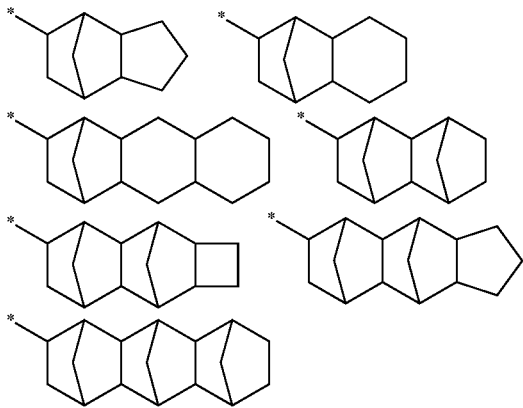

The hydrogen atom contained in the alicyclic hydrocarbon group of $R^{a1}$ to $R^{a3}$ may be replaced an alkyl group. In this case, the carbon number of the alicyclic hydrocarbon group is comparable to the total carbon number of the alkyl group and the alicyclic hydrocarbon group.

The alicyclic hydrocarbon group of $R^{a1}$ to $R^{a3}$ preferably has 3 to 16 carbon atoms, and more preferably has 4 to 16 carbon atoms.

When $R^{a1}$ and $R^{a2}$ is bonded together to form a $C_2$ to $C_{20}$ divalent hydrocarbon group, examples of the group $-C(R^{a1})(R^{a2})(R^{a3})$ include groups below. The divalent hydrocarbon group preferably has 3 to 12 carbon atoms. * represents a bond to —O—.

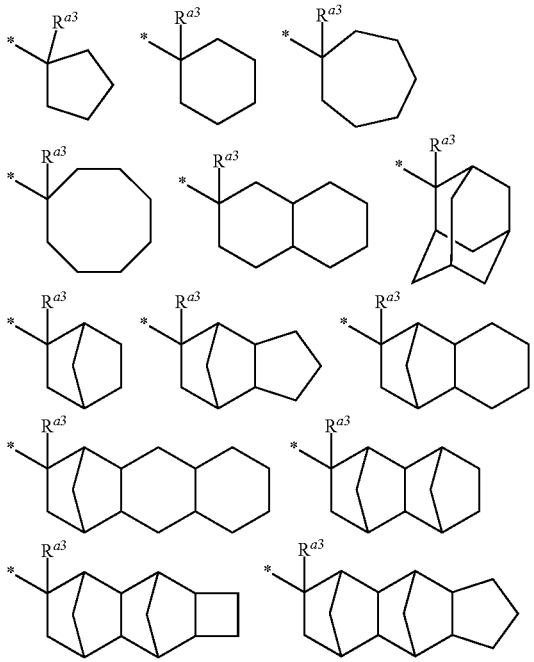

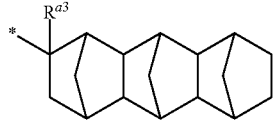

Specific examples of the acid labile group (1) include, for example, 1,1-dialkylalkoxycarbonyl group (a group in which $R^{a1}$ to $R^{a3}$ are alkyl groups, preferably tert-butoxycarbonyl group, in the formula (1)), 2-alkyladamantane-2-yloxycarbonyl group (a group in which $R^{a1}$, $R^{a2}$ and a carbon atom form adamantyl group, and $R^{a3}$ is alkyl group, in the formula (1)), and 1-(adamantane-1-yl)-1-alkylalkoxycarbonyl group (a group in which $R^{a1}$ and $R^{a2}$ are alkyl group, and $R^{a3}$ is adamantyl group, in the formula (1)).

The hydrocarbon group of $R^{a1'}$ to $R^{a3'}$ includes any of an alkyl group, an alicyclic hydrocarbon group and an aromatic hydrocarbon group.

Examples of the aromatic hydrocarbon group include an aryl group such as phenyl, naphthyl, anthryl, p-methylphenyl, p-tert-butylphenyl, p-adamantylphenyl, tolyl, xylyl, cumenyl, mesityl, biphenyl, phenanthryl, 2,6-diethylphenyl and 2-methyl-6-ethylphenyl groups.

Examples of the divalent hydrocarbon group which is formed by bonding with $R^{a2'}$ and $R^{a3'}$ include a divalent aliphatic hydrocarbon group.

At least one of $R^{a1'}$ and $R^{a2'}$ is preferably a hydrogen atom.

Specific examples of the acid labile group (2) include a group below.

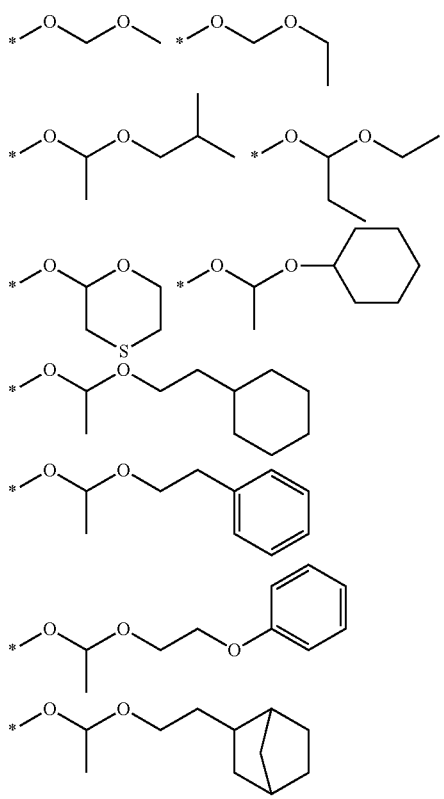

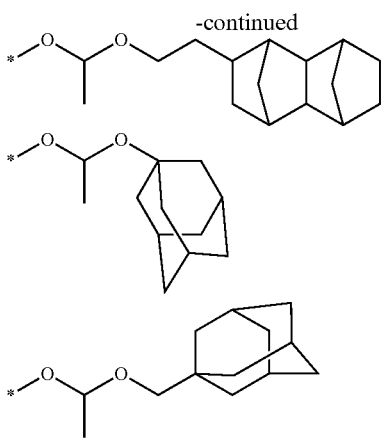

The acid labile monomer (a1) is preferably a monomer having an acid labile group and a carbon-carbon double bond, and more preferably a (meth)acrylic monomer having the acid labile group.

Among the (meth)acrylic monomer having an acid labile group, it is preferably a monomer having a $C_5$ to $C_{20}$ alicyclic hydrocarbon group. When a resin which can be obtained by polymerizing monomers having bulky structure such as the alicyclic hydrocarbon group is used, the resist composition having excellent resolution tends to be obtained during the production of a resist pattern.

Examples of the (meth)acrylic monomer having the acid labile group (1) and a carbon-carbon double bond preferably include a monomer represented by the formula (a1-1) and a monomer represented by the formula (a1-2), below (hereinafter are sometimes referred to as a "monomer (a1-1)" and a "monomer (a1-2)"). These may be used as a single monomer or as a combination of two or more monomers.

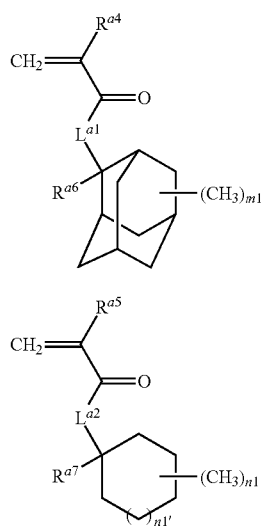

wherein $L^{a1}$ and $L^{a2}$ independently represent *—O— or *—O—$(CH_2)_{k1}$—CO—O—, k1 represents an integer of 1 to 7, * represents a bond to the carbonyl group;

$R^{a4}$ and $R^{a5}$ independently represent a hydrogen atom or a methyl group;

$R^{a6}$ and $R^{a7}$ independently represent a $C_1$ to $C_8$ alkyl group or a $C_3$ to $C_{10}$ alicyclic hydrocarbon group;

m1 represents an integer 0 to 14;

n1 represents an integer 0 to 10; and n1' represents an integer 0 to 3.

In the formula (a1-1) and the formula (a1-2), $L^{a1}$ and $L^{a2}$ are preferably *—O— or *—O—$(CH_2)_{k1'}$—CO—O—, here k1' represents an integer of 1 to 4 and more preferably 1, and more preferably *—O—.

$R^{a4}$ and $R^{a5}$ are preferably a methyl group.

Examples of the alkyl group of $R^{a6}$ and $R^{a7}$ include methyl, ethyl, propyl, butyl, pentyl, hexyl and octyl groups. Among these, the alkyl group of $R^{a6}$ and $R^{a7}$ is preferably a $C_1$ to $C_6$ alkyl group.

Examples of the alicyclic hydrocarbon group of $R^{a6}$ and $R^{a7}$ include monocyclic hydrocarbon groups such as cyclopentyl, cyclohexyl, methylcyclohexyl, dimethylcyclohexyl, cycloheptyl, cyclooctyl groups; and polycyclic hydrocarbon groups such as decahydronaphtyl, adamantyl, norbornyl (i.e., bicyclo[2.2.1]heptyl), and methyl norbornyl groups as well as groups above. Among these, the alicyclic hydrocarbon group of $R^{a6}$ and $R^{a7}$ is preferably a $C_3$ to $C_8$ alicyclic hydrocarbon group, and more preferably a $C_3$ to $C_6$ alicyclic hydrocarbon group.

m1 is preferably an integer of 0 to 3, and more preferably 0 or 1.

n1 is preferably an integer of 0 to 3, and more preferably 0 or 1.

n1' is preferably 0 or 1, and more preferably 1.

Examples of the monomer (a1-1) include monomers described in JP 2010-204646A. Among these, the monomers are preferably monomers represented by the formula (a1-1-1) to the formula (a1-1-8), and more preferably monomers represented by the formula (a1-1-1) to the formula (a1-1-4) below.

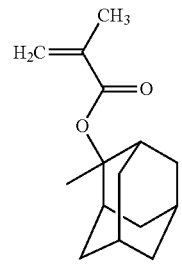

(a1-1-1)

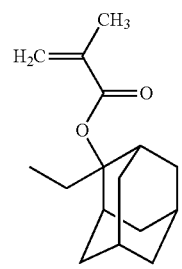

(a1-1-2)

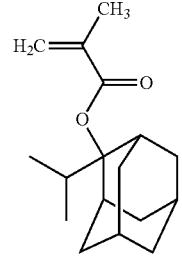

(a1-1-3)

-continued

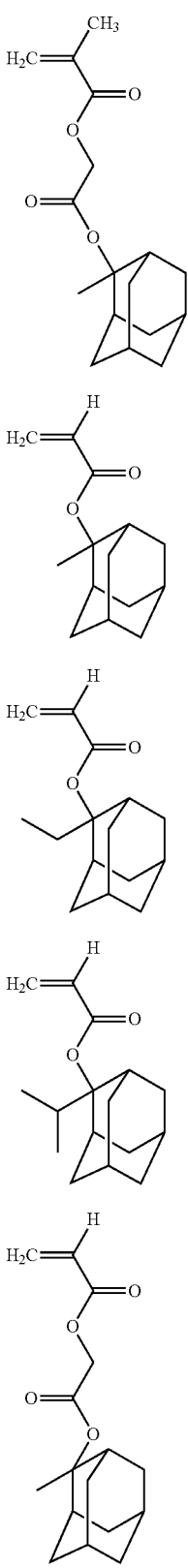

(a1-1-4)

(a1-1-5)

(a1-1-6)

(a1-1-7)

(a1-1-8)

Examples of the monomer (a1-2) include 1-ethyl-1-cyclopentane-1-yl(meth)acrylate, 1-ethyl-1-cyclohexane-1-yl(meth)acrylate, 1-ethyl-1-cycloheptane-1-yl(meth)acrylate, 1-methyl-1-cyclopentane-1-yl(meth)acrylate and 1-isopropyl-1-cyclopentane-1-yl(meth)acrylate. Among these, the monomers are preferably monomers represented by the formula (a1-2-1) to the formula (a1-2-12), and more preferably monomers represented by the formula (a1-2-3), the formula (a1-2-4), the formula (a1-2-9) and the formula (a1-2-10), and still more preferably monomers represented by the formula (a1-2-3) and the formula (a1-2-9) below.

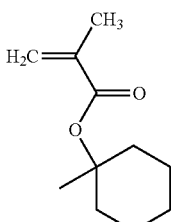

(a1-2-1)

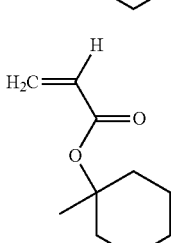

(a1-2-2)

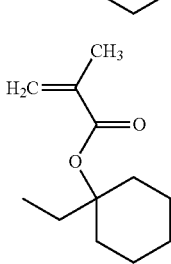

(a1-2-3)

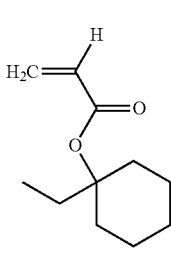

(a1-2-4)

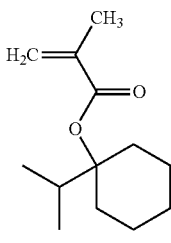

(a1-2-5)

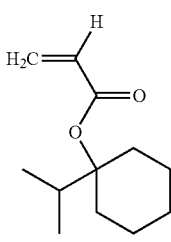

(a1-2-6)

-continued (a1-2-7)
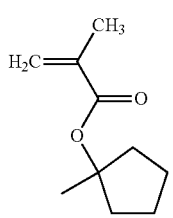

(a1-2-8)
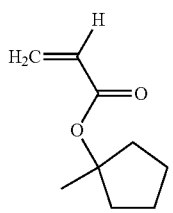

(a1-2-9)
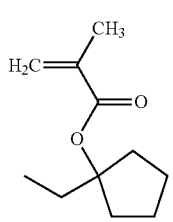

(a1-2-10)
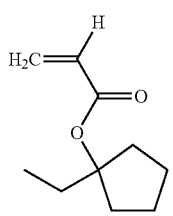

(a1-2-11)
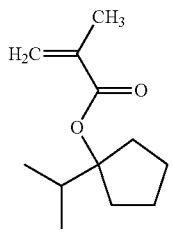

(a1-2-12)
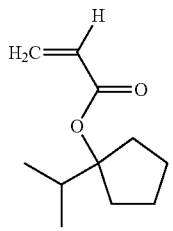

When the resin (A2) contains the structural unit (a1-1) and/or the structural unit (a1-2), the total proportion thereof is generally 10 to 95 mol %, preferably 15 to 90 mol %, more preferably 20 to 85 mol %, with respect to the total structural units (100 mol %) of the resin (A2).

Examples of a monomer having an acid-labile group (2) and a carbon-carbon double bond include a monomer represented by the formula (a1-5). Such monomer is sometimes hereinafter referred to as "monomer (a1-5)". When the resin (A2) has the structural unit derived from the monomer (a1-5), a resist pattern tends to be obtained with less defects.

(a1-5)
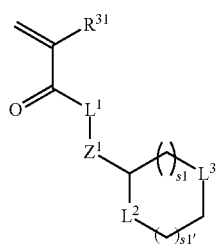

wherein $R^{31}$ represents a hydrogen atom, a halogen atom or a $C_1$ to $C_6$ alkyl group that optionally has a halogen atom;

$Z^1$ represents a single bond or *—O—$(CH_2)_{k4}$—CO-$L^4$-, k4 represents an integer of 1 to 4, * represents a bond to $L^1$;

$L^1$, $L^2$, $L^3$ and $L^4$ independently represent *—O— or *—S—.

s1 represents an integer of 1 to 3;

s1' represents an integer of 0 to 3.

In the formula (a1-5), $R^{31}$ is preferably a hydrogen atom, a methyl group or trifluoromethyl group;

$L^1$ is preferably —O—;

$L^2$ and $L^3$ are independently preferably *—O— or *—S—, and more preferably —O— for one and —S— for another;

s1 is preferably 1;

s1' is preferably an integer of 0 to 2;

$Z^1$ is preferably a single bond or —$CH_2$—CO—O—.

Examples of the monomer (a1-5) include monomers below.

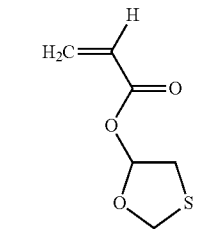 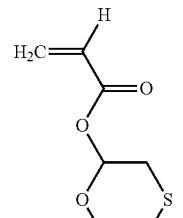 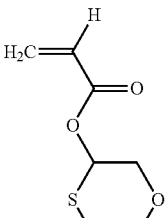

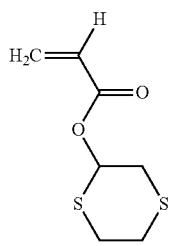 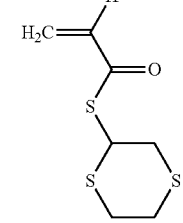

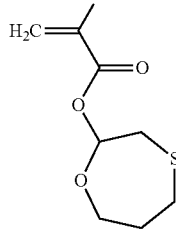 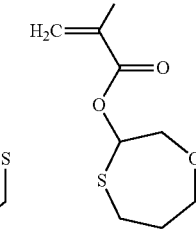

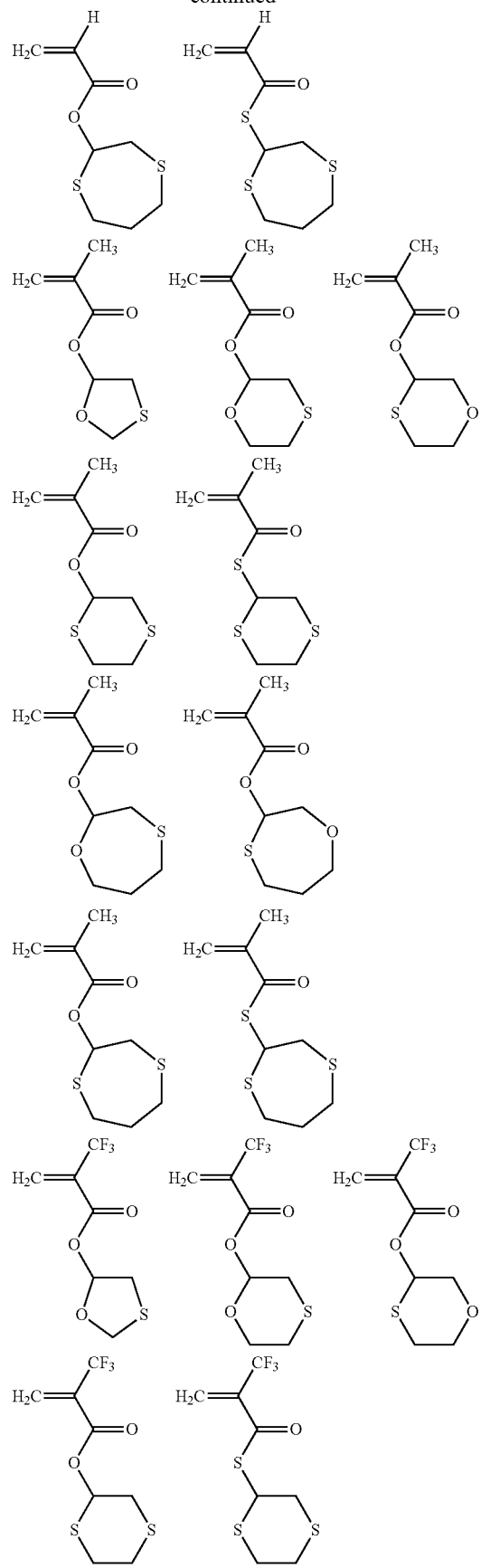
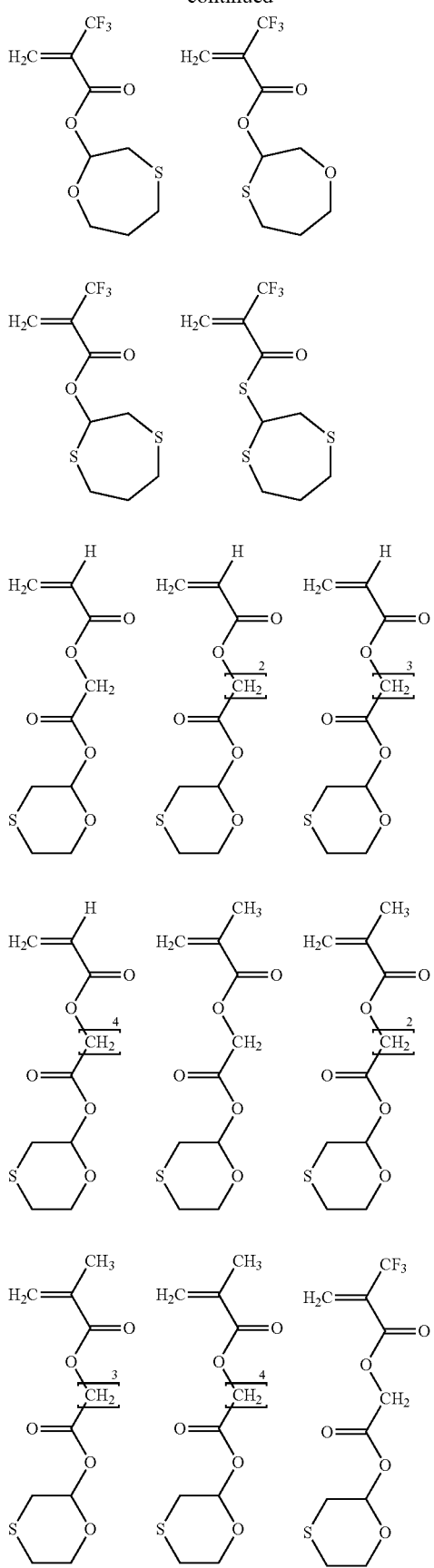

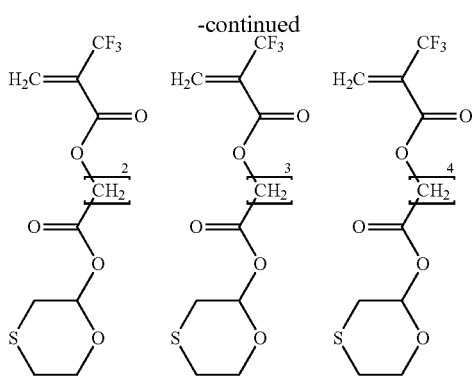

When the resin (A2) contains the structural unit derived from the monomer (a1-5), the proportion thereof is generally 1 to 50 mol %, preferably 3 to 45 mol %, and more preferably 5 to 40 mol %, with respect to the total structural units (100 mol %) constituting the resin (A2).

<Acid Stable Monomer>

As the acid stable monomer, a monomer having a hydroxy group or a lactone ring is preferable. When a resin containing the structural unit derived from a monomer having hydroxy group (hereinafter such acid stable monomer is sometimes referred to as "acid stable monomer (a2)") or a acid stable monomer having a lactone ring (hereinafter such acid stable monomer is sometimes referred to as "acid stable monomer (a3)") is used, the adhesiveness of resist pattern to a substrate and resolution of resist pattern tend to be improved.

<Acid Stable Monomer (a2)>

The acid stable monomer (a2), which has a hydroxy group, is preferably selected depending on the kinds of an exposure light source at producing the resist pattern.

When KrF excimer laser lithography (248 nm), or high-energy irradiation such as electron beam or EUV light is used for the resist composition, using the acid stable monomer having a phenolic hydroxy group such as hydroxystyrene as the acid stable monomer (a2) is preferable.

When ArF excimer laser lithography (193 nm), i.e., short wavelength excimer laser lithography is used, using the acid stable monomer having a hydroxy adamantyl group represented by the formula (a2-1) as the acid stable monomer (a2) is preferable.

The acid stable monomer (a2) having the hydroxy group may be used as a single monomer or as a combination of two or more monomers.

Examples of the acid stable monomer having hydroxy adamantyl include the monomer represented by the formula (a2-1).

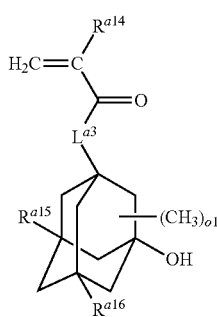

(a2-1)

wherein $L^{a3}$ represents —O— or *—O—$(CH_2)_{k2}$—CO—O—;

k2 represents an integer of 1 to 7;

* represents a bind to —CO—;

$R^{a14}$ represents a hydrogen atom or a methyl group;

$R^{a15}$ and $R^{a16}$ independently represent a hydrogen atom, a methyl group or a hydroxy group;

o1 represents an integer of 0 to 10.

In the formula (a2-1), $L^{a3}$ is preferably —O—, —O—$(CH_2)_{f1}$—CO—O—, here f1 represents an integer of 1 to 4, and more preferably —O—.

$R^{a14}$ is preferably a methyl group.

$R^{a15}$ is preferably a hydrogen atom.

$R^{a16}$ is preferably a hydrogen atom or a hydroxy group.

o1 is preferably an integer of 0 to 3, and more preferably an integer of 0 or 1.

Examples of the acid stable monomer (a2-1) include monomers described in JP 2010-204646A. Among these, the monomers are preferably monomers represented by the formula (a2-1-1) to the formula (a2-1-6), more preferably monomers represented by the formula (a2-1-1) to the formula (a2-1-4), and still more preferably monomers represented by the formula (a2-1-1) and the formula (a2-1-3) below.

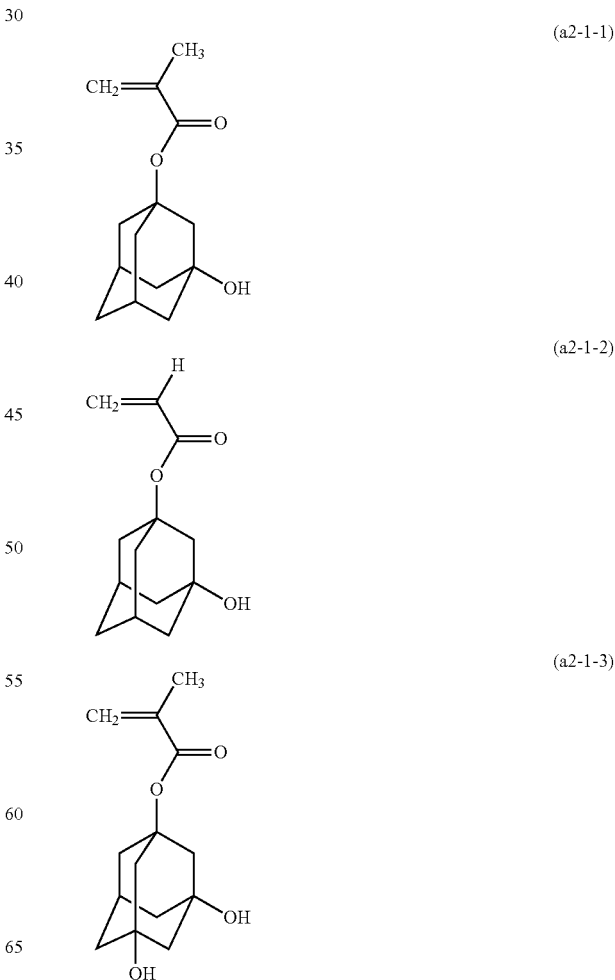

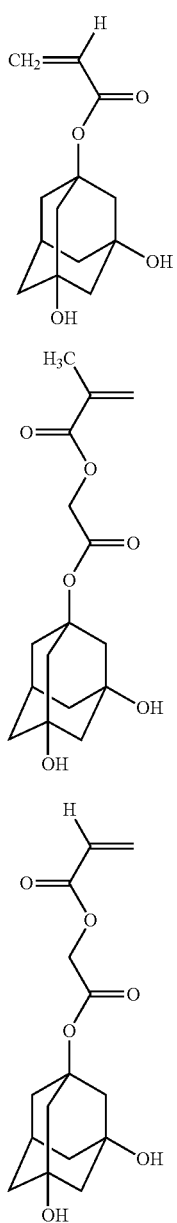

When the resin (A2) contains the acid stable structural unit derived from the monomer represented by the formula (a2-1), the proportion thereof is generally 3 to 45 mol %, preferably 5 to 40 mol %, more preferably 5 to 35 mol %, and still more preferably 5 to 30 mol %, with respect to the total structural units (100 mol %) constituting the resin (A2).

<Acid Stable Monomer (a3)>

The lactone ring included in the acid stable monomer (a3) may be a monocyclic compound such as β-propiolactone ring, γ-butyrolactone, δ-valerolactone, or a condensed ring with monocyclic lactone ring and other ring. Among these, γ-butyrolactone and condensed ring with γ-butyrolactone and other ring are preferable.

Examples of the acid stable monomer (a3) having the lactone ring include monomers represented by the formula (a3-1), the formula (a3-2) and the formula (a3-3). These monomers may be used as a single monomer or as a combination of two or more monomers.

wherein $L^{a4}$ to $L^{a6}$ independently represent —O— or *—O—$(CH_2)_{k3}$—CO—O—;

k3 represents an integer of 1 to 7, * represents a bind to —CO—;

$R^{a18}$ to $R^{a20}$ independently represent a hydrogen atom or a methyl group;

$R^{a21}$ in each occurrence represents a $C_1$ to $C_4$ alkyl group;

p1 represents an integer of 0 to 5;

$R^{a22}$ to $R^{a23}$ in each occurrence independently represent a carboxyl group, cyano group, and a $C_1$ to $C_4$ alkyl group;

q1 and r1 independently represent an integer of 0 to 3.

In the formulae (a3-1) to (a3-3), $L^{a4}$ to $L^{a6}$ include the same group as described in $L^{a3}$ above, and are independently preferably —O—, *—O—$(CH_2)_{k3}$—CO—O—, here k3' represents an integer of 1 to 4 (preferably 1), and more preferably —O—;

$R^{a18}$ to $R^{a21}$ are independently preferably a methyl group.

$R^{a22}$ and $R^{a23}$ are independently preferably a carboxyl group, cyano group or methyl group;

p1 to r1 are independently preferably an integer of 0 to 2, and more preferably an integer of 0 or 1.

Examples of the monomer (a3) include monomers described in JP 2010-204646A. Among these, the monomers are preferably monomers represented by the formula (a3-1-1) to the formula (a3-1-4), the formula (a3-2-1) to the formula (a3-2-4), the formula (a3-3-1) to the formula (a3-3-4), more preferably monomers represented by the formula (a3-1-1) to the formula (a3-1-2), the formula (a3-2-3) to the formula (a3-2-4), and still more preferably monomers represented by the formula (a3-1-1) and the formula (a3-2-3) below.

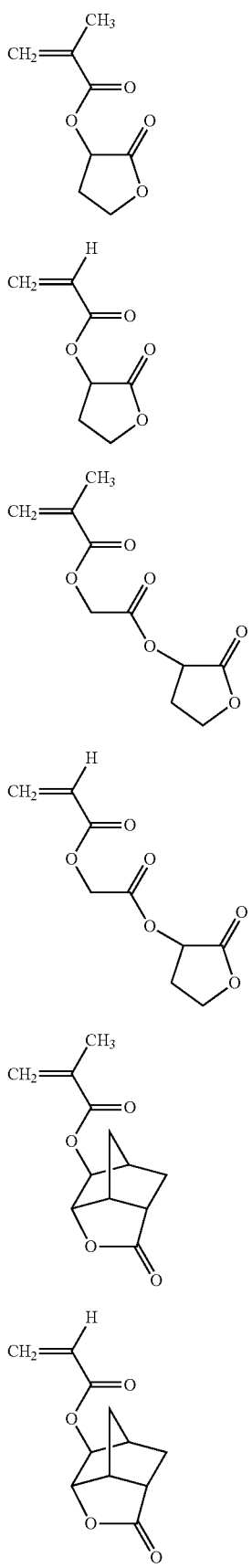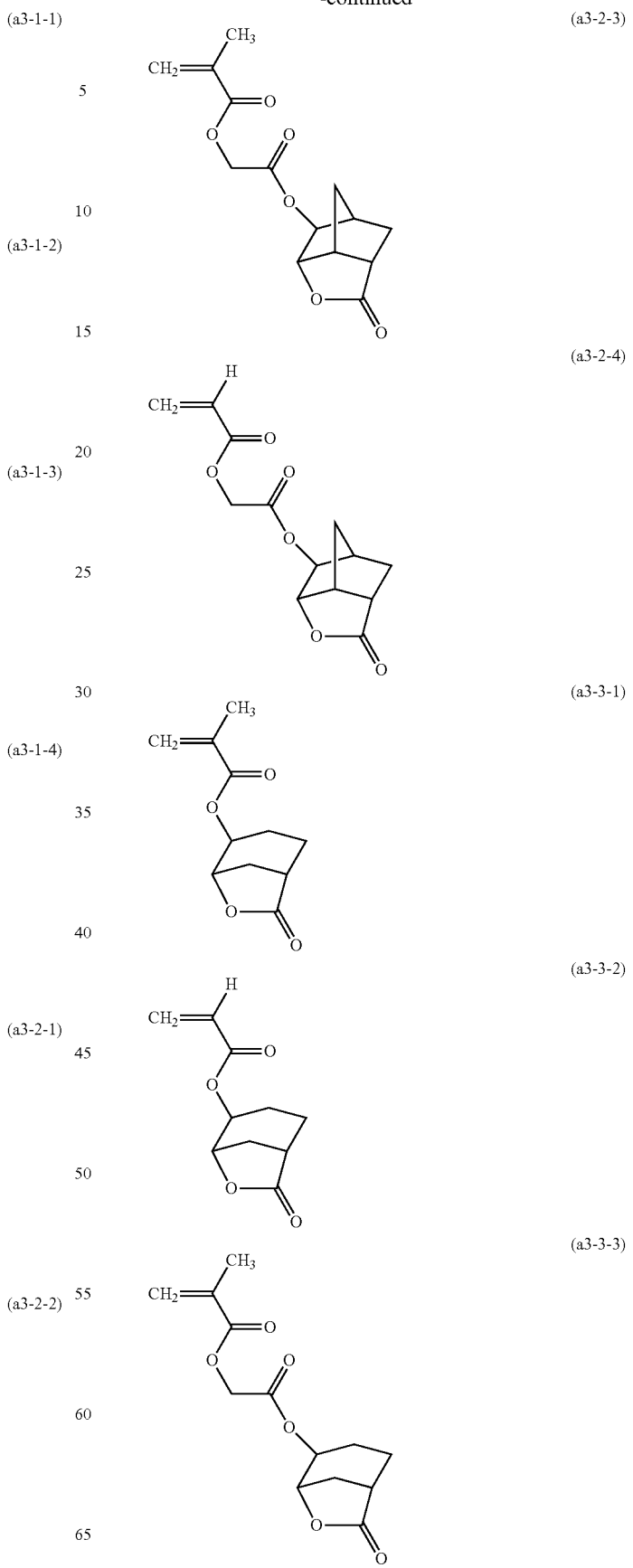

(a3-3-4)

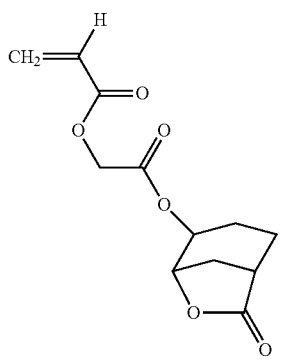

When the resin (A2) contains the structural units derived from the acid stable monomer (a3) having the lactone ring, the total proportion thereof is preferably 5 to 70 mol %, more preferably 10 to 65 mol %, still more preferably 15 to 60 mol %, with respect to the total structural units (100 mol %) constituting the resin (A2).

When the resin (A2) is the copolymer of the acid labile monomer (a1) and the acid stable monomer, the proportion of the structural unit derived from the acid labile monomer (a1) is preferably 10 to 80 mol %, and more preferably 20 to 60 mol %, with respect to the total structural units (100 mol %) constituting the resin (A2).

The resin (A2) preferably contains 15 mol % or more of the structural unit derived from the monomer having an adamantyl group (in particular, the monomer having the acid labile group (a1-1)) with respect to the structural units derived from the acid labile monomer (a1). As the mole ratio of the structural unit derived from the monomer having an adamantyl group increases within this range, the dry etching resistance of the resulting resist improves.

The resin (A2) preferably is a copolymer of the acid labile monomer (a1) and the acid stable monomer. In this copolymer, the acid labile monomer (a1) is preferably at least one of the acid labile monomer (a1-1) having an adamantyl group and the acid labile monomer (a1-2) having a cyclohexyl group, and more preferably is the acid labile monomer (a1-1).

The acid stable monomer is preferably the acid stable monomer (a2) having a hydroxy group and/or the acid stable monomer (a3) having a lactone ring. The acid stable monomer (a2) is preferably the monomer having the hydroxyadamantyl group (a2-1). The acid stable monomer (a3) is preferably at least one of the monomer having the γ-butyrolactone ring (a3-1) and the monomer having the condensed ring of the γ-butyrolactone ring and the norbornene ring (a3-2).

The resin (A2) can be produced by a known polymerization method, for example, radical polymerization method, using at least one of the acid labile monomer (a1) and/or at least one of the acid stable monomer (a2) having a hydroxy group and/or at least one of the acid stable monomer (a3) having a lactone ring and/or at least one of a known compound.

The weight average molecular weight of the resin (A2) is preferably 2,500 or more (more preferably 3,000 or more, and still more preferably 4,000 or more), and 50,000 or less (more preferably 30,000 or less, and still more preferably 10,000 or less).

In the present resist composition, the weight ratio of the resins (A1)/(A2) is preferably, for example, 0.01/10 to 5/10, more preferably 0.05/10 to 3/10, still more preferably 0.1/10 to 2/10, in particular, preferably 0.2/10 to 1/10.

<Resin Other than Resin (a1) and Resin (a2)>

The resist composition of the present invention may include a resin other than the resin (A1) and the resin (A2) described above. Such resin is a resin having at least one of the structural unit derived from the acid labile monomer (a1), at least one of the structural unit derived from the acid stable monomer, as described above, and/or at least one of the structural unit derived from a known monomer in this field.

The proportion of the resin (A) can be adjusted with respect to the total solid proportion of the resist composition. For example, the resist composition of the present invention preferably contains 80 weight % or more and 99 weight % or less of the resin (A), with respect to the total solid proportion of the resist composition.

In the specification, the term "solid proportion of the resist composition" means the entire proportion of all ingredients other than the solvent (E).

The proportion of the resin (A) and the solid proportion of the resist composition can be measured with a known analytical method such as, for example, liquid chromatography and gas chromatography.

<Acid Generator>

The acid generator has an acid labile group. The "acid labile group" means a group which has an elimination group and in which the elimination group is detached by contacting with an acid resulting in forming a hydrophilic group such as a hydroxy or carboxy group as described above. Examples of the acid labile group include the group represented by the formula (1) and the group represented by the formula (2) as described above.

Examples of the acid generator include acid generators described in JP2009-145408A, JP2009-229603A and JP2010-111660A, and a salt represented by the formula (II) (hereinafter may be referred to as "acid generator (II)").

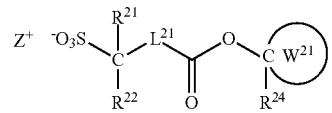

(II)

wherein $R^{21}$ and $R^{22}$ independently represent a fluorine atom or a $C_1$ to $C_6$ perfluoroalkyl group;

$L^{21}$ represents a single bond or a $C_1$ to $C_{20}$ divalent hydrocarbon group, and one or more —$CH_2$— contained in the divalent hydrocarbon group may be replaced by —O— or —CO—;

$R^{24}$ represents a $C_1$ to $C_{12}$ hydrocarbon group;

ring $W^{21}$ represents an optionally substituted $C_3$ to $C_{18}$ hydrocarbon ring;

$Z^+$ represents an organic cation.

In the formula (II), a moiety having a negative charge in which an organic cation, $Z^+$, having a positive charge is removed sometimes refers to as a sulfonate anion.

Examples of the perfluoroalkyl group of $R^{21}$ and $R^{22}$ include trifluoromethyl, perfluoroethyl, perfluoropropyl, perfluoro-isopropyl, perfluorobutyl, perfluoro-sec-butyl, perfluoro-tert-butyl, perfluoropentyl and perfluorohexyl groups.

Among these, $R^{21}$ and $R^{22}$ independently are preferably trifluoromethyl or fluorine atom, and more preferably a fluorine atom.

The optionally substituted divalent hydrocarbon group of $L^{21}$ is preferably an alkanediyl group or a divalent group represented by the formula (II-$L^{21}$).

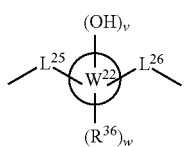 (II-L²¹)

wherein $L^{25}$ and $L^{26}$ independently represent a $C_1$ to $C_8$ alkanediyl group, and one or more —CH$_2$— contained in the alkanediyl group may be replaced by —O— or —CO—;

ring $W^{22}$ represents a $C_3$ to $C_{12}$ saturated hydrocarbon ring, and one or more —CH$_2$— contained in the saturated hydrocarbon ring may be replaced by —O— or —CO—;

v represents an integer of 0 to 2;

$R^{36}$ represents a $C_1$ to $C_6$ alkyl group;

w represents an integer of 0 to 2, provided that the total carbon number contained in the alkanediyl group of $L^{25}$ and $L^{26}$, the saturated hydrocarbon ring of $W^{22}$, and the alkyl group of $R^{36}$ is 20 or less.

Examples of the alkanediyl group of $L^{21}$, $L^{25}$ and $L^{26}$ include a chain alkanediyl group such as methylene, ethylene, propane-1,3-diyl, propane-1,2-diyl, butane-1,4-diyl, pentane-1,5-diyl, hexane-1,6-diyl; a branched alkanediyl group such as 1-methylpropane-1,3-diyl, 2-methylpropane-1,3-diyl, 2-methylpropane-1,2-diyl, 1-methylbutane-1,4-diyl, 2-methylbutane-1,4-diyl groups.

Examples of the alkanediyl group in which one or more —CH$_2$-contained in the alkanediyl group is replaced by —O— or —CO— include groups represented by the formula (b1-1) to the formula (b1-6) below. In the formula (b1-1) to the formula (b1-6), the group is represented so as to correspond with two sides of the formula (II), that is, the left side of the group bonds to C(R²¹)(R²²)— and the right side of the group bonds to —CO— (examples of the formula (b1-1) to the formula (b1-6) are the same as above).

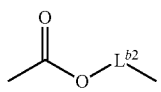 (b1-1)

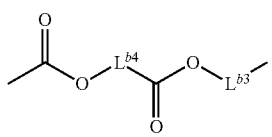 (b1-2)

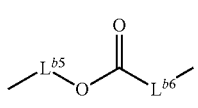 (b1-3)

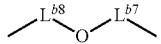 (b1-4)

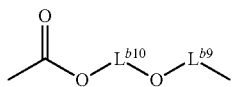 (b1-5)

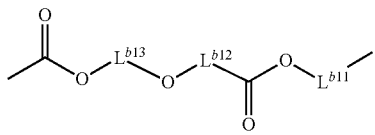 (b1-6)

wherein $L^{b2}$ to $L^{b13}$ independently represent a $C_1$ to $C_8$ alkanediyl group.

Examples of the divalent group represented by the formula (b1-1) include groups below.

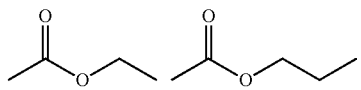

Examples of the divalent group represented by the formula (b1-2) include groups below.

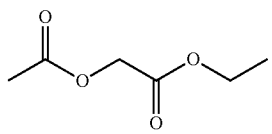

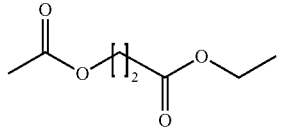

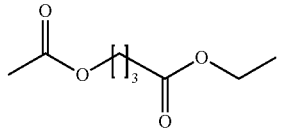

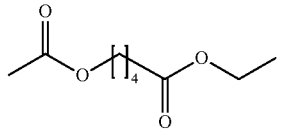

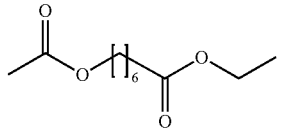

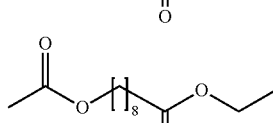

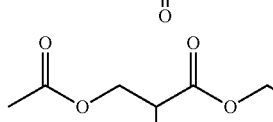

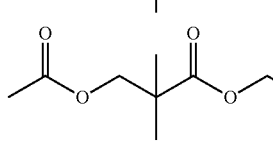

Examples of the divalent group represented by the formula (b1-3) include groups below.

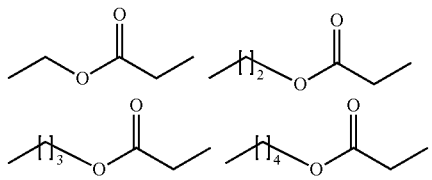

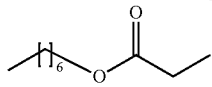

Examples of the divalent group represented by the formula (b1-4) include groups below.

Examples of the divalent group represented by the formula (b1-5) include groups below.

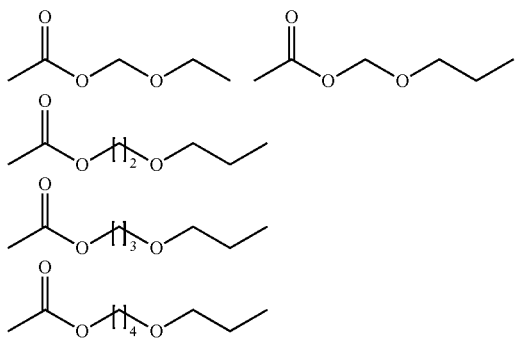

Examples of the divalent group represented by the formula (b1-6) include groups below.

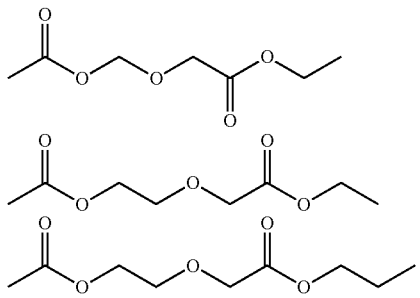

Among these, $L^{21}$ is preferably a single bond or *—CO—O-$L^{24}$-, $L^{24}$ represents a $C_1$ to $C_6$ alkanediyl group, * represents a bond to —$CR^{21}R^{22}$—.

The saturated hydrocarbon ring of ring $W^{22}$ is a ring containing only carbon atoms and hydrogen atoms, and not containing an unsaturated bond. Examples of the saturated hydrocarbon ring include a cyclohexane ring and an adamantane ring, and adamantane ring is preferable.

Examples of the alkyl group of $R^{36}$ include methyl, ethyl, n-propyl, iso-propyl, n-butyl, sec-butyl, tert-butyl, iso-butyl, n-pentyl, iso-pentyl, tert-pentyl, neo-pentyl and hexyl groups. The alkyl group is preferably a $C_1$ to $C_4$ alkyl group, more preferably a $C_1$ to $C_2$ alkyl group, and still more preferably a methyl group.

Examples of the divalent group represented by the formula (II-$L^{21}$-A) include groups below.

wherein $W^{22}$, $R^{36}$, v and w have the same definition of the above, * represents a bond.

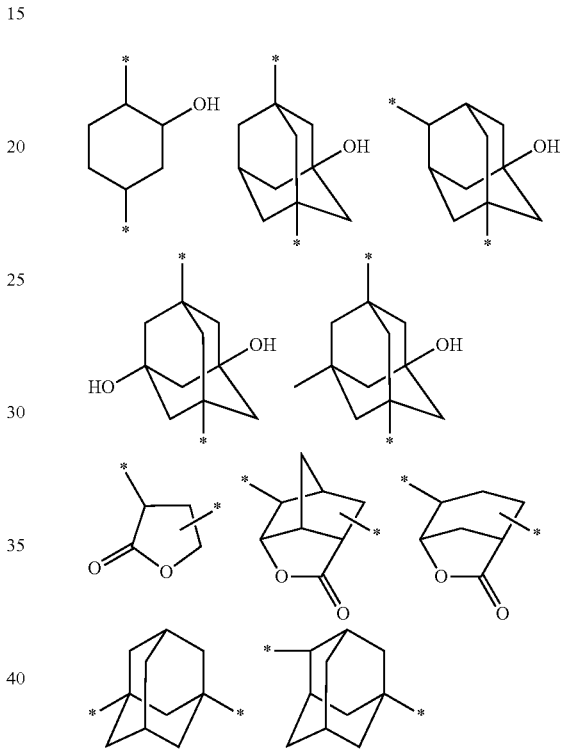

The hydrocarbon group of $R^{24}$ includes an aliphatic hydrocarbon group and the aromatic hydrocarbon group, and the aliphatic hydrocarbon group includes a chain, a cycle and a combination thereof. The aliphatic hydrocarbon group is preferably an alkyl group and an alicyclic hydrocarbon group, and more preferably a $C_1$ to $C_6$ alkyl group.

The hydrocarbon ring of ring $W^{21}$ is preferably a $C_3$ to $C_{12}$ hydrocarbon ring. Among these, a saturated hydrocarbon ring is more preferable as described below, and a cyclohexane ring and an adamantane ring are still more preferable.

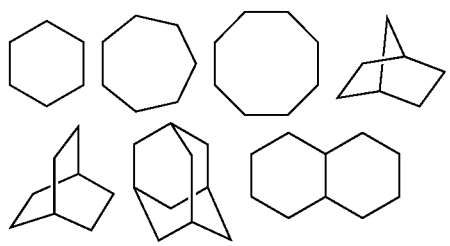

Examples of the group represented by the formula (II-A) include groups below. * represents a bond to —O—.

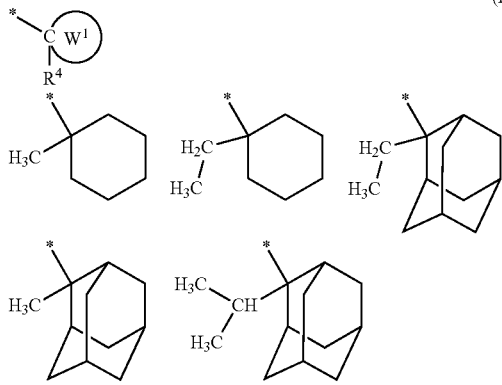

(II-A)

Examples of the substituents of ring $W^{21}$ include a halogen atom, a $C_1$ to $C_6$ alkyl group that optionally has a halogen atom or a hydroxy group, a $C_1$ to $C_6$ alkoxy group that optionally has a halogen atom or a hydroxy group, a hydroxy group or groups represented by the formula (II-1) to the formula (II-4) in addition to $R^{24}$. Among these, a $C_1$ to $C_6$ alkyl group that optionally has a hydroxy group, a $C_1$ to $C_6$ alkoxy group that optionally has a hydroxy group, a hydroxy group and groups represented by the formula (II-1) to the formula (II-4) are preferable, a $C_1$ to $C_6$ alkyl group, a $C_1$ to $C_6$ alkoxy group, a hydroxy group and groups represented by the formula (II-1) to the formula (II-4) are more preferable. In the formula (II-1) to the formula (II-4), * represents a bond to ring $W^{21}$.

In particular, for the substituents of ring $W^{21}$, the alkyl group is preferably a $C_1$ to $C_4$ alkyl group, more preferably a $C_1$ to $C_3$ alkyl group, still more preferably methyl and ethyl groups.

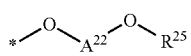

(II-1)

wherein $A^{22}$ represents a $C_1$ to $C_6$ alkanediyl group, $R^{25}$ represents a $C_1$ to $C_6$ alkyl group.

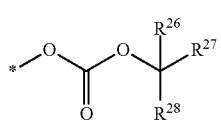

(II-2)

wherein $R^{26}$, $R^{27}$ and $R^{28}$ independently represent a $C_1$ to $C_6$ alkyl group.

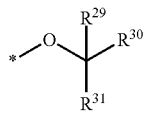

(II-3)

wherein $R^{29}$, $R^{30}$ and $R^{31}$ independently represent a $C_1$ to $C_6$ alkyl group.

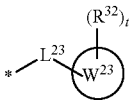

(II-4)

wherein $L^{23}$ represents a $C_1$ to $C_{10}$ alkanediyl group, and one or more —CH$_2$— contained in the alkanediyl group may be replaced by —O— or —CO—;

ring $W^{23}$ represents a $C_3$ to $C_{18}$ saturated hydrocarbon ring, and one or more —CH$_2$— contained in the saturated hydrocarbon ring may be replaced by —O— or —CO—;

$R^{32}$ in each occurrence independently represents a $C_1$ to $C_6$ alkyl group, a $C_1$ to $C_6$ alkoxy group, a $C_1$ to $C_6$ alkoxycarbonyl group, a hydroxy group, a $C_1$ to $C_6$ hydroxyalkyl group or a $C_1$ to $C_6$ hydroxyalkoxy group.

t represents an integer of 0 to 3.

Examples of the alkyl group include methyl, ethyl, propyl, n-butyl, sec-butyl, tert-butyl, pentyl, hexyl, octyl and 2-ethylhexyl groups.

Examples of the alkoxy group include methoxy, ethoxy, propoxy, butoxy, pentyloxy, hexyloxy, heptyloxy, octyloxy, decyloxy and dodecyloxy groups.

The alkyl group that has a halogen atom and the alkoxy group that has a halogen atom are preferably a fluorinated alkyl group and a fluorinated alkoxy group.

Examples of the fluorinated alkyl group include trifluoromethyl, 1,1,1-trifluoroethyl, perfluoroethyl, 1,1,1,2,2-pentafluoropropyl, perfluoropropyl, 1,1,1,2,2,3,3-heptafluorobutyl, perfluorobutyl, 1,1,1,2,2,3,3,4,4-nonafluoropentyl, pentafluoropentyl and pentafluorohexyl groups.

Examples of the fluorinated alkoxy group include trifluoromethoxy, 1,1,1-trifluoroethoxy, perfluoroethoxy, 1,1,1,2,2-pentafluoropropyloxy, perfluoropropyloxy, 1,1,1,2,2,3,3-heptafluorobutyloxy, perfluorobutyloxy, 1,1,1,2,2,3,3,4,4-nonafluoropentyloxy, pentafluoropentyloxy and pentafluorohexyloxy groups.

Examples of the alkyl group that has a hydroxy group include hydroxymethyl, hydroxyethyl and hydroxypropyl groups.

Examples of the alkoxy group that has a hydroxy group include hydroxymethoxy, hydroxyethoxy and hydroxypropoxy groups.

Examples of the alkoxycarbonyl group include an alkoxy group to which is bonded a carbonyl group, such as, methoxycarbonyl and ethoxycarbonyl groups.

Examples of the saturated hydrocarbon ring include the same examples described above.

In the substituent of the hydrocarbon ring of ring $W^{21}$, the alkyl group is preferably a $C_1$ to $C_4$ alkyl group, more preferably a $C_1$ to $C_3$ alkyl group, and still more preferably methyl or ethyl group.

$L^{23}$ is preferably *—O-$L^7$-CO—O—, *—O-$L^8$-CO—O-$L^9$-O—, *—CO—O-$L^{10}$-CO—O—, *—O—CO-$L^{11}$-O— or *—O-$L^{12}$-O—, more preferably *—O-$L^7$-CO—O— or *—CO—O-$L^{10}$-CO—O—, and still more preferably *—O—CH$_2$—CO—O— or *—O—CH$_2$—CO—O—C$_2$H$_4$—O—. $L^7$ to $L^{12}$ independently represents $C_1$ to $C_8$ alkanediyl group, * represents a bond to ring.

Examples of the group represented by the formula (II-1) include groups below.

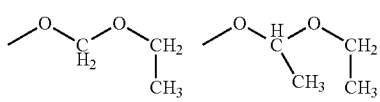

Examples of the group represented by the formula (II-2) include groups below.

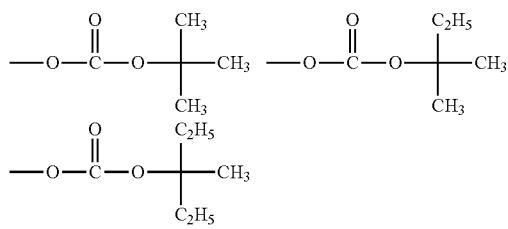

Examples of the group represented by the formula (II-3) include groups below.

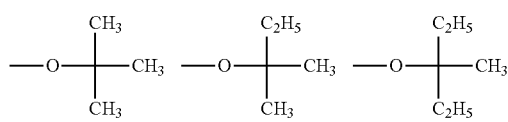

Examples of the group represented by the formula (II-4) include groups below.

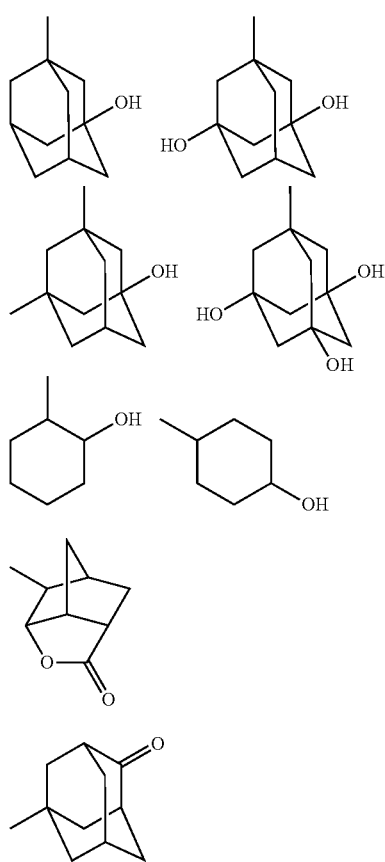

(II-4-1)

(II-4-2)

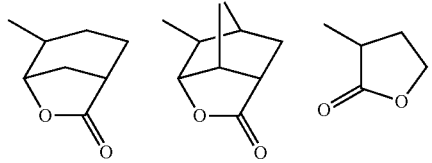

Among groups represented by the formula, groups represented by the formula (II-4-1) and (II-4-2) are preferable.

Examples of the salt represented by the formula (II) include salts below.

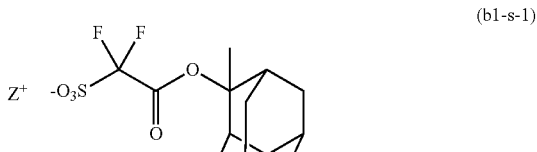
(b1-s-1)

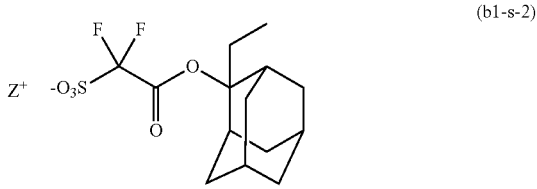
(b1-s-2)

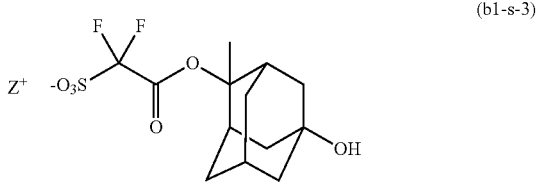
(b1-s-3)

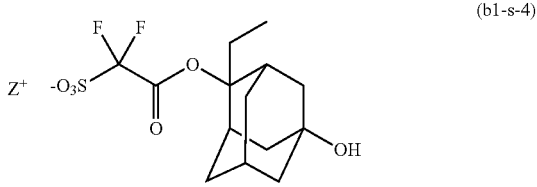
(b1-s-4)

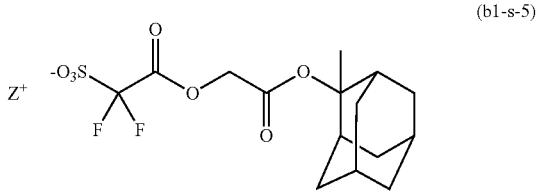
(b1-s-5)

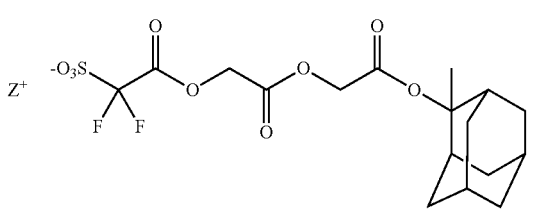
(b1-s-6)

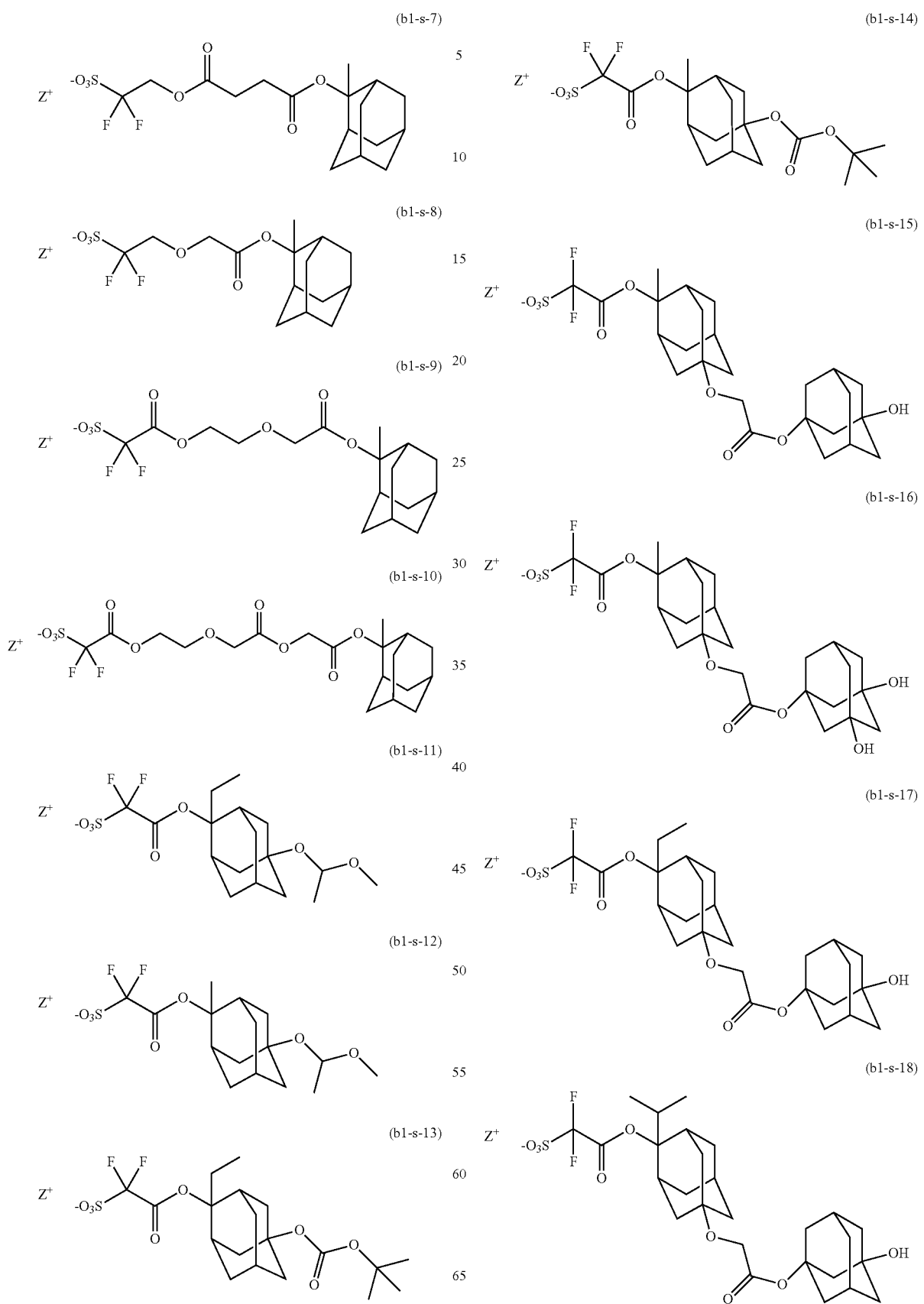

-continued
(b1-s-19)
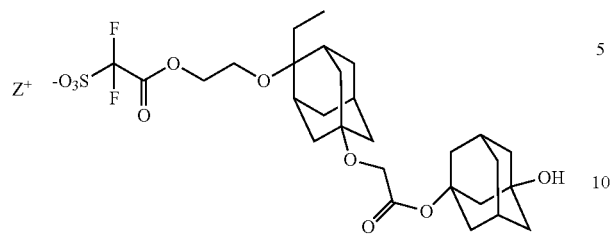
(b1-s-20)
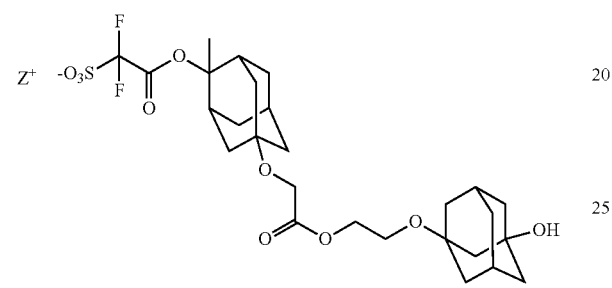
(b1-s-21)
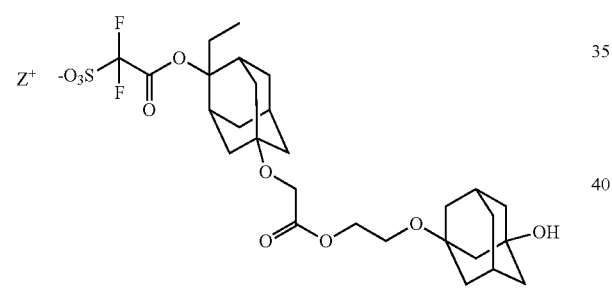
(b1-s-22)
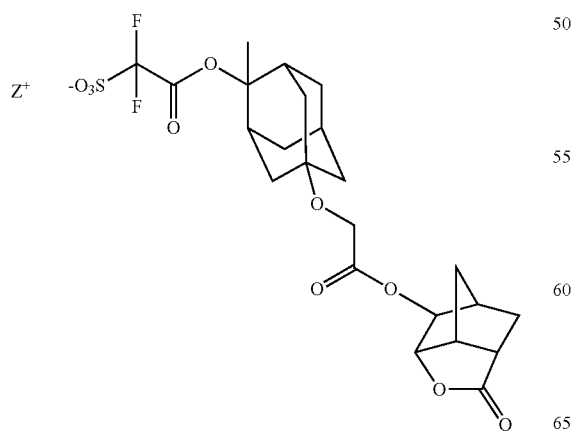
-continued
(b1-s-23)
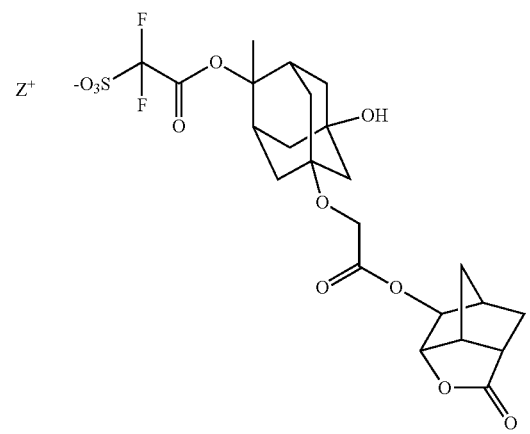
(b1-s-24)
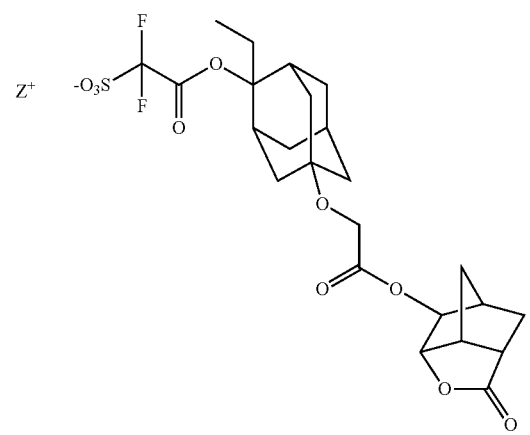
(b1-s-25)
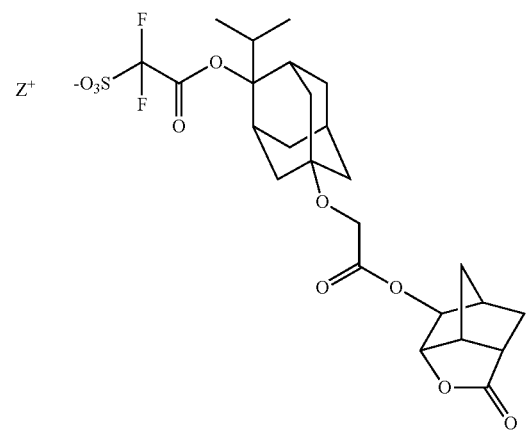

(b1-s-26)
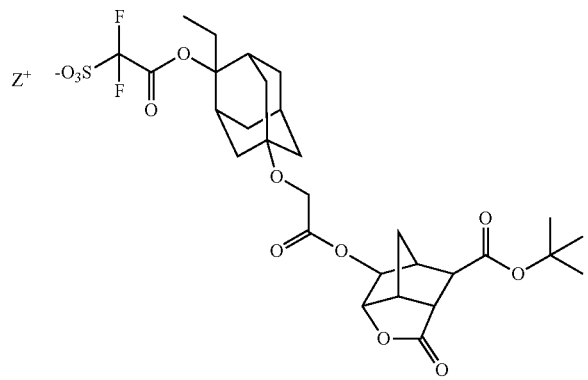
(b1-s-27)
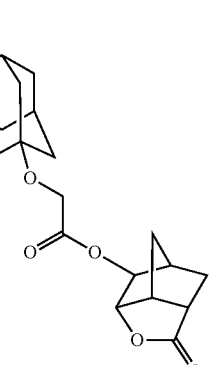
(b1-s-28)
(b1-s-29)
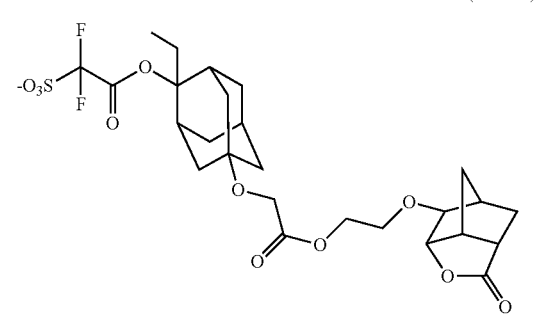
(b1-s-30)
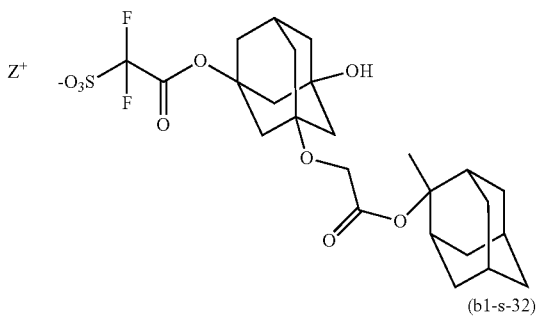
(b1-s-31)
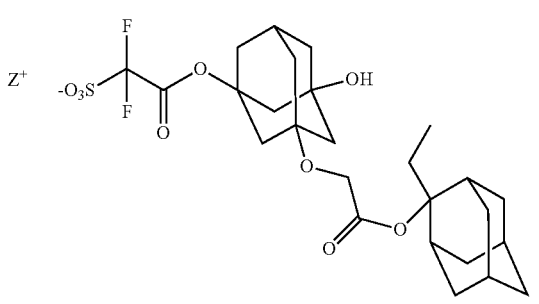
(b1-s-32)
(b1-s-33)
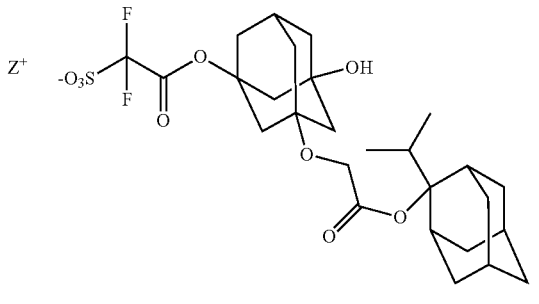

(b1-s-34)
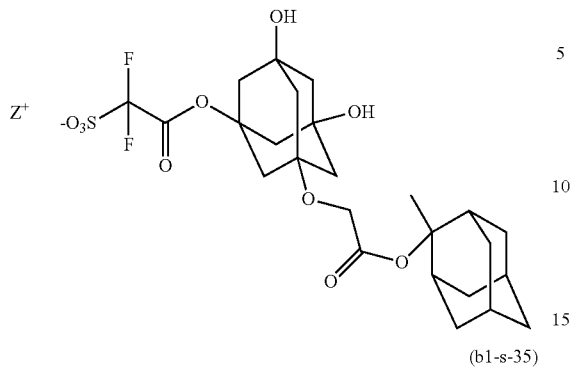
(b1-s-39)
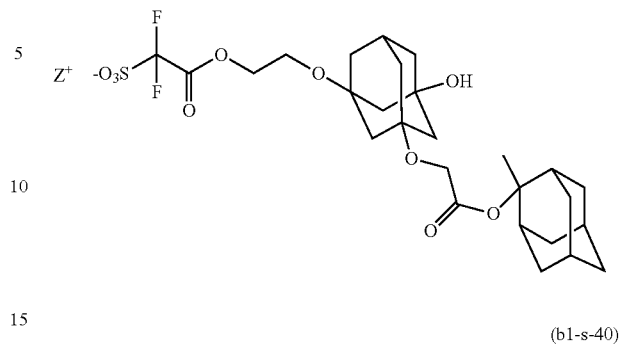
(b1-s-35)
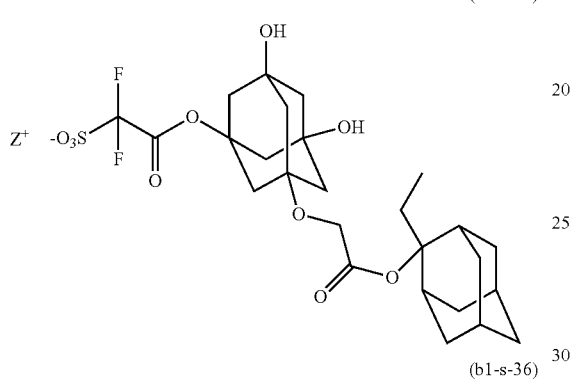
(b1-s-40)
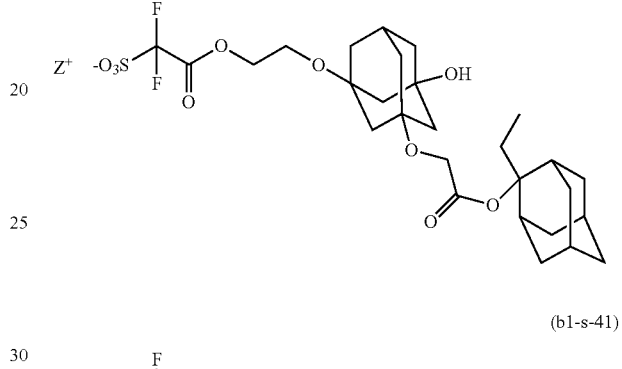
(b1-s-36)
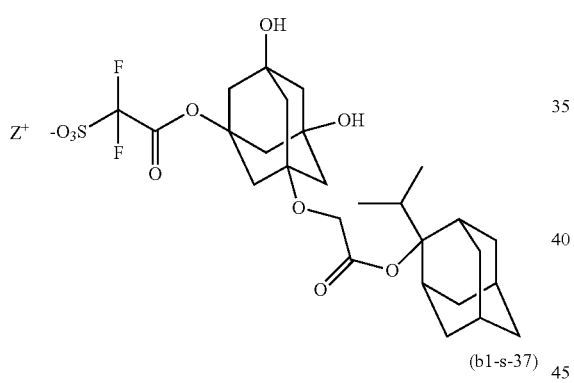
(b1-s-41)
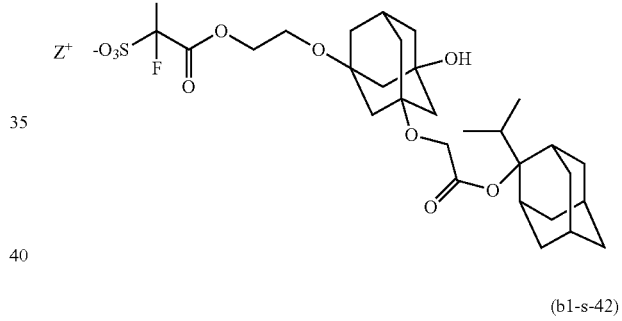
(b1-s-37)
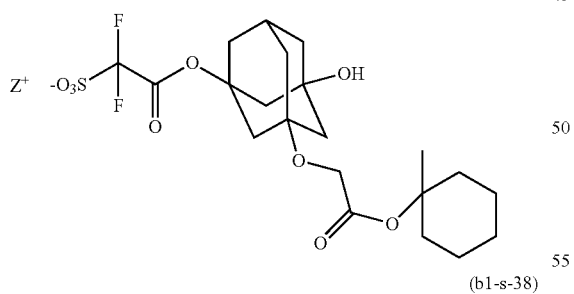
(b1-s-42)
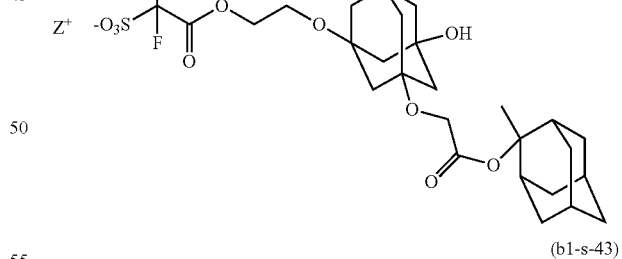
(b1-s-38)
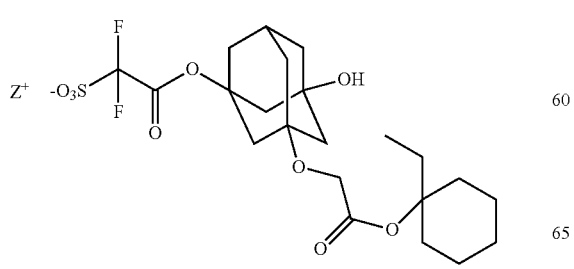
(b1-s-43)
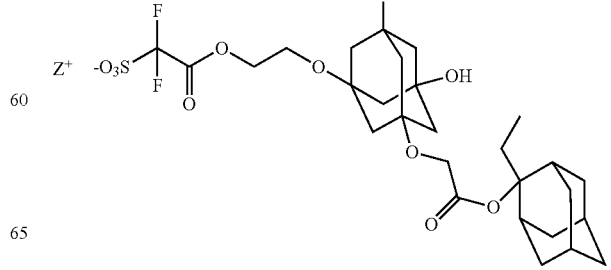

(b1-s-44)
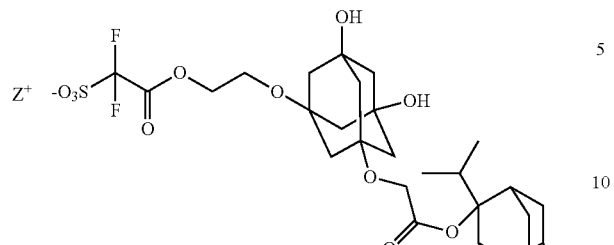
(b1-s-45)
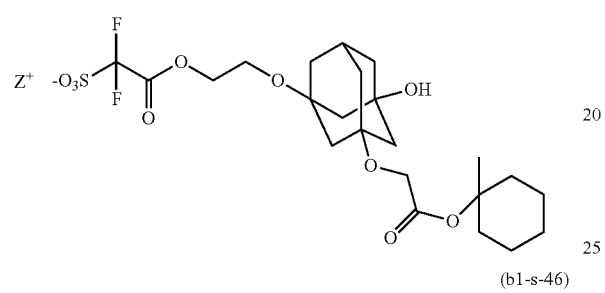
(b1-s-46)
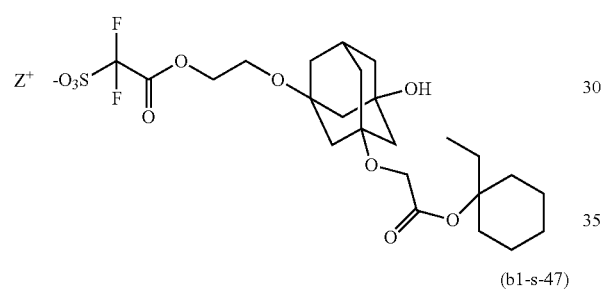
(b1-s-47)
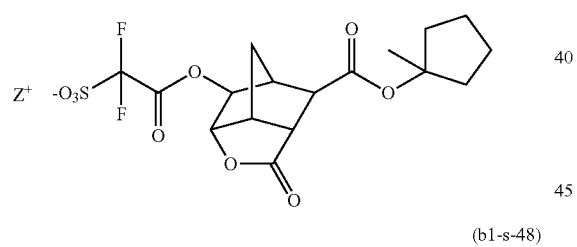
(b1-s-48)
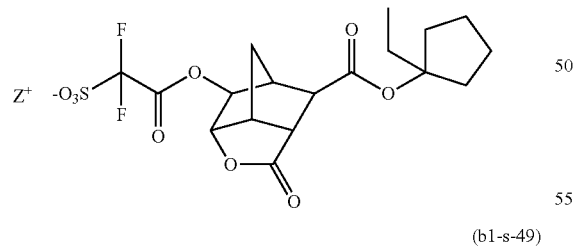
(b1-s-49)
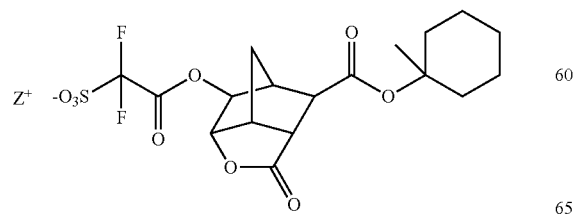
(b1-s-50)
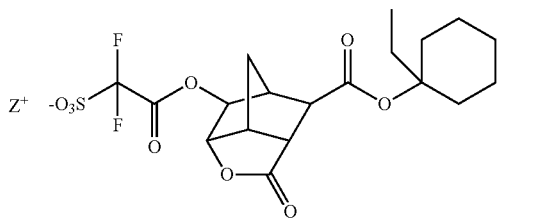
(b1-s-51)
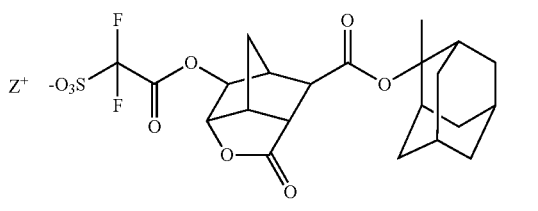
(b1-s-52)
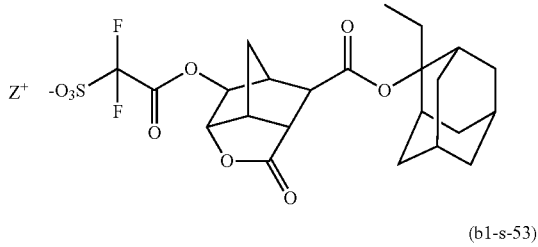
(b1-s-53)
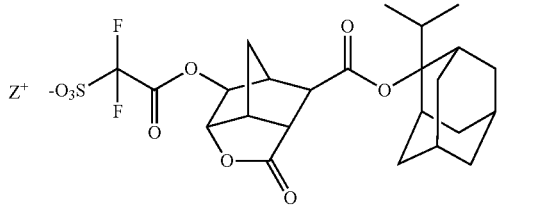
(b1-s-54)
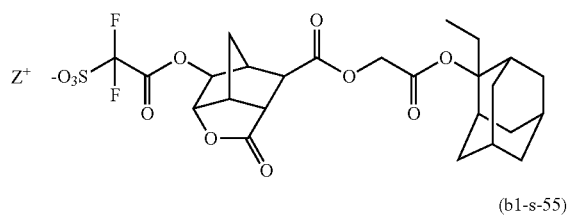
(b1-s-55)
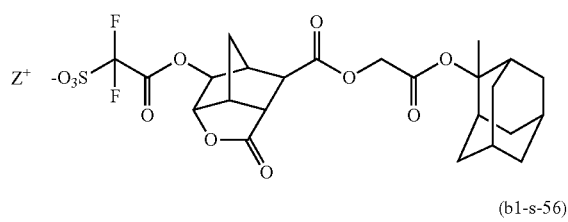
(b1-s-56)

(b1-s-57)
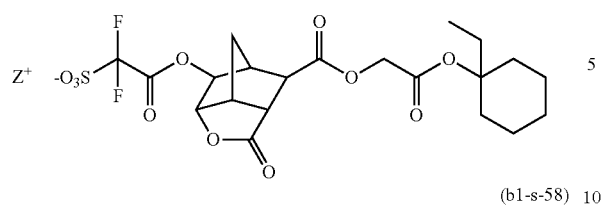
(b1-s-58)
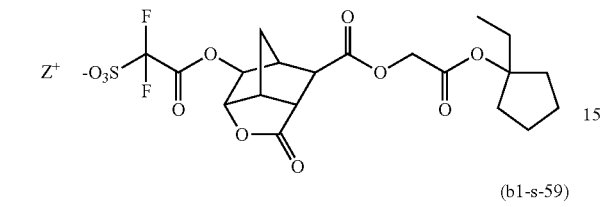
(b1-s-59)
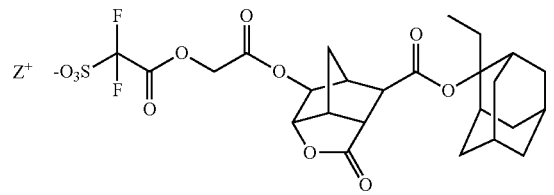
(b1-s-60)
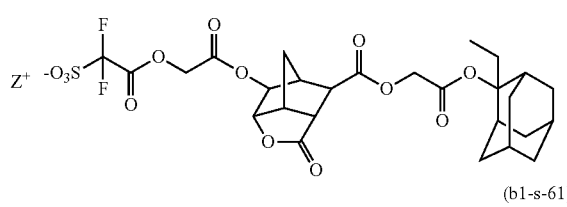
(b1-s-61)
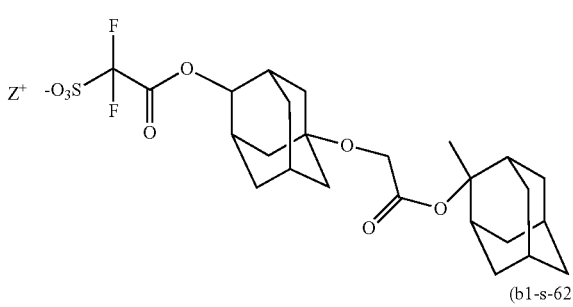
(b1-s-62)
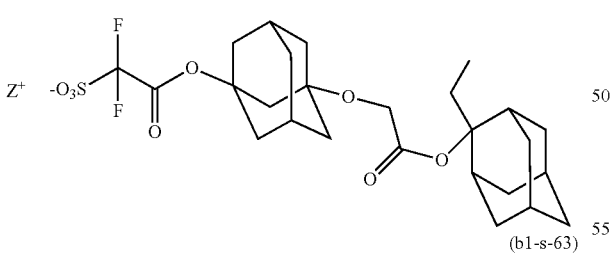
(b1-s-63)
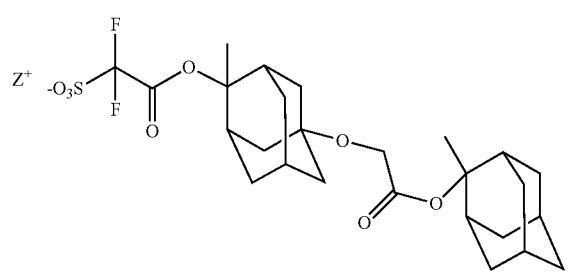
(b1-s-64)
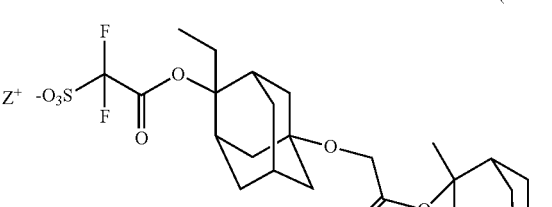
(b1-s-65)
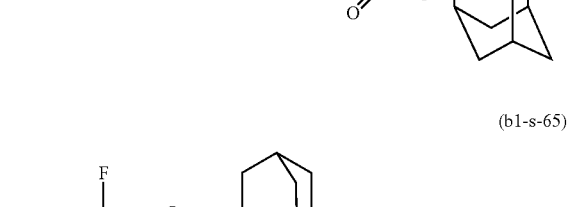
(b1-s-66)
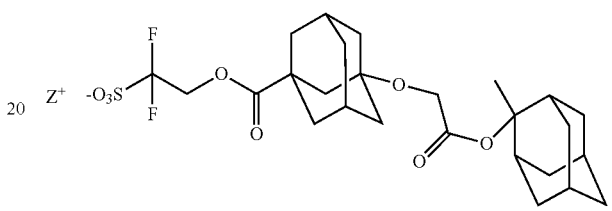
(b1-s-67)
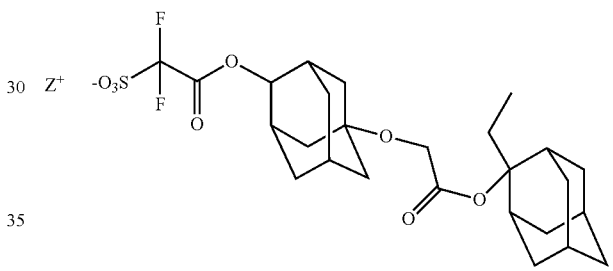
(b1-s-68)
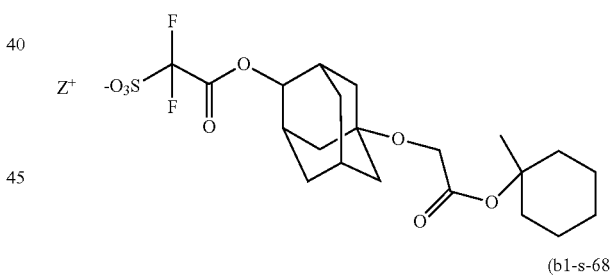
(b1-s-69)
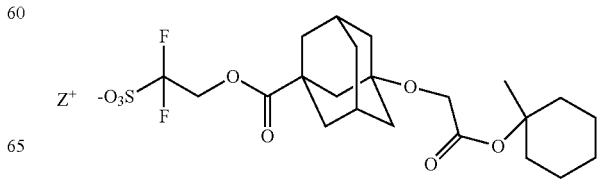

(b1-s-70)
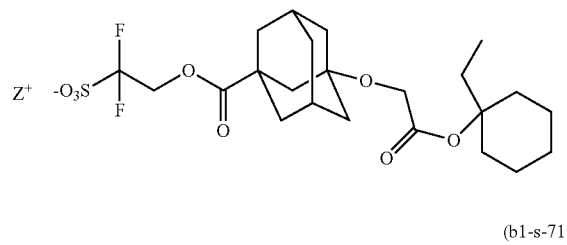
(b1-s-71)
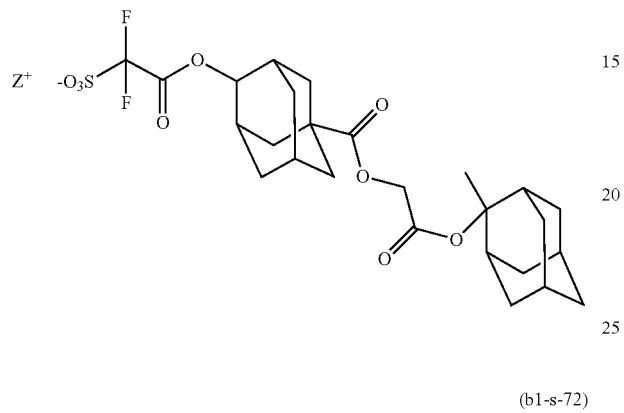
(b1-s-72)
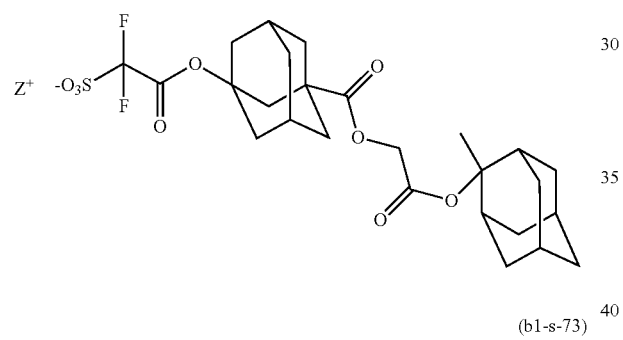
(b1-s-73)
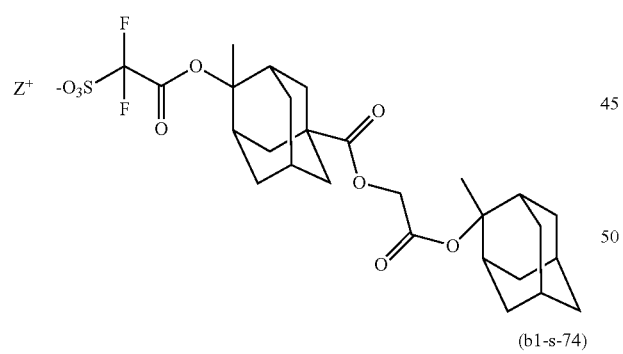
(b1-s-74)
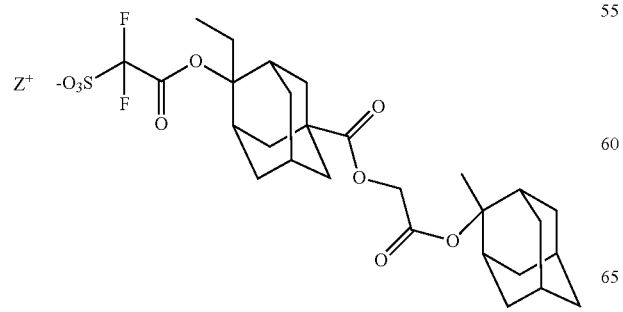
(b1-s-75)
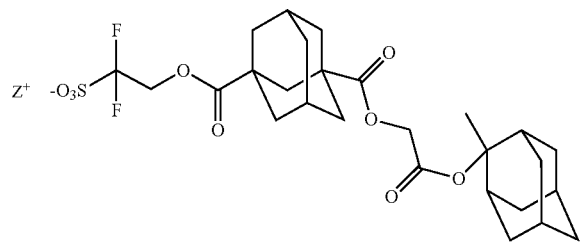
(b1-s-76)
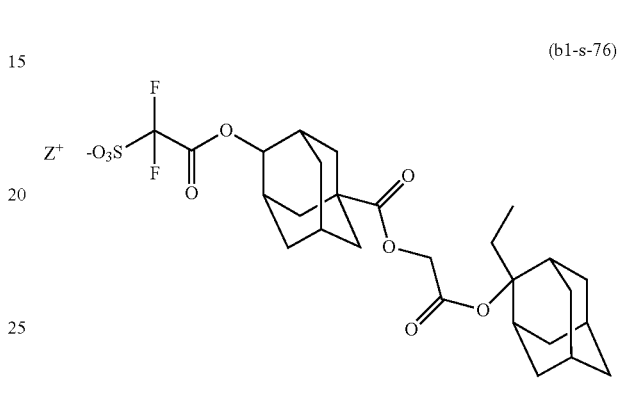
(b1-s-77)
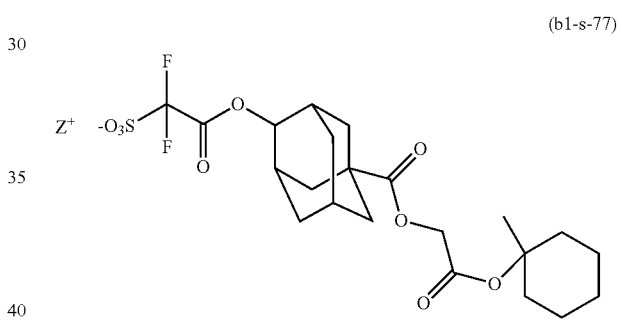
(b1-s-78)
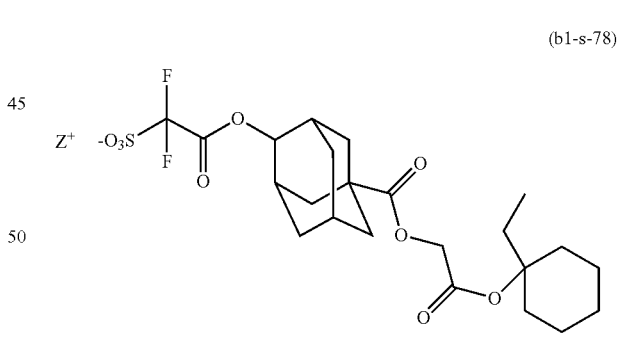
(b1-s-79)
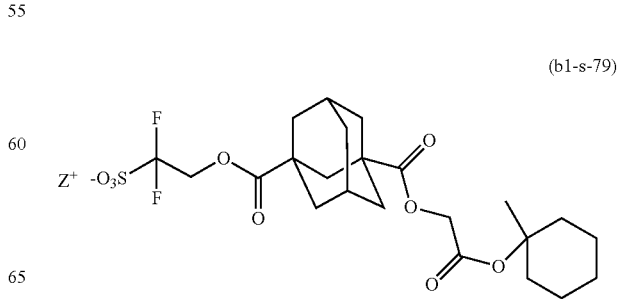

-continued (b1-s-80)

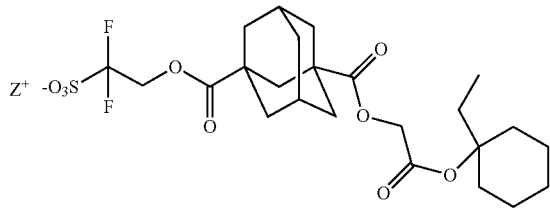

Among the acid generator (II), a salt represented by the formula (II-4-a) is preferable.

(II-4a)

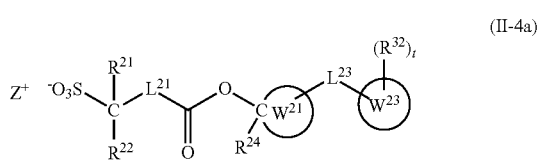

wherein $R^{21}$, $R^{22}$, $L^{21}$, $R^{24}$, ring $W^{21}$, $L^{23}$, ring $W^{23}$, $R^{32}$, t and $Z^+$ have the same definition of the above.

Examples of the cation ($Z^+$) of the salt include an organic onium cation such as an organic sulfonium cation, organic iodonium cation, organic ammonium cation, organic benzothiazolium cation and organic phosphonium cation. Among these, organic sulfonium cation and organic iodonium cation are preferable.

$Z^+$ of the acid generator (II) is preferably represented by any of the formula (Z1) to (Z4).

bon group may be replaced with a halogen atom, $C_1$ to $C_{18}$ alkyl group, a $C_2$ to $C_4$ acyl group or a glycidyloxy group, one or more hydrogen atom contained in the aromatic hydrocarbon group may be replaced with a halogen atom, a hydroxy group or a $C_1$ to $C_{12}$ alkoxy group;

$P^4$ and $P^5$ in each occurrence independently represent a hydroxy group, a $C_1$ to $C_{12}$ aliphatic hydrocarbon or a $C_1$ to $C_{12}$ alkoxy group;

$P^6$ and $P^7$ independently represent a $C_1$ to $C_{36}$ aliphatic hydrocarbon or a $C_3$ to $C_{36}$ alicyclic hydrocarbon group, or $P^6$ and $P^7$ may be bonded together to form a three- to twelve-membered ring (preferably a three- to seven-membered ring) with a sulfur atom which is bonded thereto, and one or more —$CH_2$— contained in the ring may be replaced by —O—, —S— or —CO—;

$P^8$ represents a hydrogen atom, a $C_1$ to $C_{36}$ aliphatic hydrocarbon group, a $C_3$ to $C_{36}$ alicyclic hydrocarbon group or a $C_6$ to $C_{18}$ aromatic hydrocarbon group;

$P^9$ represents a $C_1$ to $C_{12}$ aliphatic hydrocarbon group, a $C_3$ to $C_{18}$ alicyclic hydrocarbon group or a $C_6$ to $C_{18}$ aromatic hydrocarbon group, one or more hydrogen atoms contained in the aliphatic hydrocarbon group may be replaced by a $C_6$ to $C_{18}$ aromatic hydrocarbon group, one or more hydrogen atom contained in the aromatic hydrocarbon group may be replaced with a $C_1$ to $C_{12}$ alkoxy group or an alkyl carbonyloxy group;

$P^8$ and $P^9$ may be bonded together to form a three- to twelve-membered ring (preferably a three- to seven-membered ring) with —CH—CO— which is bonded thereto, and one or more —$CH_2$-contained in the ring may be replaced by —O—, —S— or —CO—;

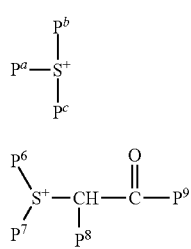

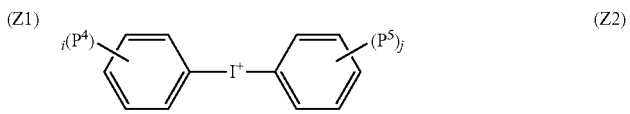

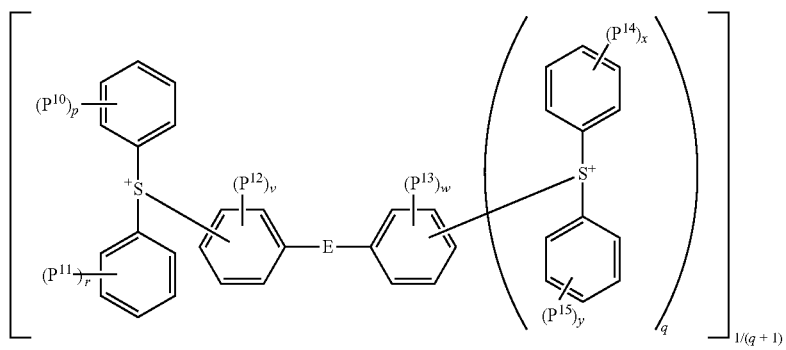

wherein $P^a$, $P^b$ and $P^c$ independently represent a $C_1$ to $C_{30}$ aliphatic hydrocarbon group, a $C_3$ to $C_{36}$ alicyclic hydrocarbon group or a $C_6$ to $C_{36}$ aromatic hydrocarbon group, or $P^a$ and $P^b$ may be bonded to form at least one sulfur atom-containing ring, one or more hydrogen atom contained in the aliphatic hydrocarbon group may be replaced with a hydroxy group, a $C_3$ to $C_{18}$ alicyclic hydrocarbon group, a $C_1$ to $C_{12}$ alkoxy group or a $C_6$ to $C_{18}$ aromatic hydrocarbon group, one or more hydrogen atom contained in the alicyclic hydrocar- $P^{10}$ to $P^{15}$ in each occurrence independently represent a hydroxy group, a $C_1$ to $C_{12}$ aliphatic hydrocarbon or a $C_1$ to $C_{12}$ alkoxy group;

E represents —S— or —O—;

i, j, p, r, x and y independently represent an integer of 0 to 5;

q represents an integer of 0 or 1;

v and w independently represent an integer of 0 to 4.

Examples of the aliphatic hydrocarbon group include an alkyl group such as methyl, ethyl, n-propyl, isopropyl, n-butyl, sec-butyl, tert-butyl, pentyl, hexyl, octyl and 2-ethylhexyl groups. The aliphatic hydrocarbon group of $P^6$ to $P^8$ is preferably a group having 1 to 12 carbon atoms.

Examples of the aliphatic hydrocarbon group in which one or more hydrogen atoms are replaced by an alicyclic hydrocarbon group 1-(1-adamatane-1-yl)-alkane-1-yl.

Examples of the alicyclic hydrocarbon group include a monocyclic hydrocarbon groups such as, cycloalkyl group, cyclopropyl, cyclobutyl, cyclopentyl, cyclohexyl, cycloheptyl, cyclooctyl, cyclodecyl; a polycyclic hydrocarbon groups such as decahydronaphtyl, adamantyl and norbornyl groups as well as groups below.

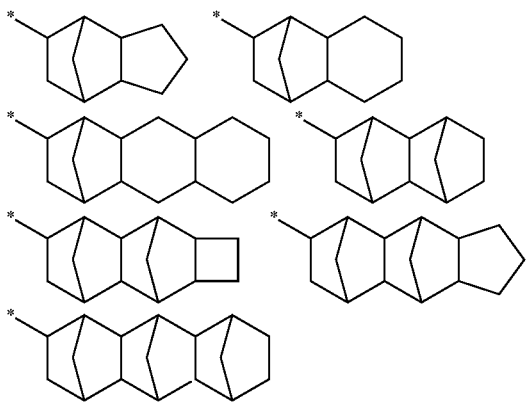

In particular, the alicyclic hydrocarbon group of $P^6$ to $P^8$ is preferably a $C_3$ to $C_{18}$ alicyclic hydrocarbon group, and more preferably a $C_4$ to $C_{12}$ alicyclic hydrocarbon group.

Examples of the alicyclic hydrocarbon group in which one or more hydrogen atoms are replaced by an alkyl group include methyl cyclohexyl, dimethyl cyclohexyl, 2-alkyladamantane-2-yl, methyl norbornyl and isobornyl groups.

Examples of the aromatic hydrocarbon group include phenyl, naphthyl, anthryl, p-methylphenyl, p-ethylphenyl, p-tert-butylphenyl, p-cyclohexylphenyl, p-methoxyphenyl, p-adamantylphenyl, tolyl, xylyl, cumenyl, mesityl, biphenyl, phenanthryl, 2,6-diethylphenyl and 2-methyl-6-ethylphenyl groups.

When the aromatic hydrocarbon include an aliphatic hydrocarbon group or an alicyclic hydrocarbon group, a $C_1$ to $C_{36}$ aliphatic hydrocarbon group or a $C_3$ to $C_{36}$ alicyclic hydrocarbon group is preferable.

Examples of the alkyl group in which one or more hydrogen atoms are replaced by an aromatic hydrocarbon group, i.e., aralkyl group include benzyl, phenethyl, phenylpropyl, trityl, naphthylmethyl and naphthylethyl groups.

Examples of the alkoxyl group include methoxy, ethoxy, n-propoxy, isopropoxy, n-butoxy, sec-butoxy, tert-butoxy, n-pentoxy, n-hexyloxy, heptyloxy, octyloxy, 2-ethylhexyloxy, nonyloxy, decyloxy, undecyloxy and dodecyloxy groups.

Examples of the halogen atom include fluorine, chlorine, bromine and iodine atoms.

Examples of the acyl group include acetyl, propionyl and butyryl groups.

Examples of the alkylcarbonyloxy group include methylcarbonyloxy, ethylcarbonyloxy, n-propylcarbonyloxy, isopropylcarbonyloxy, n-butylcarbonyloxy, sec-butylcarbonyloxy, tert-butylcarbonyloxy, pentylcarbonyloxy, hexylcarbonyloxy, octylcarbonyloxy and 2-ethylhexylcarbonyloxy groups.

The sulfur-containing ring formed by $P^a$ and $P^b$ may be either of monocyclic or polycyclic, aromatic or non-aromatic, or saturated or unsaturated ring, and may further have at least one of sulfur atom and/or at least one of oxygen atom as long as the ring has one sulfur atom. The ring is preferably a ring having 3 to 18 carbon atoms, and more preferably a ring having 4 to 12 carbon atoms.

Examples of the ring formed by $P^6$ and $P^7$ bonded together with a sulfur atom includes, for example, thiolane-1-ium ring (tetrahydrothiophenium ring), thian-1-ium ring and 1,4-oxathian-4-ium ring.

Examples of the ring formed by $P^8$ and $P^9$ bonded together with —CH—CO— include oxocycloheptane ring, oxocyclohexane ring, oxonorbornane ring and oxoadamantane ring.

Among the cations represented by the formula (Z1) to the formula (Z4), the cation represented by the formula (Z1) is preferable, the cation represented by the formula (Z5) is more preferable, and triphenyl sulfonium cation (z1=z2=z3=0 in the formula (Z5)), diphenyl sulfonium cation (z1=z2=0, z3=1, and $R^3$ is a methyl group in the formula (Z5)), and tritolyl sulfonium cation (z1=z2=z3=1, $P^1$, $P^2$ and $P^3$ are a methyl group in the formula (Z5)) are more preferable.

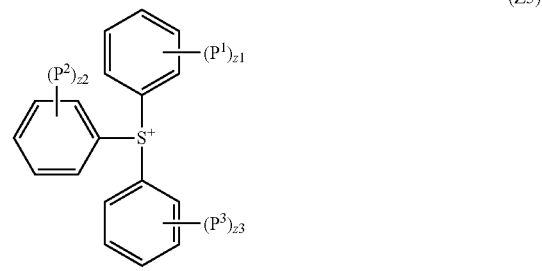

(Z5)

wherein $P^1$ to $P^3$ in each occurrence independently represent a halogen atom, a hydroxy group, a $C_1$ to $C_{36}$ aliphatic hydrocarbon group, a $C_3$ to $C_{36}$ alicyclic hydrocarbon group or a $C_1$ to $C_{12}$ alkoxy group, or two of $P^1$ to $P^3$ may be bonded together to form a ring which contains a sulfur atom;

z1, z2 and z3 independently represent an integer of 0 or 5.

The sulfur-containing ring formed by two of $P^1$ to P3 may be either of monocyclic or polycyclic, aromatic or non-aromatic, or saturated or unsaturated ring, and may further have at least one of sulfur atom and/or at least one of oxygen atom as long as the ring has one sulfur atom.

The aliphatic hydrocarbon group preferably has 1 to 12 carbon atoms, and the alicyclic hydrocarbon group preferably has 4 to 36 carbon atoms.

Among these, $P^1$ to $P^3$ are in each occurrence independently preferably a halogen atom (more preferably fluorine atom), a hydroxy group, a $C_1$ to $C_{12}$ alkyl group or a $C_1$ to $C_{12}$ alkoxy group, or two of $P^1$ to $P^3$ are preferably bonded together to form a ring which contains a sulfur atom and an oxygen atom.

z1, z2 and z3 are independently preferably 0 or 1.

Specific examples of the cation of the formula (Z5) include a cation below.

(b2-c-1) 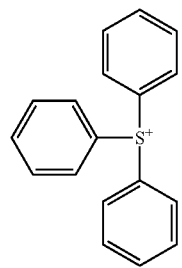
(b2-c-2) 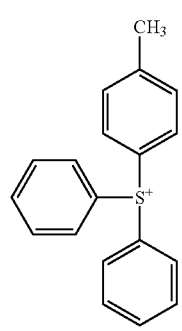
(b2-c-3) 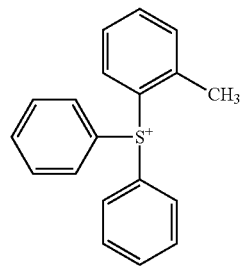
(b2-c-4) 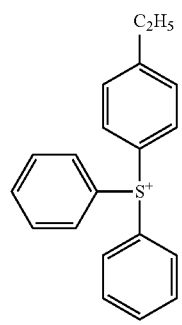
(b2-c-5) 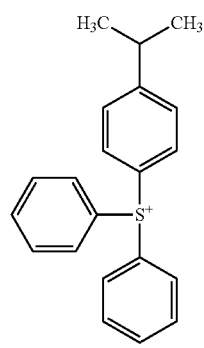
-continued
(b2-c-6) 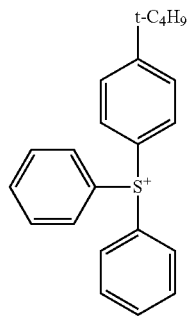
(b2-c-7) 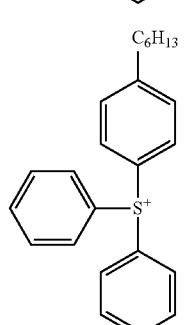
(b2-c-8) 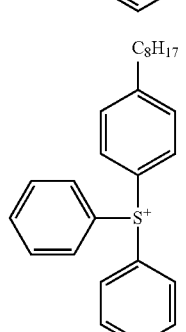
(b2-c-9) 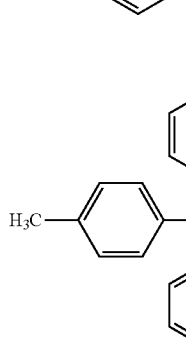
(b2-c-10) 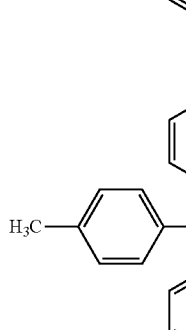

(b2-c-11)
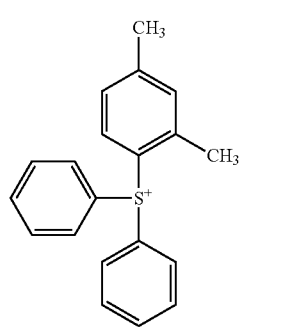
(b2-c-12)
(b2-c-13)
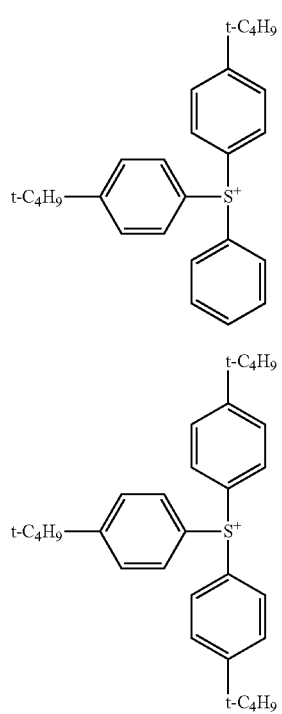
(b2-c-14)
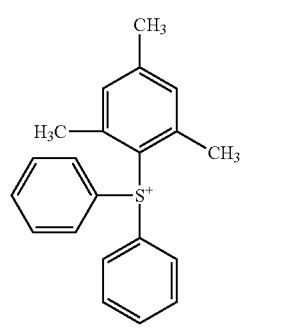
(b2-c-15)
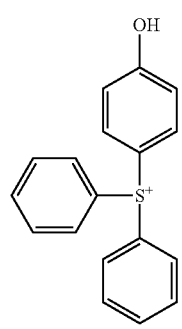
(b2-c-16)
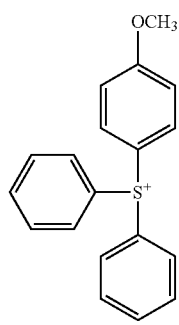
(b2-c-17)
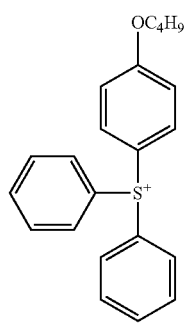
(b2-c-18)
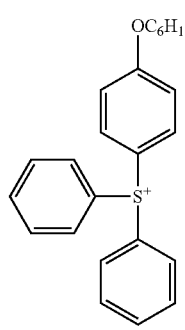
(b2-c-19)
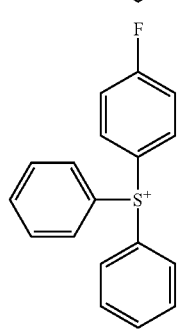
(b2-c-20)
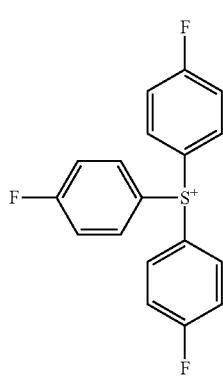

Specific examples of the cation of the formula (Z1) include a cation below.

(b2-c-21)
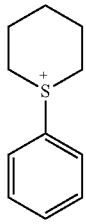

(b2-c-22)
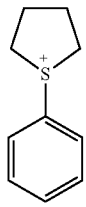

(b2-c-23)
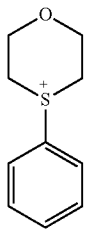

(b2-c-24)
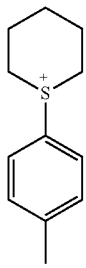

(b2-c-25)
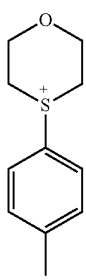

(b2-c-26)
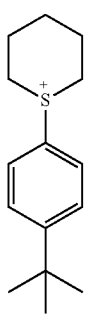

(b2-c-27)
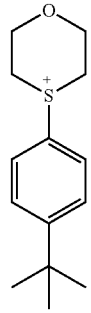

Specific examples of the cation of the formula (Z2) include a cation below.

(b2-c-28)
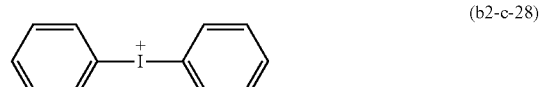

(b2-c-29)
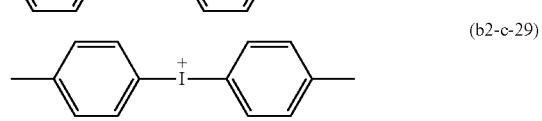

(b2-c-30)
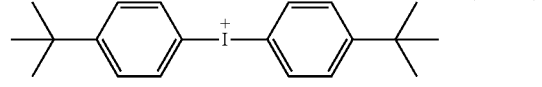

Specific examples of the cation of the formula (Z3) include a cation below.

(b2-c-31)
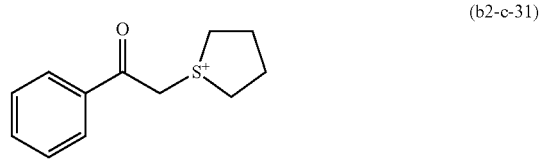

(b2-c-32)
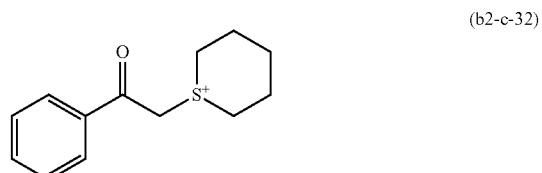

(b2-c-33)
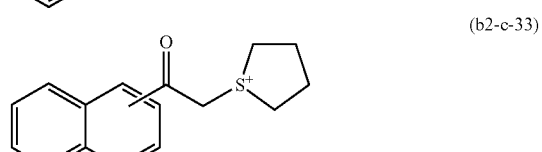

(b2-c-34)
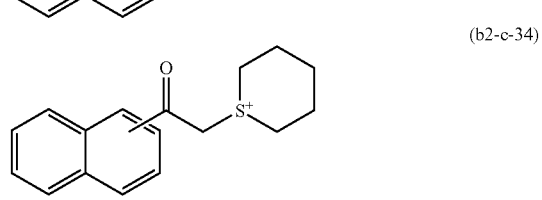

Examples of the cation may include cations described in JP 2010-204646A.

The acid generator (II) is a compound in combination of the above sulfonate anion and an organic cation.

The above sulfonate anion and the organic cation may optionally be combined, for example, as described in the Table 1 below. The sulfonate anion represented by the formula (b1-s-2) is expressed "(b1-s-2)", and the organic cation represented by the formula (b2-c-1) is expressed "(b2-c-1)" in the table, for example.

TABLE 1

| Acid Generator | Anion | Cation |
| --- | --- | --- |
| (II-1) | (b1-s-2) | (b2-c-1) |
| (II-2) | (b1-s-2) | (b2-c-2) |
| (II-3) | (b1-s-2) | (b2-c-10) |
| (II-4) | (b1-s-2) | (b2-c-14) |
| (II-5) | (b1-s-2) | (b2-c-23) |
| (II-6) | (b1-s-2) | (b2-c-27) |
| (II-7) | (b1-s-2) | (b2-c-28) |
| (II-8) | (b1-s-2) | (b2-c-31) |
| (II-9) | (b1-s-4) | (b2-c-1) |
| (II-10) | (b1-s-4) | (b2-c-2) |
| (II-11) | (b1-s-4) | (b2-c-10) |
| (II-12) | (b1-s-4) | (b2-c-14) |
| (II-13) | (b1-s-4) | (b2-c-23) |
| (II-14) | (b1-s-4) | (b2-c-27) |
| (II-15) | (b1-s-4) | (b2-c-28) |
| (II-16) | (b1-s-4) | (b2-c-31) |
| (II-17) | (b1-s-1) | (b2-c-1) |
| (II-18) | (b1-s-1) | (b2-c-2) |
| (II-19) | (b1-s-1) | (b2-c-10) |
| (II-20) | (b1-s-1) | (b2-c-14) |
| (II-21) | (b1-s-1) | (b2-c-23) |
| (II-22) | (b1-s-1) | (b2-c-27) |
| (II-23) | (b1-s-1) | (b2-c-28) |
| (II-24) | (b1-s-1) | (b2-c-31) |
| (II-25) | (b1-s-3) | (b2-c-1) |
| (II-26) | (b1-s-3) | (b2-c-2) |
| (II-27) | (b1-s-3) | (b2-c-10) |
| (II-28) | (b1-s-3) | (b2-c-14) |
| (II-29) | (b1-s-3) | (b2-c-23) |
| (II-30) | (b1-s-3) | (b2-c-27) |
| (II-31) | (b1-s-3) | (b2-c-28) |
| (II-32) | (b1-s-3) | (b2-c-31) |
| (II-33) | (b1-s-5) | (b2-c-1) |
| (II-34) | (b1-s-5) | (b2-c-2) |
| (II-35) | (b1-s-5) | (b2-c-10) |
| (II-36) | (b1-s-5) | (b2-c-14) |
| (II-37) | (b1-s-5) | (b2-c-23) |
| (II-38) | (b1-s-5) | (b2-c-27) |
| (II-39) | (b1-s-5) | (b2-c-28) |
| (II-40) | (b1-s-5) | (b2-c-31) |
| (II-41) | (b1-s-17) | (b2-c-1) |
| (II-42) | (b1-s-17) | (b2-c-2) |
| (II-43) | (b1-s-17) | (b2-c-10) |
| (II-44) | (b1-s-17) | (b2-c-14) |
| (II-45) | (b1-s-17) | (b2-c-23) |
| (II-46) | (b1-s-17) | (b2-c-27) |
| (II-47) | (b1-s-17) | (b2-c-28) |
| (II-48) | (b1-s-17) | (b2-c-31) |
| (II-49) | (b1-s-24) | (b2-c-1) |
| (II-50) | (b1-s-24) | (b2-c-2) |
| (II-51) | (b1-s-24) | (b2-c-10) |
| (II-52) | (b1-s-24) | (b2-c-14) |
| (II-53) | (b1-s-24) | (b2-c-23) |
| (II-54) | (b1-s-24) | (b2-c-27) |
| (II-55) | (b1-s-24) | (b2-c-28) |
| (II-56) | (b1-s-24) | (b2-c-31) |
| (II-57) | (b1-s-6) | (b2-c-1) |
| (II-58) | (b1-s-6) | (b2-c-10) |
| (II-59) | (b1-s-7) | (b2-c-1) |
| (II-60) | (b1-s-7) | (b2-c-10) |
| (II-61) | (b1-s-8) | (b2-c-1) |
| (II-62) | (b1-s-8) | (b2-c-10) |
| (II-63) | (b1-s-9) | (b2-c-1) |
| (II-64) | (b1-s-9) | (b2-c-10) |
| (II-65) | (b1-s-10) | (b2-c-1) |
| (II-66) | (b1-s-10) | (b2-c-10) |
| (II-67) | (b1-s-11) | (b2-c-1) |
| (II-68) | (b1-s-11) | (b2-c-10) |
| (II-69) | (b1-s-12) | (b2-c-1) |
| (II-70) | (b1-s-12) | (b2-c-10) |
| (II-71) | (b1-s-13) | (b2-c-1) |
| (II-72) | (b1-s-13) | (b2-c-10) |
| (II-73) | (b1-s-14) | (b2-c-1) |
| (II-74) | (b1-s-14) | (b2-c-10) |
| (II-75) | (b1-s-15) | (b2-c-1) |
| (II-76) | (b1-s-15) | (b2-c-10) |
| (II-77) | (b1-s-16) | (b2-c-1) |
| (II-78) | (b1-s-16) | (b2-c-10) |
| (II-79) | (b1-s-18) | (b2-c-1) |
| (II-80) | (b1-s-18) | (b2-c-10) |
| (II-81) | (b1-s-19) | (b2-c-1) |
| (II-82) | (b1-s-19) | (b2-c-10) |
| (II-83) | (b1-s-20) | (b2-c-1) |
| (II-84) | (b1-s-20) | (b2-c-10) |
| (II-85) | (b1-s-21) | (b2-c-1) |
| (II-86) | (b1-s-21) | (b2-c-10) |
| (II-87) | (b1-s-22) | (b2-c-1) |
| (II-88) | (b1-s-22) | (b2-c-10) |
| (II-89) | (b1-s-23) | (b2-c-1) |
| (II-90) | (b1-s-23) | (b2-c-10) |
| (II-91) | (b1-s-25) | (b2-c-1) |
| (II-92) | (b1-s-25) | (b2-c-10) |
| (II-93) | (b1-s-26) | (b2-c-1) |
| (II-94) | (b1-s-26) | (b2-c-10) |
| (II-95) | (b1-s-27) | (b2-c-1) |
| (II-96) | (b1-s-27) | (b2-c-10) |
| (II-97) | (b1-s-28) | (b2-c-1) |
| (II-98) | (b1-s-28) | (b2-c-10) |
| (II-99) | (b1-s-29) | (b2-c-1) |
| (II-100) | (b1-s-29) | (b2-c-10) |
| (II-101) | (b1-s-30) | (b2-c-1) |
| (II-102) | (b1-s-30) | (b2-c-10) |
| (II-103) | (b1-s-31) | (b2-c-1) |
| (II-104) | (b1-s-31) | (b2-c-2) |
| (II-105) | (b1-s-31) | (b2-c-6) |
| (II-106) | (b1-s-31) | (b2-c-10) |
| (II-107) | (b1-s-31) | (b2-c-12) |
| (II-108) | (b1-s-31) | (b2-c-15) |
| (II-109) | (b1-s-31) | (b2-c-21) |
| (II-100) | (b1-s-29) | (b2-c-10) |
| (II-101) | (b1-s-30) | (b2-c-1) |
| (II-102) | (b1-s-30) | (b2-c-10) |
| (II-103) | (b1-s-31) | (b2-c-1) |
| (II-104) | (b1-s-31) | (b2-c-2) |
| (II-105) | (b1-s-31) | (b2-c-6) |
| (II-106) | (b1-s-31) | (b2-c-10) |
| (II-107) | (b1-s-31) | (b2-c-12) |
| (II-108) | (b1-s-31) | (b2-c-15) |
| (II-109) | (b1-s-31) | (b2-c-21) |
| (II-110) | (b1-s-31) | (b2-c-23) |
| (II-111) | (b1-s-32) | (b2-c-1) |
| (II-112) | (b1-s-32) | (b2-c-2) |
| (II-113) | (b1-s-32) | (b2-c-6) |
| (II-114) | (b1-s-32) | (b2-c-10) |
| (II-115) | (b1-s-32) | (b2-c-12) |
| (II-116) | (b1-s-32) | (b2-c-15) |
| (II-117) | (b1-s-32) | (b2-c-21) |
| (II-118) | (b1-s-32) | (b2-c-23) |
| (II-119) | (b1-s-34) | (b2-c-1) |
| (II-120) | (b1-s-34) | (b2-c-2) |
| (II-121) | (b1-s-34) | (b2-c-6) |
| (II-122) | (b1-s-34) | (b2-c-10) |
| (II-123) | (b1-s-34) | (b2-c-12) |
| (II-124) | (b1-s-34) | (b2-c-15) |
| (II-125) | (b1-s-34) | (b2-c-21) |
| (II-126) | (b1-s-34) | (b2-c-23) |
| (II-127) | (b1-s-35) | (b2-c-1) |
| (II-128) | (b1-s-35) | (b2-c-2) |
| (II-129) | (b1-s-35) | (b2-c-6) |
| (II-130) | (b1-s-35) | (b2-c-10) |
| (II-131) | (b1-s-35) | (b2-c-12) |
| (II-132) | (b1-s-35) | (b2-c-15) |
| (II-133) | (b1-s-35) | (b2-c-21) |
| (II-134) | (b1-s-35) | (b2-c-23) |
| (II-135) | (b1-s-37) | (b2-c-1) |
| (II-136) | (b1-s-37) | (b2-c-2) |
| (II-137) | (b1-s-37) | (b2-c-6) |

TABLE 1-continued

| Acid Generator | Anion | Cation |
|---|---|---|
| (II-138) | (b1-s-37) | (b2-c-10) |
| (II-139) | (b1-s-37) | (b2-c-12) |
| (II-140) | (b1-s-37) | (b2-c-15) |
| (II-141) | (b1-s-37) | (b2-c-21) |
| (II-142) | (b1-s-37) | (b2-c-23) |
| (II-143) | (b1-s-38) | (b2-c-1) |
| (II-144) | (b1-s-38) | (b2-c-2) |
| (II-145) | (b1-s-38) | (b2-c-6) |
| (II-146) | (b1-s-38) | (b2-c-10) |
| (II-147) | (b1-s-38) | (b2-c-12) |
| (II-148) | (b1-s-38) | (b2-c-15) |
| (II-149) | (b1-s-38) | (b2-c-21) |
| (II-150) | (b1-s-38) | (b2-c-23) |
| (II-151) | (b1-s-49) | (b2-c-1) |
| (II-152) | (b1-s-49) | (b2-c-2) |
| (II-153) | (b1-s-49) | (b2-c-6) |
| (II-154) | (b1-s-49) | (b2-c-10) |
| (II-155) | (b1-s-49) | (b2-c-12) |
| (II-156) | (b1-s-49) | (b2-c-15) |
| (II-157) | (b1-s-49) | (b2-c-21) |
| (II-158) | (b1-s-49) | (b2-c-23) |
| (II-159) | (b1-s-50) | (b2-c-1) |
| (II-160) | (b1-s-50) | (b2-c-2) |
| (II-161) | (b1-s-50) | (b2-c-6) |
| (II-162) | (b1-s-50) | (b2-c-10) |
| (II-163) | (b1-s-50) | (b2-c-12) |
| (II-164) | (b1-s-50) | (b2-c-15) |
| (II-165) | (b1-s-50) | (b2-c-21) |
| (II-166) | (b1-s-50) | (b2-c-23) |
| (II-167) | (b1-s-51) | (b2-c-1) |
| (II-168) | (b1-s-51) | (b2-c-2) |
| (II-169) | (b1-s-51) | (b2-c-6) |
| (II-170) | (b1-s-51) | (b2-c-10) |
| (II-171) | (b1-s-51) | (b2-c-12) |
| (II-172) | (b1-s-51) | (b2-c-15) |
| (II-173) | (b1-s-51) | (b2-c-21) |
| (II-174) | (b1-s-51) | (b2-c-23) |
| (II-175) | (b1-s-52) | (b2-c-1) |
| (II-176) | (b1-s-52) | (b2-c-2) |
| (II-177) | (b1-s-52) | (b2-c-6) |
| (II-178) | (b1-s-52) | (b2-c-10) |
| (II-179) | (b1-s-52) | (b2-c-12) |
| (II-180) | (b1-s-52) | (b2-c-15) |
| (II-181) | (b1-s-52) | (b2-c-21) |
| (II-182) | (b1-s-52) | (b2-c-23) |
| (II-183) | (b1-s-54) | (b2-c-1) |
| (II-184) | (b1-s-54) | (b2-c-2) |
| (II-185) | (b1-s-54) | (b2-c-6) |
| (II-186) | (b1-s-54) | (b2-c-10) |
| (II-187) | (b1-s-54) | (b2-c-12) |
| (II-188) | (b1-s-54) | (b2-c-15) |
| (II-189) | (b1-s-54) | (b2-c-21) |
| (II-190) | (b1-s-54) | (b2-c-23) |
| (II-191) | (b1-s-55) | (b2-c-1) |
| (II-192) | (b1-s-55) | (b2-c-2) |
| (II-193) | (b1-s-55) | (b2-c-6) |
| (II-194) | (b1-s-55) | (b2-c-10) |
| (II-195) | (b1-s-55) | (b2-c-12) |
| (II-196) | (b1-s-55) | (b2-c-15) |
| (II-197) | (b1-s-55) | (b2-c-21) |
| (II-198) | (b1-s-55) | (b2-c-23) |
| (II-199) | (b1-s-61) | (b2-c-1) |
| (II-200) | (b1-s-61) | (b2-c-10) |
| (II-201) | (b1-s-62) | (b2-c-1) |
| (II-202) | (b1-s-62) | (b2-c-10) |
| (II-203) | (b1-s-63) | (b2-c-1) |
| (II-204) | (b1-s-63) | (b2-c-10) |
| (II-205) | (b1-s-64) | (b2-c-1) |
| (II-206) | (b1-s-64) | (b2-c-10) |
| (II-207) | (b1-s-66) | (b2-c-1) |
| (II-208) | (b1-s-66) | (b2-c-10) |
| (II-209) | (b1-s-67) | (b2-c-1) |
| (II-210) | (b1-s-67) | (b2-c-10) |
| (II-211) | (b1-s-68) | (b2-c-1) |
| (II-212) | (b1-s-68) | (b2-c-10) |
| (II-213) | (b1-s-71) | (b2-c-1) |
| (II-214) | (b1-s-71) | (b2-c-10) |
| (II-215) | (b1-s-72) | (b2-c-1) |
| (II-216) | (b1-s-72) | (b2-c-10) |
| (II-217) | (b1-s-73) | (b2-c-1) |
| (II-218) | (b1-s-73) | (b2-c-10) |
| (II-219) | (b1-s-74) | (b2-c-1) |
| (II-220) | (b1-s-74) | (b2-c-10) |
| (II-221) | (b1-s-76) | (b2-c-1) |
| (II-222) | (b1-s-76) | (b2-c-10) |
| (II-223) | (b1-s-77) | (b2-c-1) |
| (II-224) | (b1-s-77) | (b2-c-10) |
| (II-225) | (b1-s-78) | (b2-c-1) |
| (II-226) | (b1-s-78) | (b2-c-10) |

More preferable examples of the acid generator (II) include salts below.

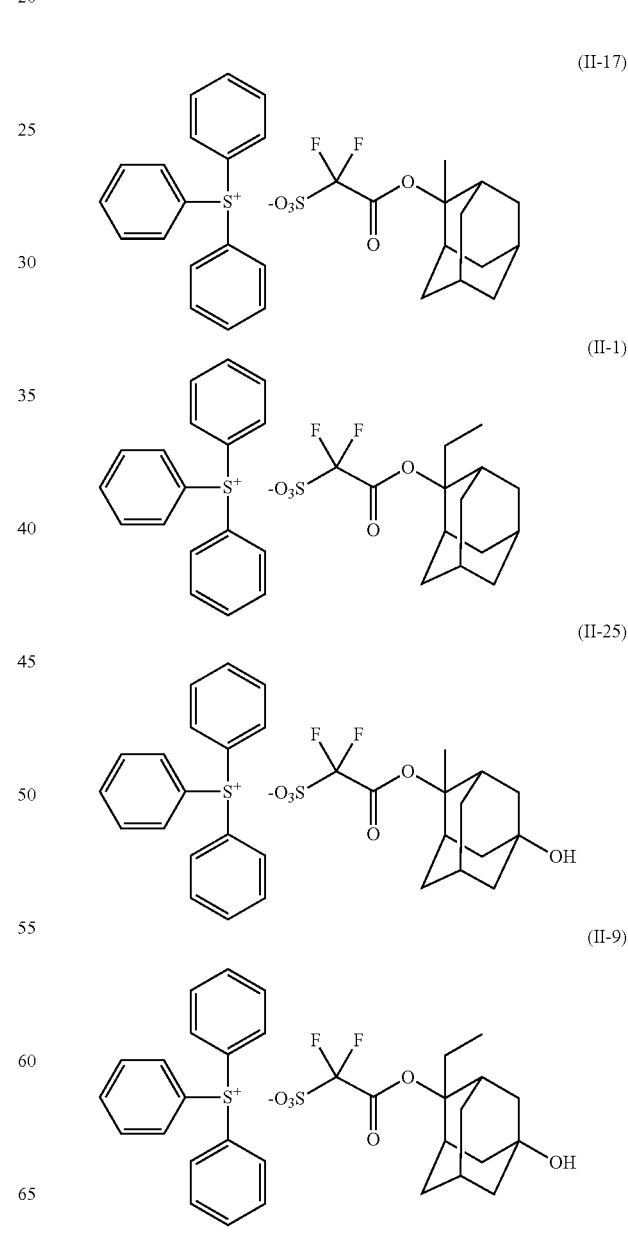

-continued
(II-33)
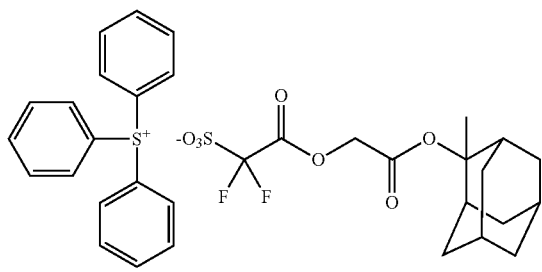
(II-41)
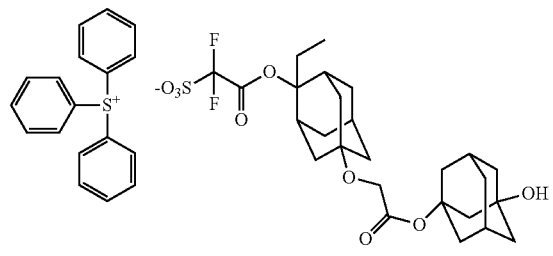
(II-49)
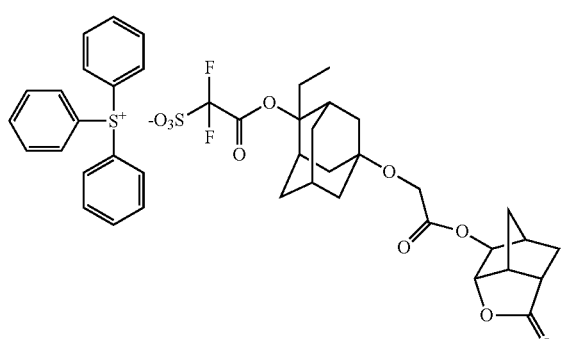
(II-103)
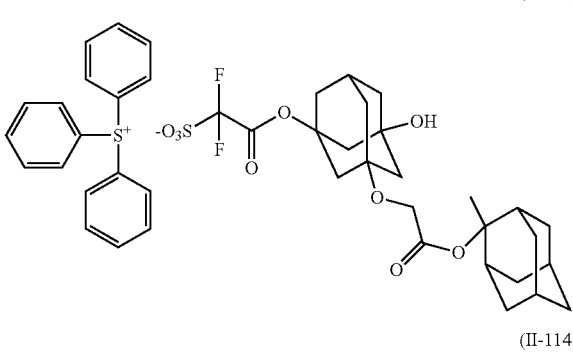
(II-114)
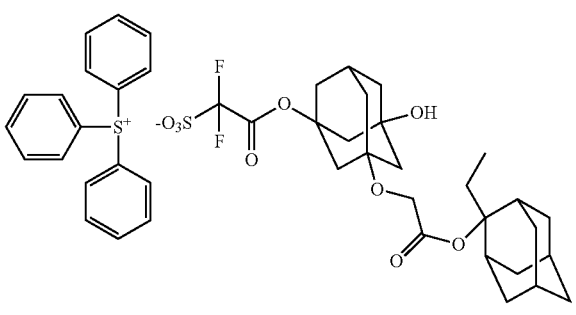
-continued
(II-119)
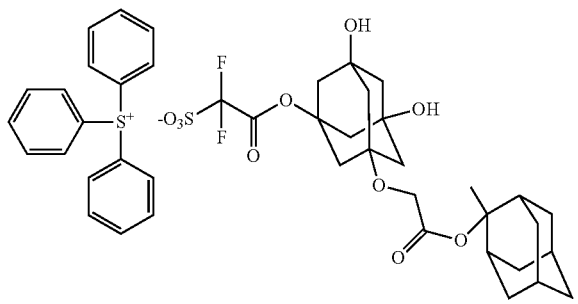
(II-127)
(II-135)
(II-143)
(II-151)

(II-159)
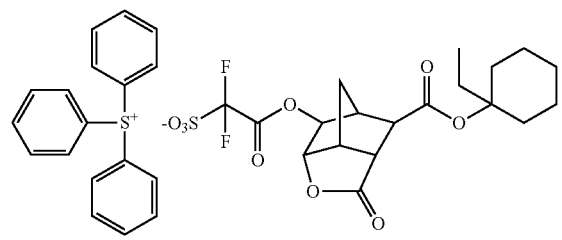
(II-167)
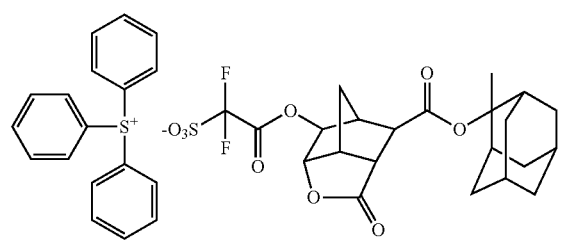
(II-175)
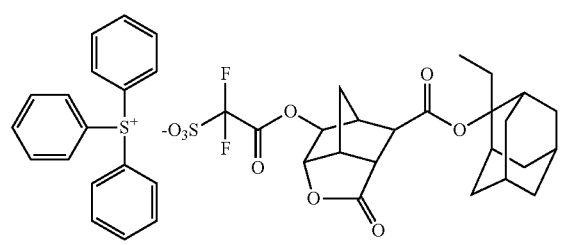
(II-183)
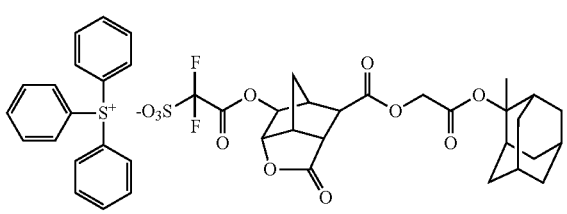
(II-191)
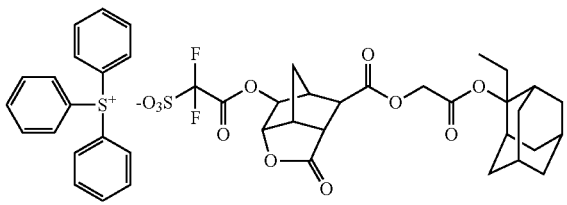
(II-199)
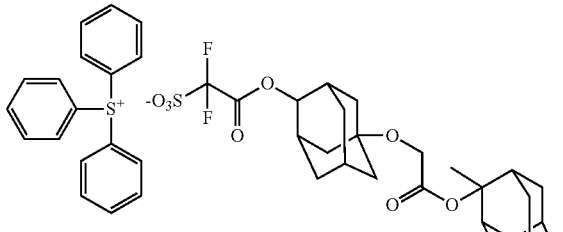
(II-201)
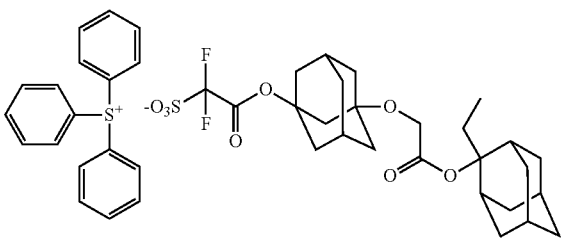
(II-203)
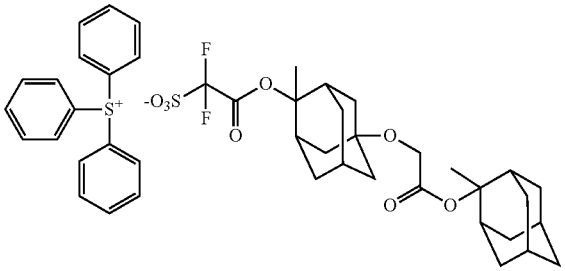
(II-205)
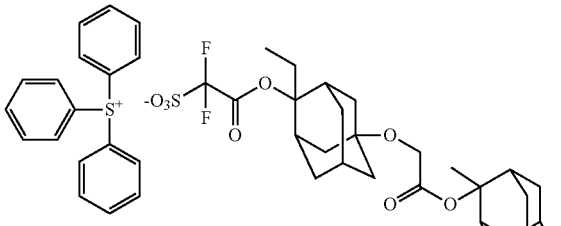
(II-207)
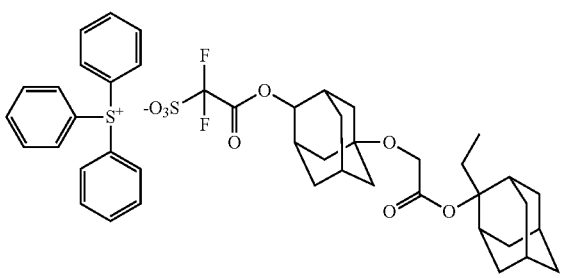
(II-209)
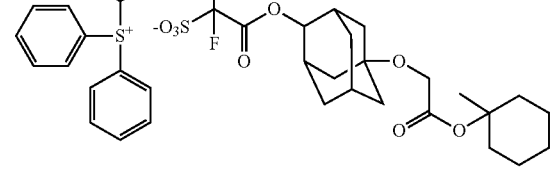

(II-211)
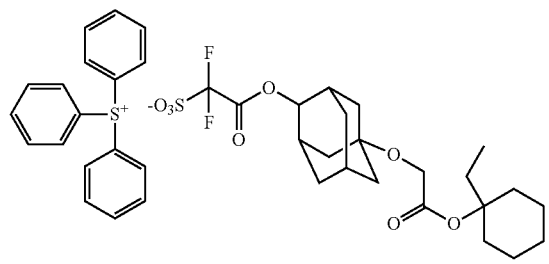
(II-213)
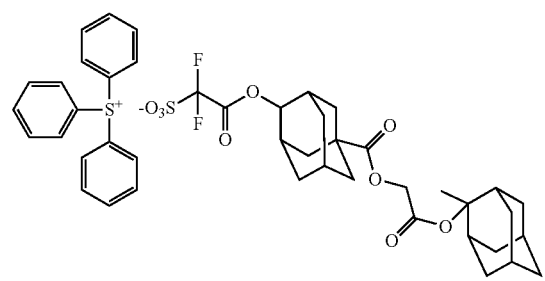
(II-215)
(II-217)
(II-219)
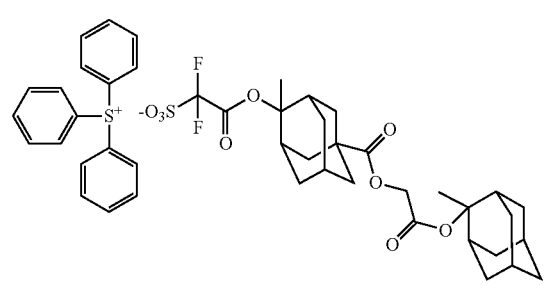
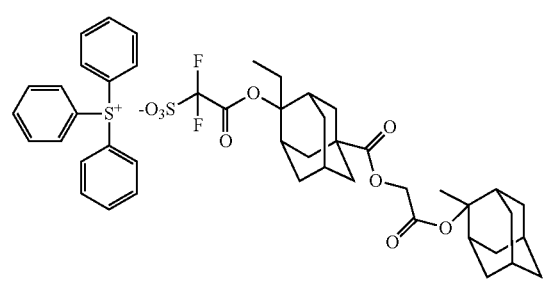
(II-221)
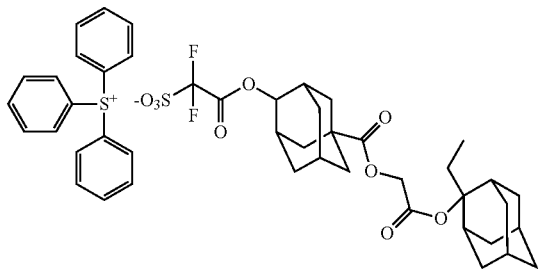
(II-223)
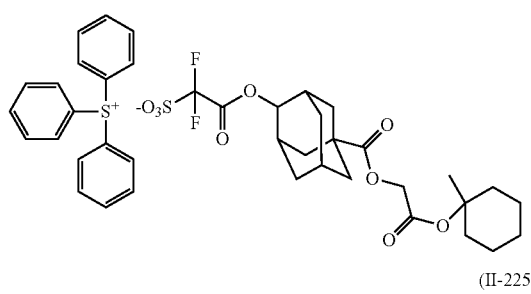
(II-225)
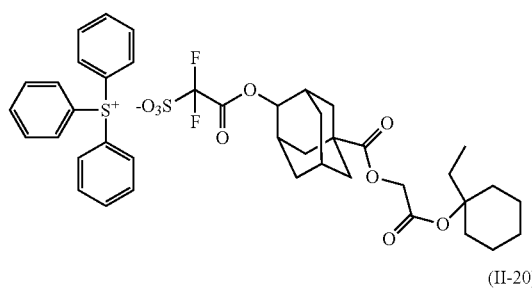
(II-20)
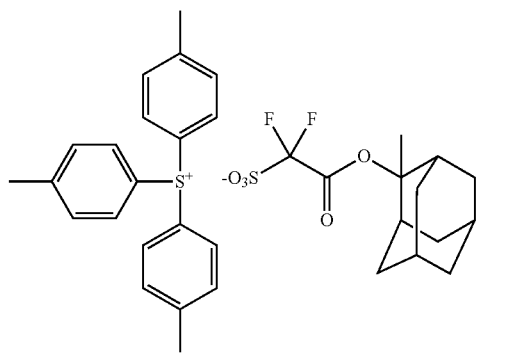
(II-4)
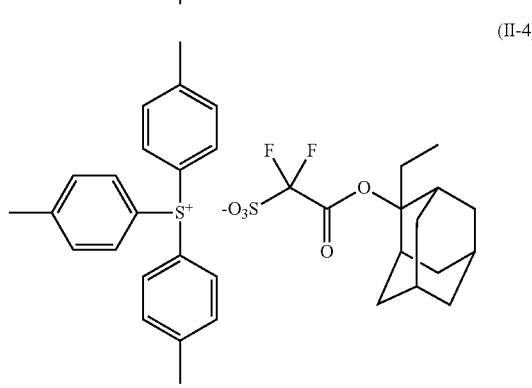

(II-28)
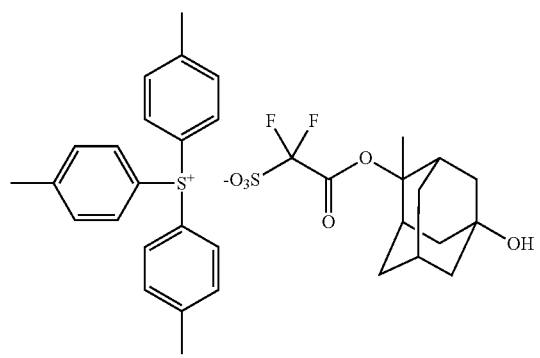
(II-12)
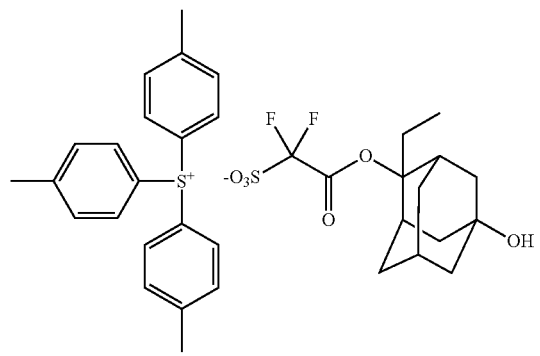
(II-36)
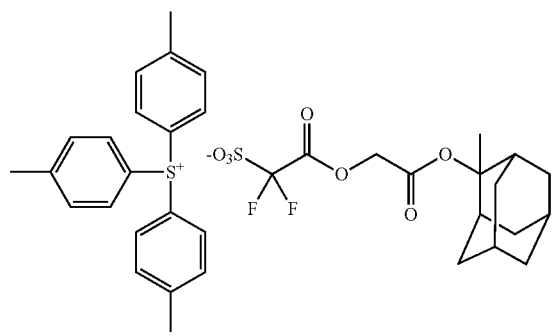
(II-44)
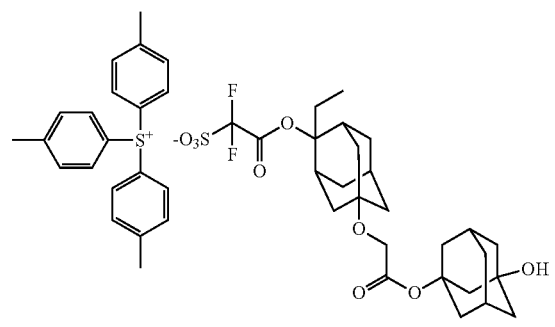
(II-52)
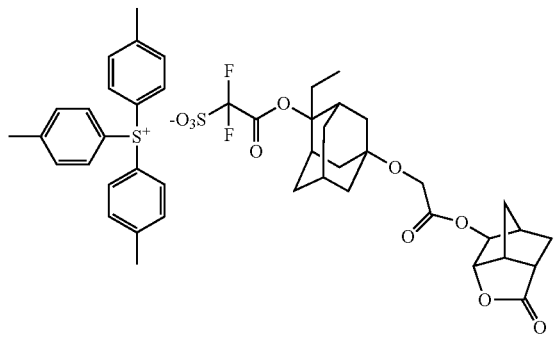
(II-106)
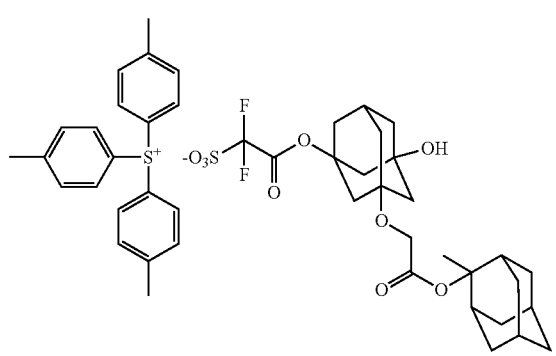
(II-117)
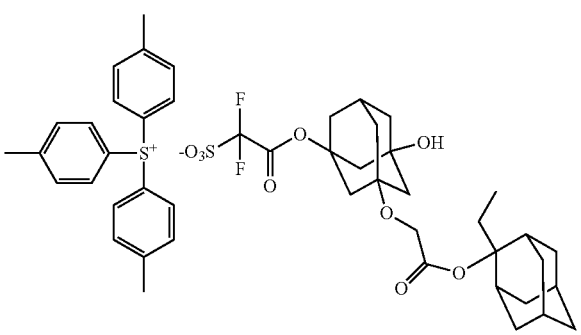
(II-122)
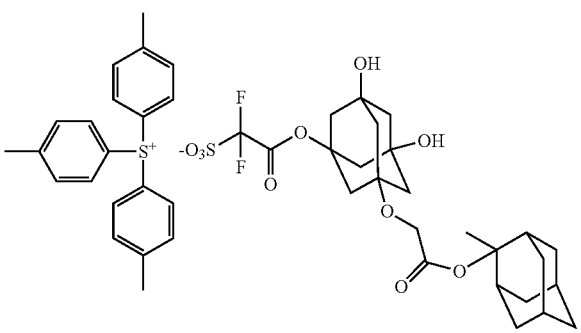

(II-130)
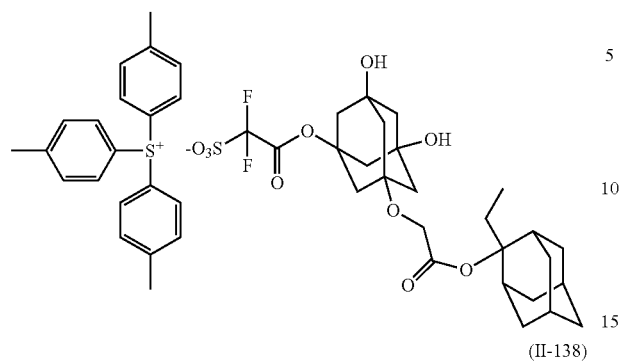
(II-138)
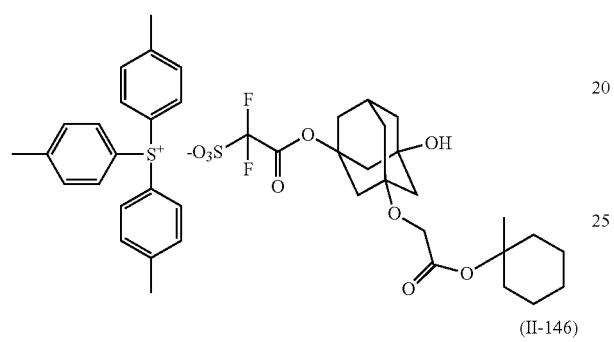
(II-146)
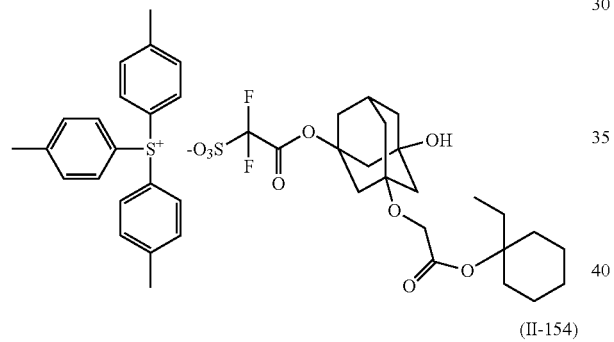
(II-154)
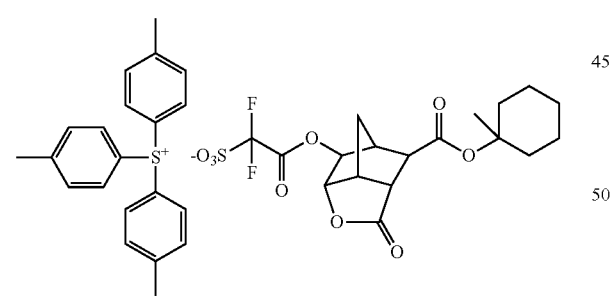
(II-162)
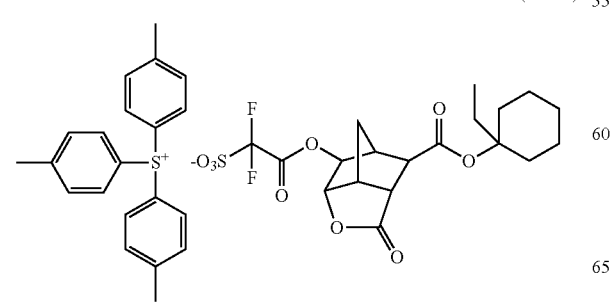
(II-170)
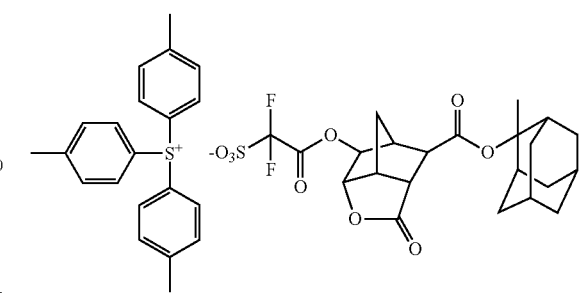
(II-178)
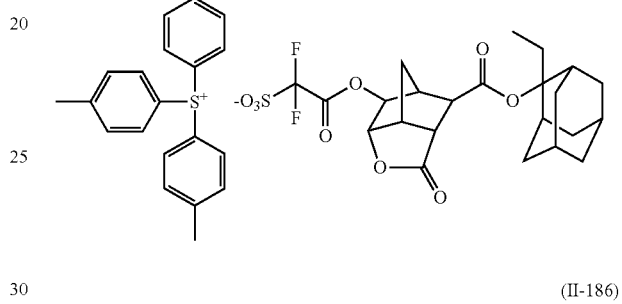
(II-186)
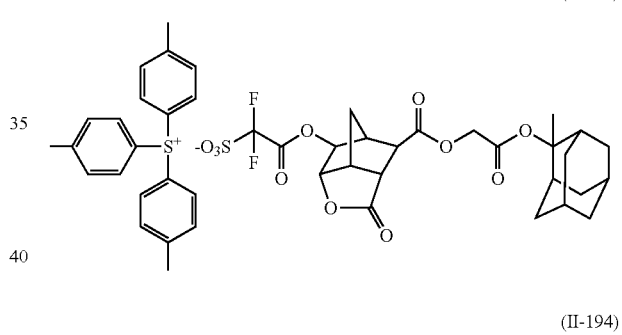
(II-194)
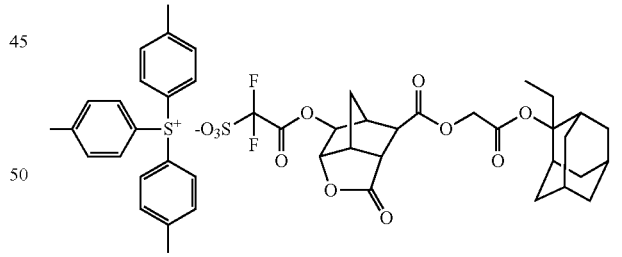
(II-200)
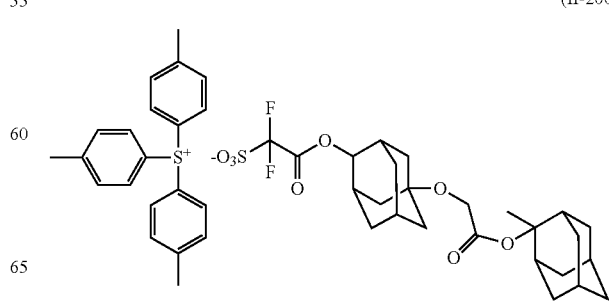

(II-202) 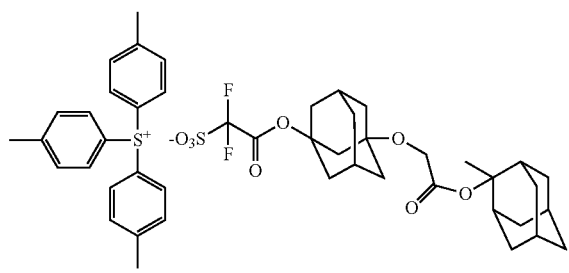
(II-212) 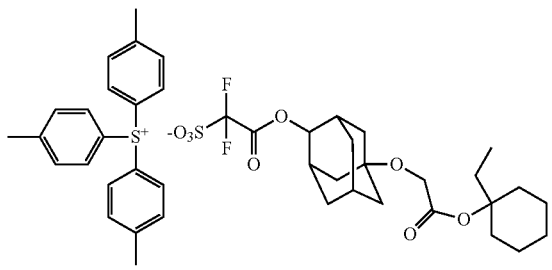
(II-204) 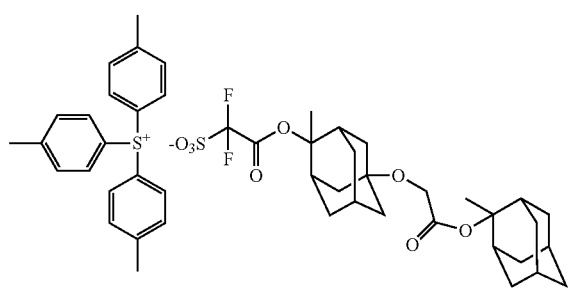
(II-214) 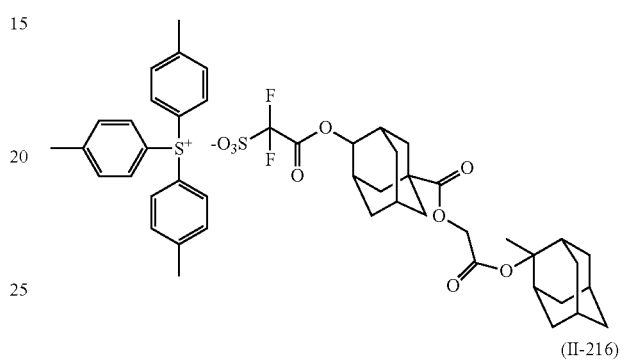
(II-206) 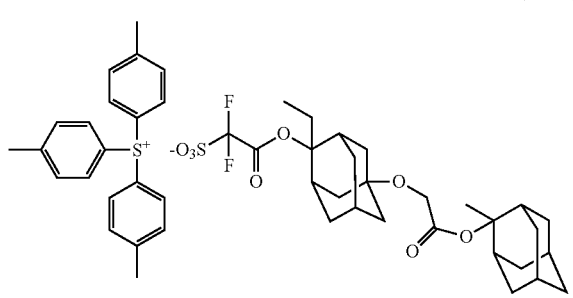
(II-216) 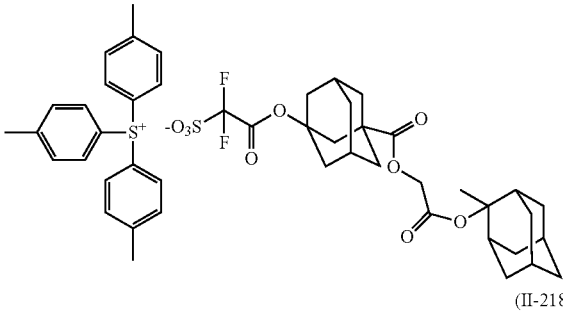
(II-208) 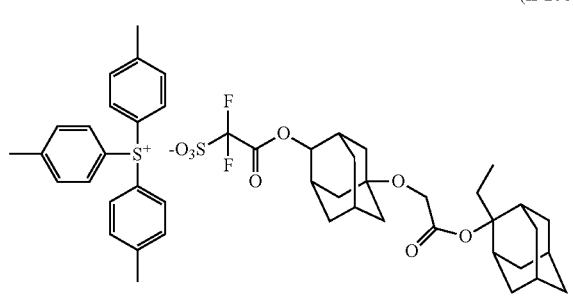
(II-218) 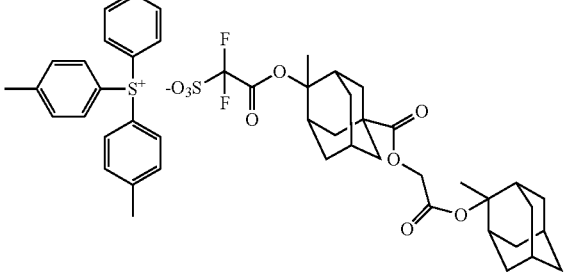
(II-210) 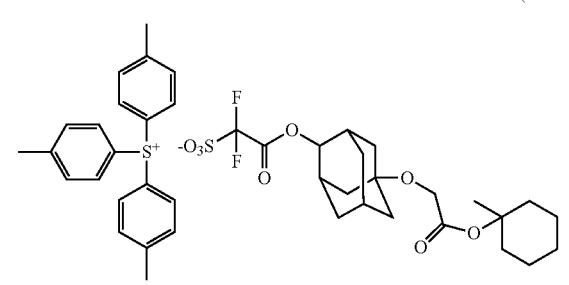
(II-220) 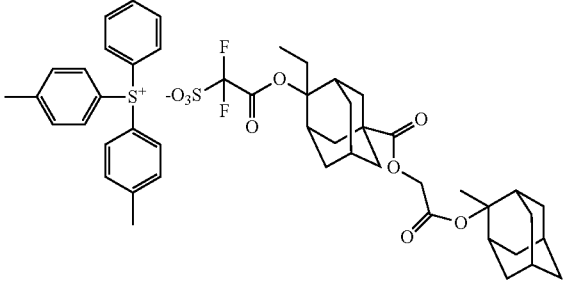

-continued

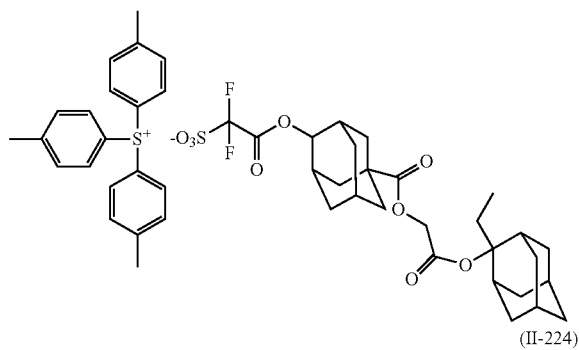
(II-222)

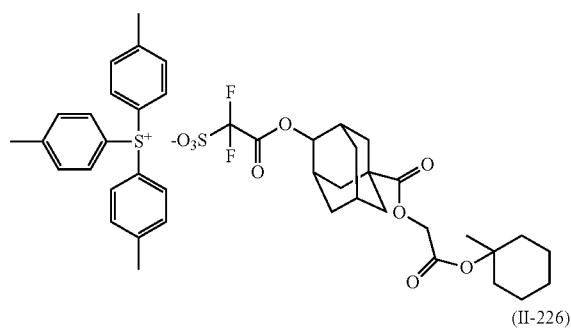
(II-224)

(II-226)

The acid generator (II) can be produced by methods described as or according to below (a) to (f). In the formulae below, the groups such as $R^{21}$, $R^{22}$, $L^{21}$, $R^{24}$, ring $W^{21}$ and the like have the same definition of the above.

(a) A salt represented by the formula (II-1A) in which $L^{21}$ in the formula (II) is a single bond can be produced by reacting a compound represented by the formula (II-1-a) with a compound represented by the formula (II-1-b) in presence of a basic catalyst in a solvent.

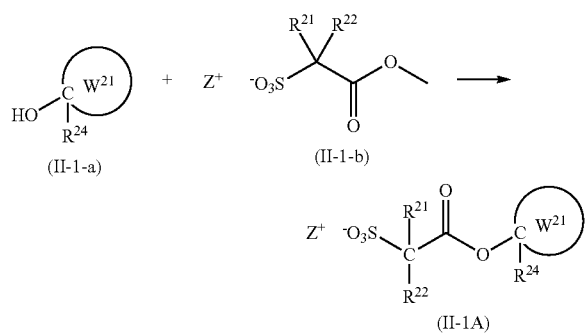
(II-1-a)     (II-1-b)

(II-1A)

Preferred examples of the solvent include chloroform. Preferred examples of the basic catalyst include lithium amide.

The compound (II-1-b) can be produced by a method described in JP2008-13551A.

(b) A salt represented by the formula (II-2A) in which $L^{21}$ in the formula (II) is —CO—O—$CH_2$— can be produced as follows.

A compound represented by the formula (II-2-d) can be obtained by reacting a compound represented by the formula (II-2-a) with a compound represented by the formula (II-2-c) in presence of a basic catalyst in a solvent. Preferred examples of the solvent include tetrahydrofuran. Preferred examples of the basic catalyst include pyridine.

Then, the compound represented by the formula (II-2A) can be obtained by reacting a compound represented by the formula (II-1-b) with a compound represented by the formula (II-2-d) in presence of a basic catalyst in a solvent. Preferred examples of the solvent include chloroform. Preferred examples of the basic catalyst include lithium amide.

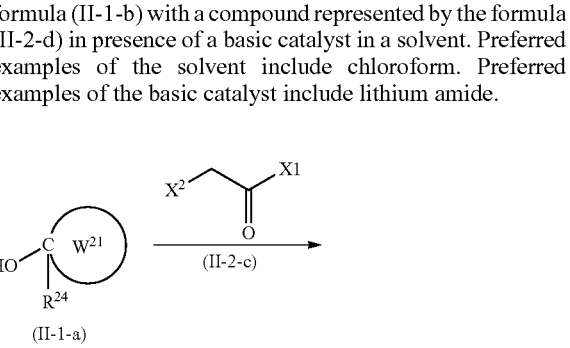
(II-1-a)     (II-2-c)

(II-2 d)     (II-1-b)

(II-2A)

wherein $X^{21}$ and $X^{22}$ independently represent a halogen atom.

Example of the halogen atom is a chlorine atom, a fluorine atom and bromine atom, and chlorine atom is preferable.

(c) A salt represented by the formula (II-3A) in which $L^{21}$ in the formula (II) is a single bond, the substituent of ring $W^{21}$ is a group represented by the formula (II-4) and $L^{23}$ is *—O—$L^7$-CO—O— (* represents a bond to ring $W^{21}$) can be produced as follows.

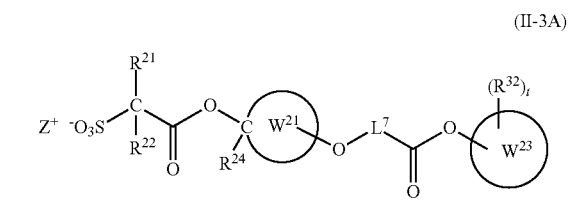
(II-3A)

A compound represented by the formula (b1-c) can be obtained by reacting a compound represented by the formula (b1-a) with a compound represented by the formula (b1-b) in presence of a basic catalyst in a solvent. Preferred examples of the solvent include tetrahydrofuran. Preferred examples of the basic catalyst include pyridine.

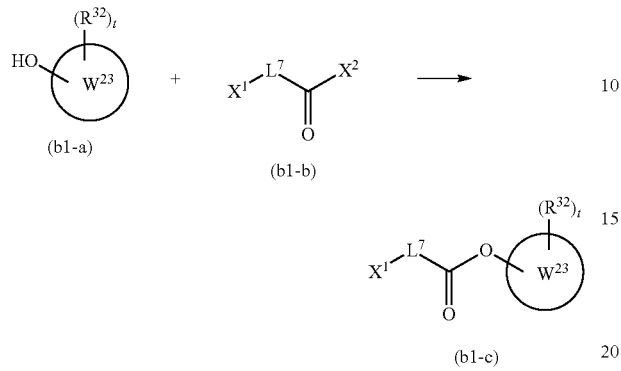

Then, a compound represented by the formula (b1-e) can be obtained by reacting a compound represented by the formula (b1-c) with a compound represented by the formula (b1-d) in presence of a catalyst in a solvent. Preferred examples of the solvent include dimethylformamide. Preferred examples of the catalyst include potassium carbonate and potassium iodide.

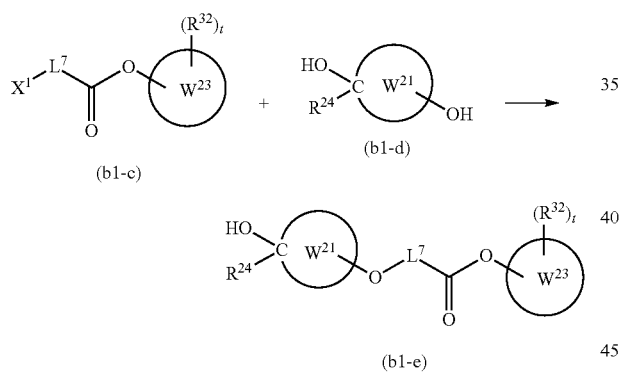

The compound represented by the formula (II-3A) can be obtained by reacting a compound represented by the formula (b1-e) with a salt represented by the formula (b1-f) in presence of a catalyst in a solvent. Preferred examples of the solvent include monochlorobenzene. Preferred examples of the catalyst include sulfuric acid.

The salt represented by the formula (b1-f) can be formed by a method described in JP2008-127367A.

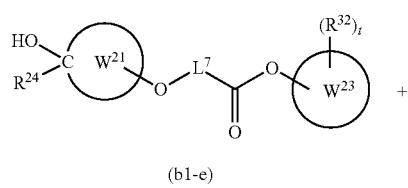

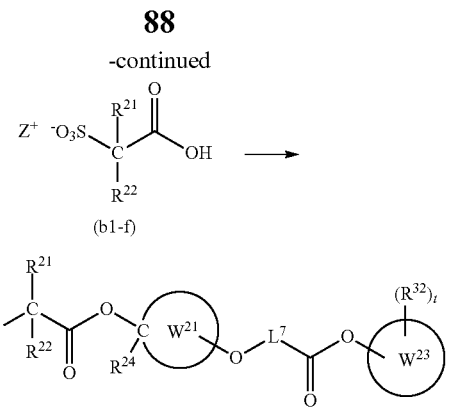

(d) A salt represented by the formula (II-0A) can be produced by the following method.

The salt represented by the formula (II-0A) can be produced by reacting a compound represented by the formula (II-0A-a) with a compound represented by the formula (II-0A-b) in presence of a basic catalyst in a solvent. Preferred examples of the solvent include tetrahydrofuran. Preferred examples of the basic catalyst include pyridine.

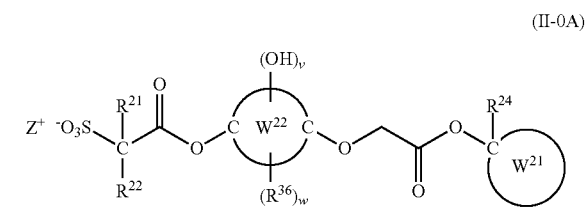

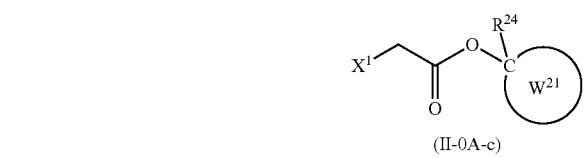

wherein $X^1$ and $X^2$ independently represent a halogen atom.

As the halogen atom, chlorine atom is preferable.

Then, a compound represented by the formula (II-0A-e) can be obtained by reacting a compound represented by the formula (II-0A-c) with a compound represented by the formula (II-0A-d) in presence of a catalyst in a solvent. Preferred examples of the solvent include dimethylformamide. Preferred examples of the catalyst include potassium carbonate and potassium iodide.

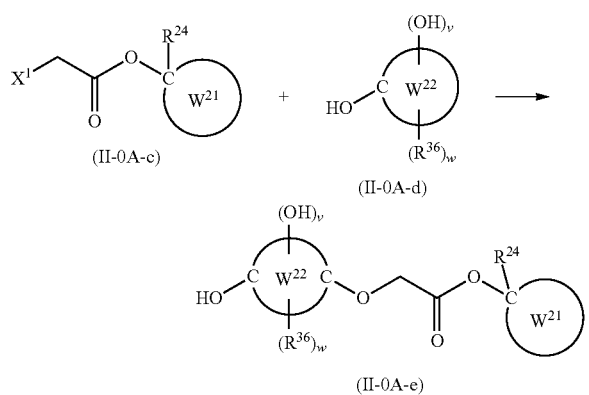

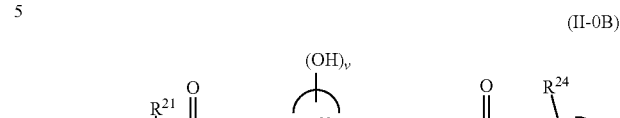

A compound represented by the formula (II-0A-h) can be obtained by reacting a salt represented by the formula (II-0A-f) with a compound represented by the formula (II-0A-g). The salt represented by the formula (II-0A-f) can be obtained by a method described in JP2008-13551A.

(e) A salt represented by the formula (II-0B) can be produced by the following method.

A compound represented by the formula (II-0B-e) can be obtained by reacting a compound represented by the formula (II-0A-c) with a compound represented by the formula (II-0B-d) in presence of a catalyst in a solvent. Preferred examples of the solvent include dimethylformamide. Preferred examples of the catalyst include potassium carbonate and potassium iodide.

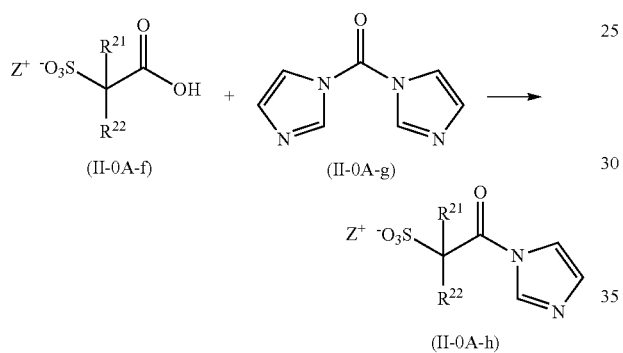

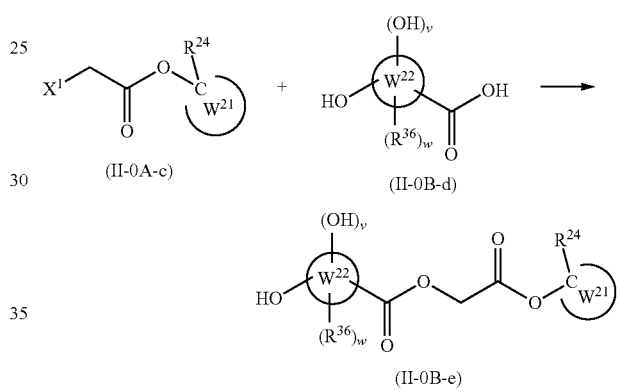

The salt represented by the formula (II-0A) can be obtained by reacting a compound represented by the formula (II-0A-e) with a salt represented by the formula (II-0A-h) in a solvent. Preferred examples of the solvent include acetonitrile.

A compound represented by the formula (II-0B-h) can be obtained by reacting a salt represented by the formula (II-0B-f) with a compound represented by the formula (II-0B-g). The salt represented by the formula (II-0B-f) can be obtained by a method described in JP2008-13551A.

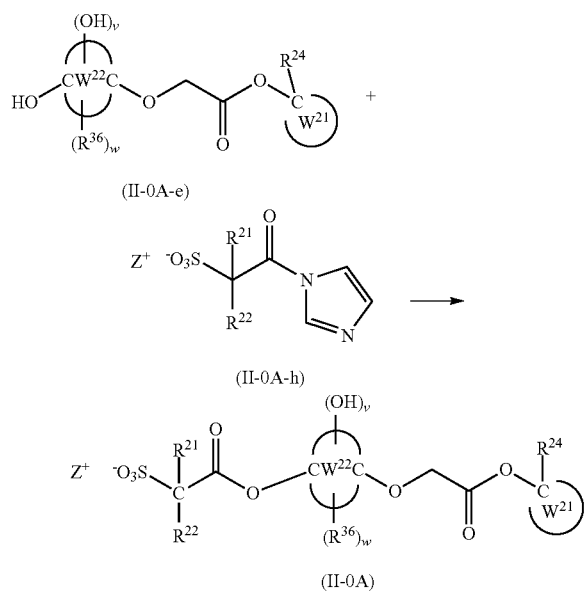

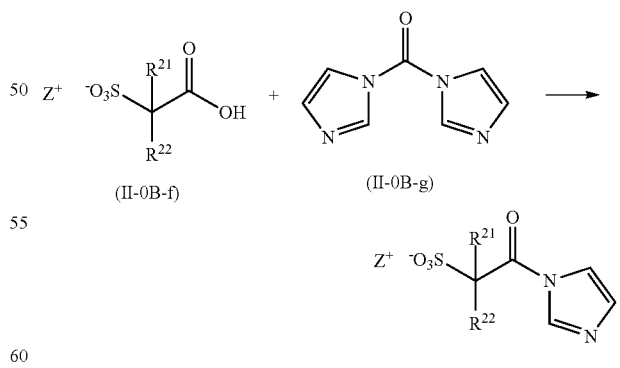

The salt represented by the formula (II-0B) can be obtained by reacting a compound represented by the formula (II-0B-e) with a salt represented by the formula (II-0B-h) in a solvent. Preferred examples of the solvent include acetonitrile.

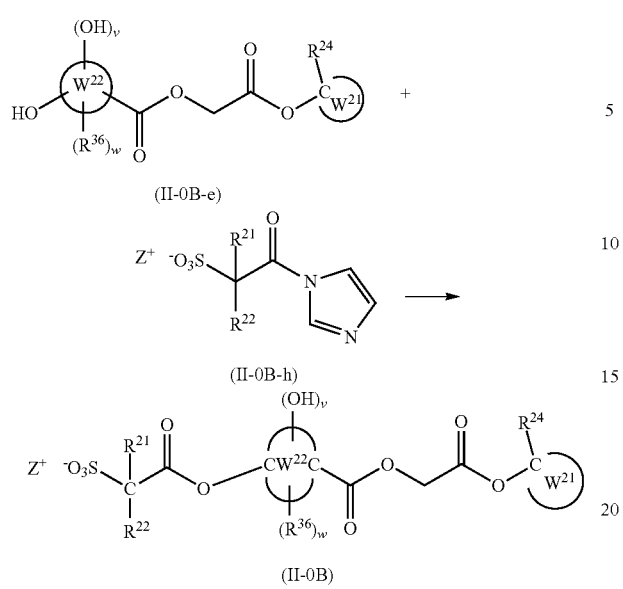

(II-0B-e)

(II-0B-h)

(II-0B)

(f) A salt represented by the formula (II-0C) can be produced by the following method.

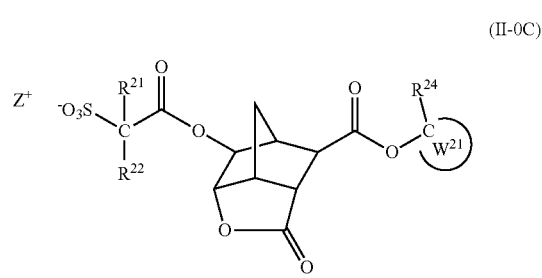

(II-0C)

A compound represented by the formula (II-0C-c) can be obtained by reacting a compound represented by the formula (II-0C-a) with a compound represented by the formula (II-0C-b) in presence of a basic catalyst in a solvent. Preferred examples of the solvent include tetrahydrofuran. Preferred examples of the basic catalyst include dimethylamino pyridine.

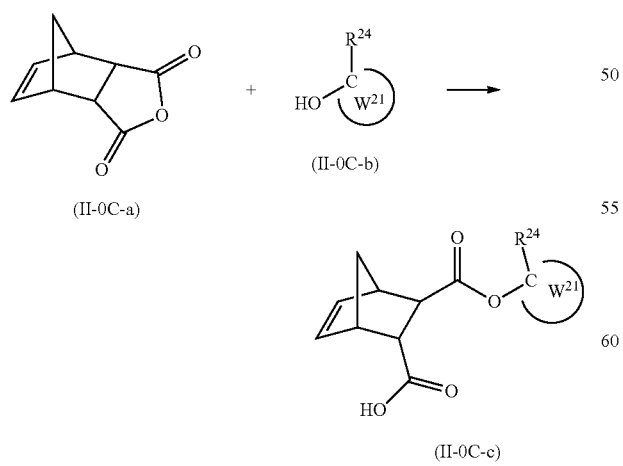

(II-0C-a)

(II-0C-b)

(II-0C-c)

Then, a compound represented by the formula (II-0C-d) can be obtained by intramolecula-reacting a compound represented by the formula (II-0C-c) in presence of a catalyst in a solvent. Preferred examples of the solvent include chloroform. Preferred examples of the catalyst include m-chloroperbenzoic acid.

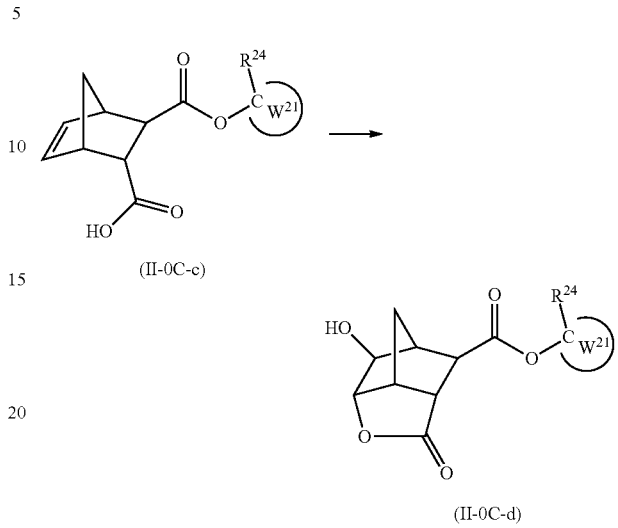

(II-0C-c)

(II-0C-d)

The salt represented by the formula (II-0C) can be obtained by reacting a compound represented by the formula (II-0C-d) with a salt represented by the formula (II-0A-f) in presence of a catalyst in a solvent. Preferred examples of the solvent include chloroform. Preferred examples of the catalyst include lithium amide.

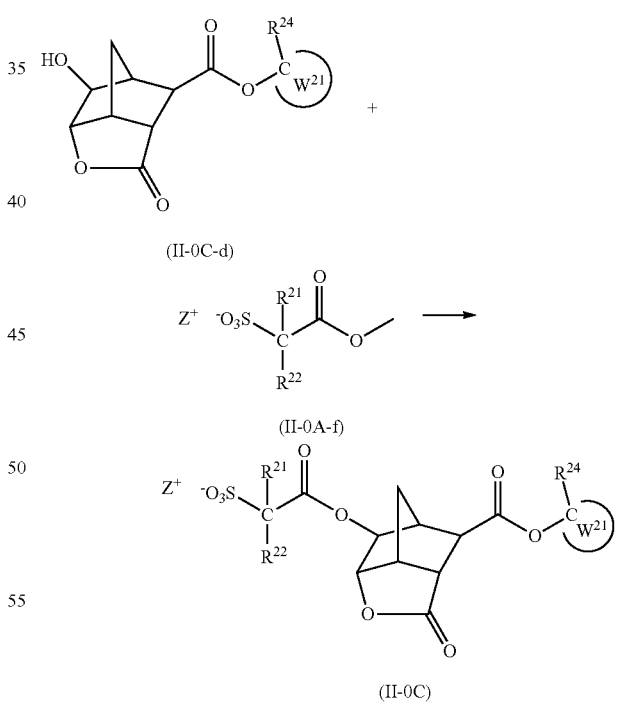

(II-0C-d)

(II-0A-f)

(II-0C)

The group represented by the formula (IIa) described below contained in the acid generator preferably decomposes by the action of the acid and occurs a carboxylic acid.

The acid generator having the group represented by the formula (IIa) can be determined if the group represented by the formula (IIa) decomposes by the action of the acid and converts into an alkali-soluble group, by dissolving the acid generator having the group represented by the formula (IIa) in a solvent, adding an acid to thus obtained solution, and heating it. When decomposition occurs, the group represented by the formula (IIa) converts a carboxylic acid and a vinyl compound. Preferred examples of the solvent include dimethylformamide. Preferred examples of the acid include hydrochloride.

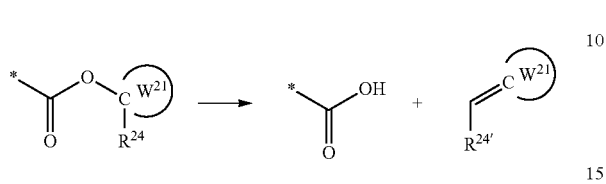

wherein $R^{24}$ and ring $W^1$ have the same definition of the above, $R^{24'}$ represents a hydrogen atom or a $C_1$ to $C_{11}$ hydrocarbon group.

The acid generator (II) may be used as a single salt or as a combination of two or more salts.

<Other Acid Generator>

The resist composition of the present invention may include one or more known salt for the acid generator other than the acid generator (II) (hereinafter may be referred to as "acid generator (B)"). Examples of acid generator (B) which include the organic cation contained in the acid generator (II) and a known anion (an anion other than the sulfonic anion contained in the acid generator (II)) and a salt which include the sulfonic anion contained in the acid generator (II) and a known cation (a cation other that the cation contained in the acid generator (II).

Examples of the acid generator (B) include salts represented by the formula (B1-1) to the formula (B1-20). Among these, a salt which contains triphenyl sulfonium cation or tritolyl sulfonium cation are preferable, salts represented by the formulae (B1-1), (B1-2), (B1-3), (B1-6), (B1-7), (B1-11), (B1-12), (B1-13) and (B1-14) are more preferable.

(B1-1)

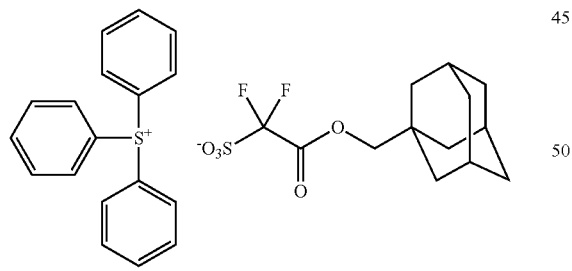

(B1-2)

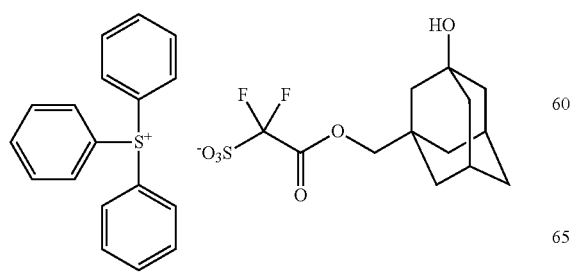

(B1-3)

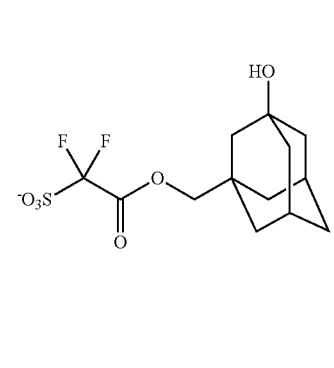

(B1-4)

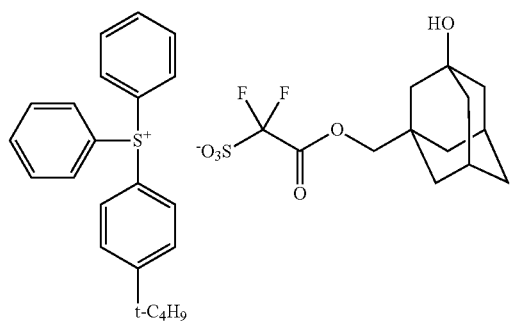

(B1-5)

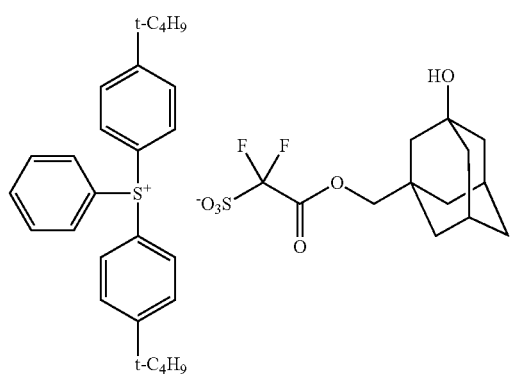

(B1-6)

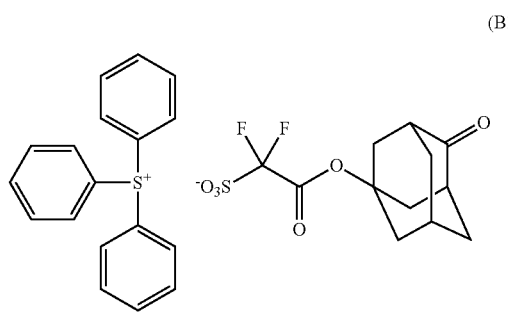

(B1-7) 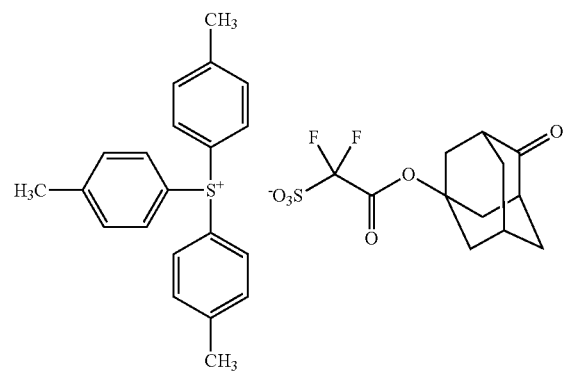
(B1-8)
(B1-9)
(B1-10)
(B1-11) 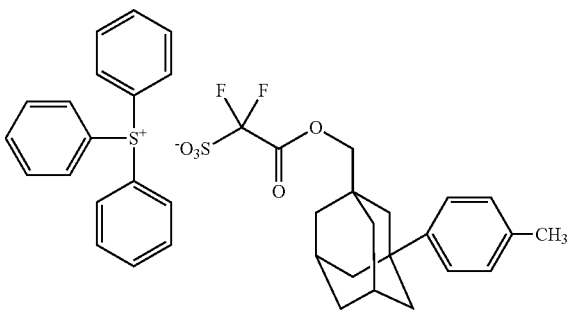
(B1-12) 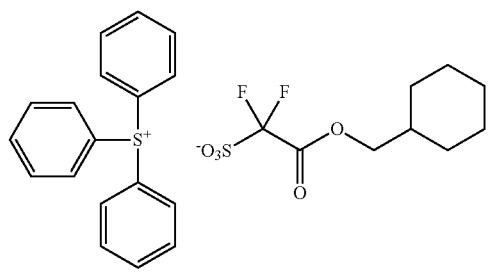
(B1-13) 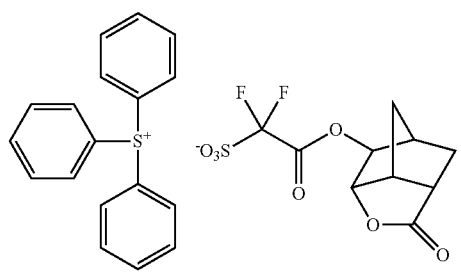
(B1-14) 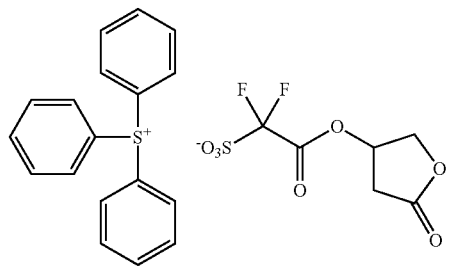
(B1-15) 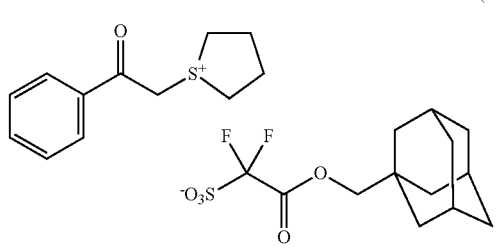

-continued (B1-16)
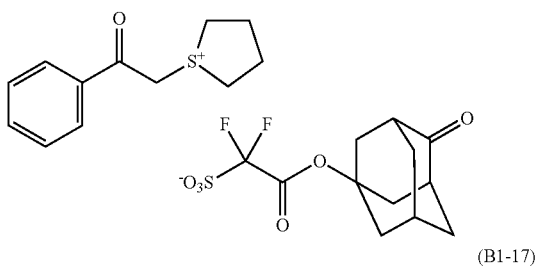

(B1-17)

(B1-18)
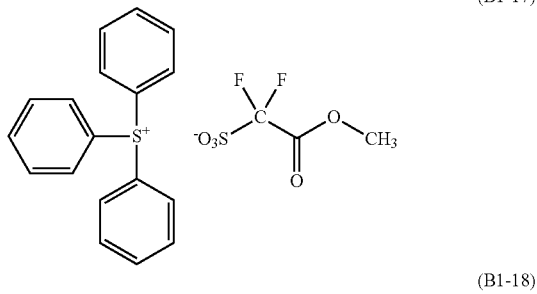

(B1-19)
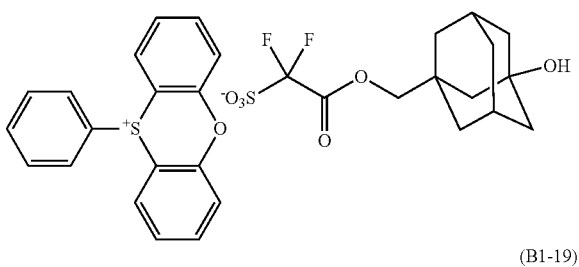

(B1-20)
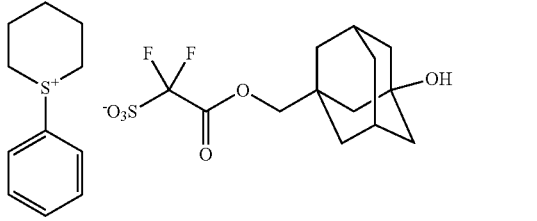

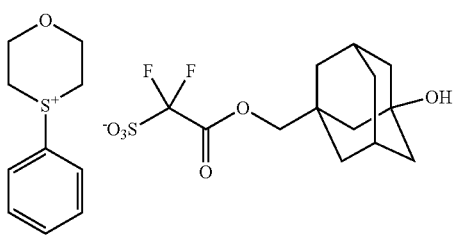

In the resist composition of the present invention, the acid generator (B) may be used as a single compound or as a combination of two or more compounds.

In the resist composition of the present invention, the proportion of the acid generator (II) is preferably not less than 1 weight % (and more preferably not less than 3 weight %), and not more than 40 weight % (and more preferably not more than 35 weight %), with respect to the resin (A2).

When the resist composition of the present invention contains the acid generator (II) and the acid generator (B), the total proportion of the acid generator (II) and the acid generator (B) is preferably not less than 1 weight % (and more preferably not less than 3 weight %), and not more than 40 weight % (and more preferably not more than 35 weight %, with respect to the resin (A2). In this case, the weight ratio of the acid generator (II) and the acid generator (B) is preferably, for example, 5:95 to 95:5, more preferably 10:90 to 90:10 and still more preferably 15:85 to 85:15.

<Solvent (E)>

The resist composition of the present invention preferably includes a solvent (E). The proportion of the solvent (E) 90 weight % or more, preferably 92 weight % or more, and more preferably 94 weight % or more, and also preferably 99.9 weight % or less and more preferably 99 weight % or less. The proportion of the solvent (E) can be measured with a known analytical method such as, for example, liquid chromatography and gas chromatography.

Examples of the solvent (E) include glycol ether esters such as ethylcellosolve acetate, methylcellosolve acetate and propylene glycol monomethyl ether acetate; glycol ethers such as propylene glycol monomethyl ether; ethers such as diethylene glycol dimethyl ether; esters such as ethyl lactate, butyl acetate, amyl acetate and ethyl pyruvate; ketones such as acetone, methyl isobutyl ketone, 2-heptanone and cyclohexanone; and cyclic esters such as γ-butyrolactone. These solvents may be used as a single solvent or as a mixture of two or more solvents.

<Basic Compound (C)>

The resist composition of the present invention may contain a basic compound (C). The basic compound (C) is a compound having a property to quench an acid, in particular, generated from the acid generator (B), and called "quencher".

As the basic compounds (C), nitrogen-containing basic compounds (for example, amine and basic ammonium salt) are preferable. The amine may be an aliphatic amine or an aromatic amine. The aliphatic amine includes any of a primary amine, secondary amine and tertiary amine. The aromatic amine includes an amine in which an amino group is bonded to an aromatic ring such as aniline, and a heteroaromatic amine such as pyridine.

Preferred basic compounds (C) include compounds presented by the formula (C1) to the formula (C8) and the formula (C1-1) as described below. Among these, the basic compound presented by the formula (C1-1) is more preferable.

(C1)

wherein $R^{c1}$, $R^{c2}$ and $R^{c3}$ independently represent a hydrogen atom, a $C_1$ to $C_6$ alkyl group, $C_5$ to $C_{10}$ alicyclic hydrocarbon group or a $C_6$ to $C_{10}$ aromatic hydrocarbon group, one or more hydrogen atom contained in the alkyl group and alicyclic hydrocarbon group may be replaced by a hydroxy group, an amino group or a $C_1$ to $C_6$ alkoxyl group, one or more hydrogen atom contained in the aromatic hydrocarbon group may be replaced by a $C_1$ to $C_6$ alkyl group, a $C_1$ to $C_6$ alkoxyl group, a $C_5$ to $C_{10}$ alicyclic hydrocarbon group or a $C_6$ to $C_{10}$ aromatic hydrocarbon group.

(C1-1)
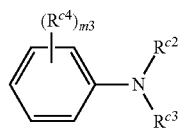

wherein $R^{c2}$ and $R^{c3}$ have the same definition of the above;

$R^{c4}$ in each occurrence represents a $C_1$ to $C_6$ alkyl group, a $C_1$ to $C_6$ alkoxyl group, a $C_5$ to $C_{10}$ alicyclic hydrocarbon group or a $C_6$ to $C_{10}$ aromatic hydrocarbon group;

m3 represents an integer 0 to 3.

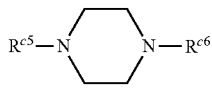

(C2)

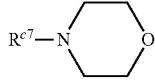

(C3)

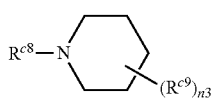

(C4)

wherein $R^{c5}$, $R^{c6}$, $R^{c7}$ and $R^{c8}$ independently represent the any of the group as described in $R^{c1}$ of the above;

$R^{c9}$ in each occurrence independently represents a $C_1$ to $C_6$ alkyl group, a $C_3$ to $C_6$ alicyclic hydrocarbon group or a $C_2$ to $C_6$ alkanoyl group;

n3 represents an integer of 0 to 8.

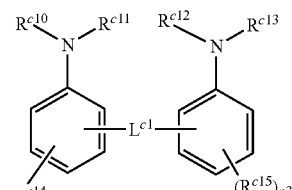

(C5)

(C6)

wherein $R^{c10}$, $R^{c11}$, $R^{c12}$, $R^{c13}$ and $R^{c16}$ independently represent the any of the groups as described in $R^{c1}$;

$R^{c14}$, $R^{c15}$ and $R^{c17}$ in each occurrence independently represent the any of the groups as described in $R^{c4}$;

o3 and p3 represent an integer of 0 to 3;

$L^{c1}$ represents a divalent $C_1$ to $C_6$ alkanediyl group, —CO—, —C(=NH)—, —S— or a combination thereof.

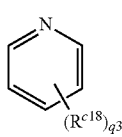

(C7)

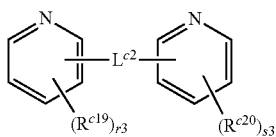

(C8)

wherein $R^{c18}$, $R^{c19}$ and $R^{c20}$ in each occurrence independently represent the any of the groups as described in $R^{c4}$;

q3, r3 and s3 represent an integer of 0 to 3;

$L^{c2}$ represents a single bond, a $C_1$ to $C_6$ alkanediyl group, —CO—, —C(=NH)—, —S— or a combination thereof.

In the formula (C1) to the formula (C8) and the formula (C1-1), the alkyl, alicyclic hydrocarbon, aromatic, alkoxy and alkanediyl groups include the same examples as the above.

Examples of the alkanoyl group include acetyl, 2-methyl acetyl, 2,2-dimethyl acetyl, propionyl, butyryl, isobutyryl, pentanoyl and 2,2-dimethyl propionyl groups.

Specific examples of the amine represented by the formula (C1) include 1-naphtylamine, 2-naphtylamine, aniline, diisopropylaniline, 2-, 3- or 4-methylaniline, 4-nitroaniline, N-methylaniline, N,N-dimethylaniline, diphenylamine, hexylamine, heptylamine, octylamine, nonylamine, decylamine, dibutylamine, dipentylamine, dihexylamine, diheptylamine, dioctylamine, dinonylamine, didecylamine, triethylamine, trimethylamine, tripropylamine, tributylamine, tripentylamine, trihexylamine, triheptylamine, trioctylamine, trinonylamine, tridecylamine, methyldibutylamine, methyldipentylamine, methyldihexylamine, methyldicyclohexylamine, methyldiheptylamine, methyldioctylamine, methyldinonylamine, methyldidecylamine, ethyldibutylamine, ethyldipentylamine, ethyldihexylamine, ethyldiheptylamine, ethyldioctylamine, ethyldinonylamine, ethyldidecylamine, dicyclohexylmethylamine, tris[2-(2-methoxyethoxy)ethyl] amine, triisopropanolamine, ethylene diamine, tetramethylene diamine, hexamethylene diamine, 4,4'-diamino-1,2-diphenylethane, 4,4'-diamino-3,3'-dimethyldiphenylmethane and 4,4'-diamino-3,3'-diethyldiphenylmethane.

Among these, diisopropylaniline is preferable, particularly 2,6-diisopropylaniline is more preferable as the basic compounds (C) contained in the present resist composition.

Specific examples of the compound represented by the formula (C2) include, for example, piperazine.

Specific examples of the compound represented by the formula (C3) include, for example, morpholine.

Specific examples of the compound represented by the formula (C4) include, for example, piperidine, a hindered amine compound having piperidine skeleton described in JP H11-52575-A.

Specific examples of the compound represented by the formula (C5) include, for example, 2,2'-methylenebisaniline.

Specific examples of the compound represented by the formula (C6) include, for example, imidazole and 4-methylimidazole.

Specific examples of the compound represented by the formula (C7) include, for example, pyridine and 4-methylpyridine.

Specific examples of the compound represented by the formula (C8) include, for example, 1,2-di(2-pyridyl)ethane, 1,2-di(4-pyridyl)ethane, 1,2-di(2-pyridyl)ethene, 1,2-di(4-pyridyl)ethene, 1,3-di(4-pyridyl)propane, 1,2-di(4-pyridyloxy)ethane, di(2-pyridyl)ketone, 4,4'-dipyridyl sulfide, 4,4'-dipyridyl disulfide, 2,2'-dipyridylamine, 2,2'-dipicolylamine and bipyridine.

Examples of the ammonium salt include tetramethylammonium hydroxide, tetraisopropylammonium hydroxide, tetrabutylammonium hydroxide, tetrahexylammonium hydroxide, tetraoctylammonium hydroxide, phenyltrimethyl ammonium hydroxide, 3-(trifluoromethyl)phenyl trimethylammonium hydroxide, tetra-n-butyl ammonium salicylate and choline.

The proportion of the basic compound (C) is preferably 0.01 to 5 weight %, more preferably 0.01 to 3 weight %, and still more preferably 0.01 to 1 weight % with respect to the total solid proportion of the resist composition.

<Other Ingredient (Hereinafter is Sometimes Referred to as "Other Ingredient (F)")>

The resist composition can also include small amounts of various known additives such as sensitizers, dissolution inhibitors, surfactants, stabilizers, and dyes, as needed.

<Preparing the Resist Composition>

The present resist composition can be prepared by mixing the resin (A1), the resin (A2) and the acid generator (II), and the basic compound (C), the solvent (E), the acid generator (B) and the other ingredient (F) as needed. There is no particular limitation on the order of mixing. The mixing may be performed in an arbitrary order. The temperature of mixing may be adjusted to an appropriate temperature within the range of 10 to 40° C., depending on the kinds of the resin and solubility in the solvent (E) of the resin. The time of mixing may be adjusted to an appropriate time within the range of 0.5 to 24 hours, depending on the mixing temperature. There is no particular limitation to the tool for mixing. An agitation mixing may be adopted.

After mixing the above ingredients, the present resist compositions can be prepared by filtering the mixture through a filter having about 0.003 to 0.2 µm pore diameter.

<Method for Producing a Resist Pattern>

The method for producing a resist pattern of the present invention includes the steps of:

(1) applying the resist composition of the present invention onto a substrate;
(2) drying the applied composition to form a composition layer;
(3) exposing the composition layer;
(4) heating the exposed composition layer, and
(5) developing the heated composition layer.

Applying the resist composition onto the substrate can generally be carried out through the use of a resist application device, such as a spin coater known in the field of semiconductor microfabrication technique.

Drying the applied composition layer, for example, can be carried out using a heating device such as a hotplate (so-called "prebake"), a decompression device, or a combination thereof. Thus, the solvent evaporates from the resist composition and a composition layer with the solvent removed is formed. The condition of the heating device or the decompression device can be adjusted depending on the kinds of the solvent used. The temperature in this case is generally within the range of 50 to 200° C. Moreover, the pressure is generally within the range of 1 to $1.0 \times 10^5$ Pa.

The composition layer thus obtained is generally exposed using an exposure apparatus or a liquid immersion exposure apparatus. The exposure is generally carried out through a mask that corresponds to the desired pattern. Various types of exposure light source can be used, such as irradiation with ultraviolet lasers such as KrF excimer laser (wavelength: 248 nm), ArF excimer laser (wavelength: 193 nm), F2 excimer laser (wavelength: 157 nm), or irradiation with far-ultraviolet wavelength-converted laser light from a solid-state laser source (YAG or semiconductor laser or the like), or vacuum ultraviolet harmonic laser light or the like. Also, the exposure device may be one which irradiates electron beam or extreme-ultraviolet light (EUV).

After exposure, the composition layer is subjected to a heat treatment (so-called "post-exposure bake") to promote the deprotection reaction. The heat treatment can be carried out using a heating device such as a hotplate. The heating temperature is generally in the range of 50 to 200° C., preferably in the range of 70 to 150° C.

The composition layer is developed after the heat treatment, generally with an alkaline developing solution and using a developing apparatus. The development here means to bring the composition layer after the heat treatment into contact with an alkaline solution. Thus, the exposed portion of the composition layer is dissolved by the alkaline solution and removed, and the unexposed portion of the composition layer remains on the substrate, whereby producing a resist pattern. Here, as the alkaline developing solution, various types of aqueous alkaline solutions used in this field can be used. Examples include aqueous solutions of tetramethylammonium hydroxide and (2-hydroxyethyl)trimethylammonium hydroxide (common name: choline).

After the development, it is preferable to rinse the substrate and the pattern with ultrapure water and to remove any residual water thereon.

<Application>

The resist composition of the present invention is useful as the resist composition for excimer laser lithography such as with ArF, KrF or the like, and the resist composition for electron beam (EB) exposure lithography and extreme-ultraviolet (EUV) exposure lithography, as well as liquid immersion exposure lithography.

The resist composition of the present invention can be used in semiconductor microfabrication and in manufacture of liquid crystals, thermal print heads for circuit boards and the like, and furthermore in other photofabrication processes, which can be suitably used in a wide range of applications.

EXAMPLES

The present invention will be described more specifically by way of examples, which are not construed to limit the scope of the present invention.

All percentages and parts expressing the content or amounts used in the Examples and Comparative Examples are based on weight, unless otherwise specified.

The structure of a compound is measured by MASS (LC: manufactured by Agilent, 1100 type, MASS: manufactured by Agilent, LC/MSD type or LC/MSD TOF type).

The weight average molecular weight is a value determined by gel permeation chromatography.

Apparatus: HLC-8120GPCtype (Tosoh Co. Ltd.)
Column: TSK gel Multipore HXL-M×3+guardcolumn (Tosoh Co. Ltd.)
Eluant: tetrahydrofuran
Flow rate: 1.0 mL/min
Detecting device: RI detector
Column temperature: 40° C.
Injection amount: 100 µL
Standard material for calculating molecular weight: standard polystylene (Toso Co. ltd.)

Synthesis Example 1

Synthesis of Compound Represented by the Formula (A)

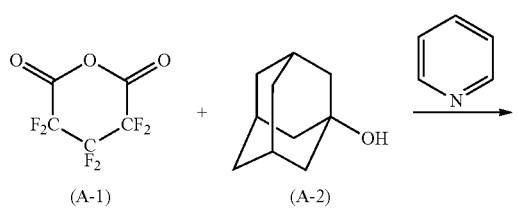

(A-1)    (A-2)

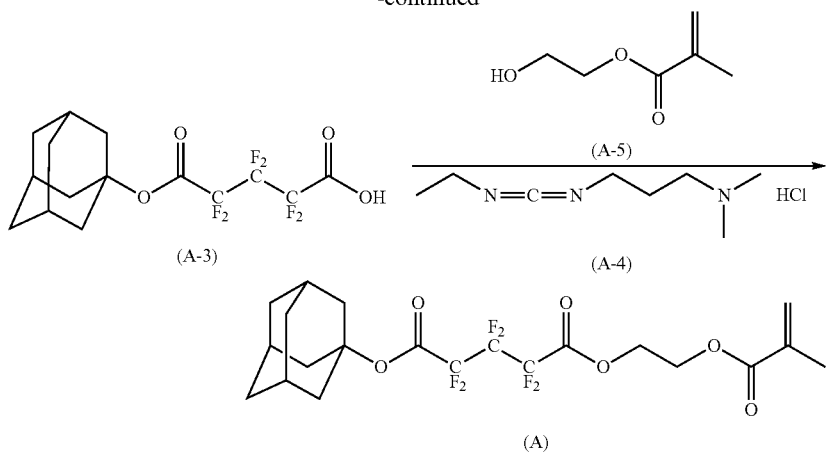

9.60 parts of a compound (A-2), 38.40 parts of tetrahydrofuran and 5.99 parts of pyridine were mixed, and stirred for 30 minutes at 23° C. The obtained mixture was cooled to 0° C. To this mixture, 14.00 parts of a compound (A-1) was added over 1 hour while maintaining at the same temperature. The temperature of the mixture was then elevated to about 10° C., and the mixture was stirred for 1 hour at the same temperature. To the obtained reactant including a compound (A-3), 14.51 parts of a compound of (A-4), 1-(3-dimethylaminopropyl)-3-ethyl carbodiimide hydrochloride, and 8.20 parts of a compound of (A-5) were added, and stirred for 3 hours at 23° C. 271.95 parts of ethyl acetate and 16.57 parts of 5% of hydrochloric acid solution were added to the obtained mixture, the mixture was stirred for 30 minutes at 23° C. The obtained solution was allowed to stand, and then separated to recover an organic layer. To the recovered organic layer, 63.64 parts of a saturated sodium hydrogen carbonate was added, and the obtained solution was stirred for 30 minutes at 23° C., allowed to stand, and then separated to wash the organic layer. These washing operations were repeated for 2 times. To the washed organic layer, 67.99 parts of ion-exchanged water was added, and the obtained solution was stirred for 30 minutes at 23° C., allowed to stand, and then separated to wash the organic layer with water. These washing operations were repeated for 5 times. The obtained organic layer was concentrated, to the obtained concentrate, 107.71 parts of ethyl acetate was added, stirred to dissolve the concentrate completely, and 64.26 parts of n-heptane was added in the form of drops to this. After addition, the obtained mixture was stirred for 30 minutes at 23° C., and filtrated, resulting in 15.11 parts of the compound (A).

MS (mass spectroscopy): 486.2 (molecular ion peak)

Synthesis Example 2

Synthesis of Compound Represented by the Formula (B)

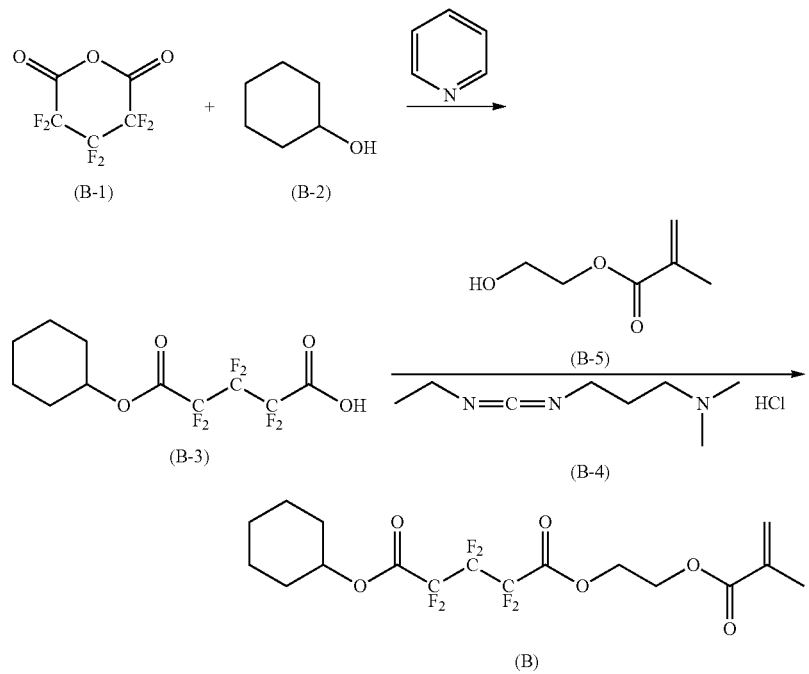

6.32 parts of a compound (B-2), 30.00 parts of tetrahydrofuran and 5.99 parts of pyridine were mixed, and stirred for 30 minutes at 23° C. The obtained mixture was cooled to 0° C. To this mixture, 14.00 parts of a compound (B-1) was added over 1 hour while maintaining at the same temperature. The temperature of the mixture was then elevated to about 10° C., and the mixture was stirred for 1 hour at the same temperature. To the obtained reactant including a compound (B-3), 14.51 parts of a compound of (B-4), 1-(3-dimethylaminopropyl)-3-ethyl carbodiimide hydrochloride, and 8.20 parts of a compound of (B-5) were added, and stirred for 3 hours at 23° C. 270.00 parts of ethyl acetate and 16.57 parts of 5% of hydrochloric acid solution were added to the obtained mixture, the mixture was stirred for 30 minutes at 23° C. The obtained solution was allowed to stand, and then separated to recover an organic layer. To the recovered organic layer, 65.00 parts of a saturated sodium hydrogen carbonate was added, and the obtained solution was stirred for 30 minutes at 23° C., allowed to stand, and then separated to wash the organic layer. These washing operations were repeated for 2 times. To the washed organic layer was added 65.00 parts of ion-exchanged water, and the obtained solution was stirred for 30 minutes at 23° C., allowed to stand, and then separated to wash the organic layer with water. These washing operations were repeated for 5 times. The obtained organic layer was concentrated, to the obtained concentrate, and separated by a column (condition; stationary phase: silica gel 60-200 mesh manufactured by Merk, developing solvent: n-heptane/ethyl acetate), resulting in 9.90 parts of the compound (B).

MS (mass spectroscopy): 434.1 (molecular ion peak)

Synthesis Example 3

Synthesis of Compound Represented by the Formula (C)

7.08 parts of a compound (C-2), 30.00 parts of tetrahydrofuran and 5.99 parts of pyridine were mixed, and stirred for 30 minutes at 23° C. The obtained mixture was cooled to 0° C. To this mixture, 14.00 parts of a compound (C-1) was added over 1 hour while maintaining at the same temperature. The temperature of the mixture was then elevated to about 10° C., and the mixture was stirred for 1 hour at the same temperature. To the obtained reactant including a compound (C-3), 14.51 parts of a compound of (C-4), 1-(3-dimethylaminopropyl)-3-ethyl carbodiimide hydrochloride, and 8.20 parts of a compound of (C-5) were added, and stirred for 3 hours at 23° C. 270.00 parts of ethyl acetate and 16.57 parts of 5% of hydrochloric acid solution were added to the obtained mixture, the mixture was stirred for 30 minutes at 23° C. The obtained solution was allowed to stand, and then separated to recover an organic layer. To the recovered organic layer, 65.00 parts of a saturated sodium hydrogen carbonate was added, and the obtained solution was stirred for 30 minutes at 23° C., allowed to stand, and then separated to wash the organic layer. These washing operations were repeated for 2 times. To the washed organic layer was added 65.00 parts of ion-exchanged water, and the obtained solution was stirred for 30 minutes at 23° C., allowed to stand, and then separated to wash the organic layer with water. These washing operations were repeated for 5 times. The obtained organic layer was concentrated, to the obtained concentrate, and separated by a column (condition; stationary phase: silica gel 60-200 mesh manufactured by Merk, developing solvent: n-heptane/ethyl acetate), resulting in 10.24 parts of the compound (C).

MS (mass spectroscopy): 446.1 (molecular ion peak)

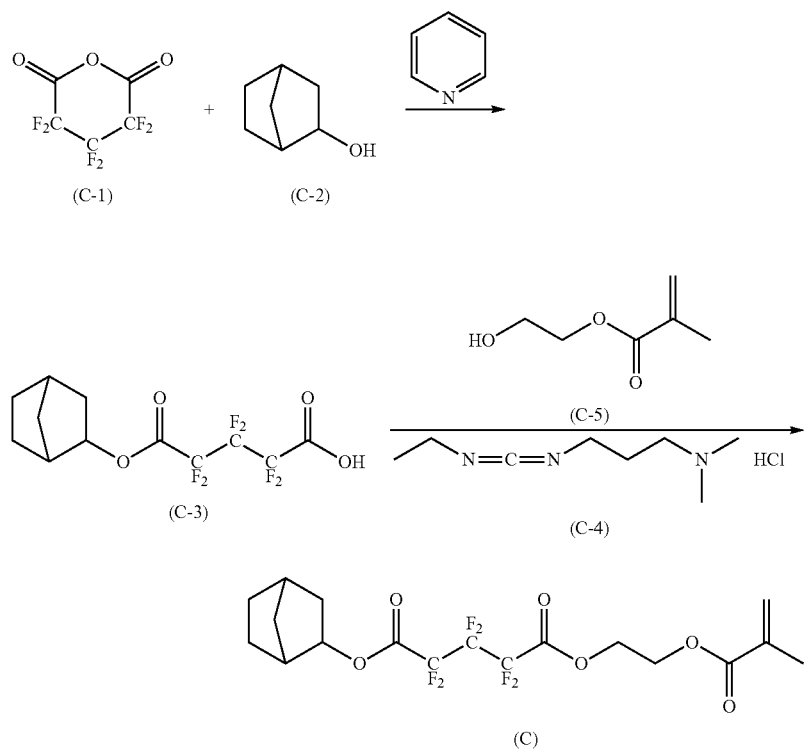

Synthesis Example 4

Synthesis of Compound Represented by the Formula (E)

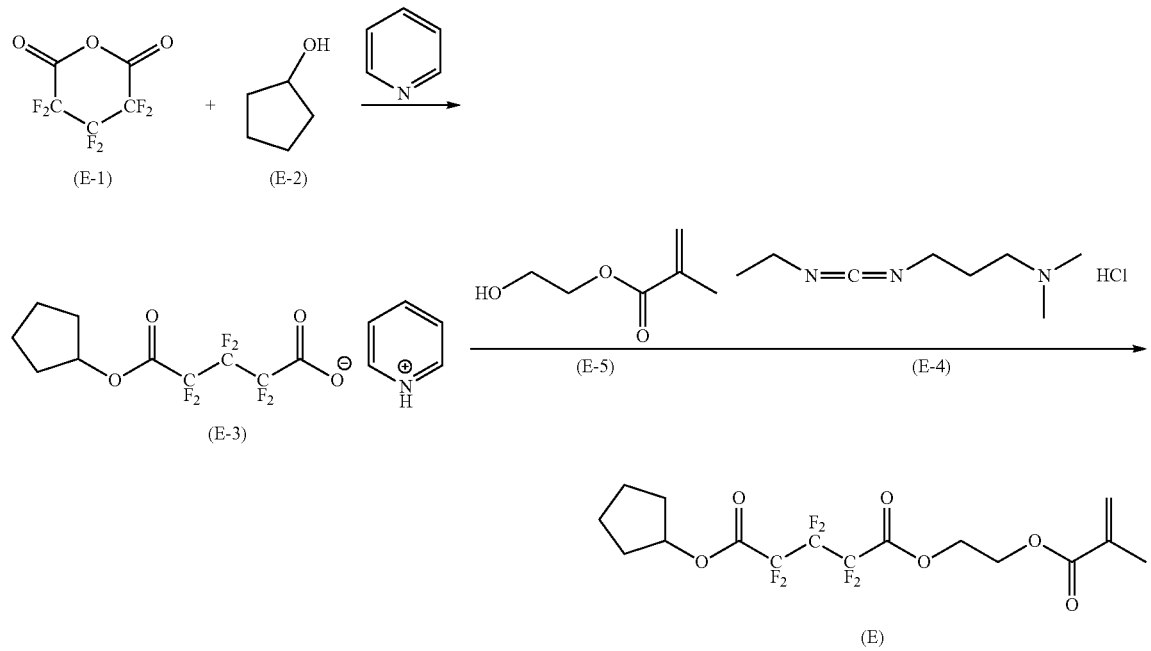

25 parts of a compound (E-1) and 25 parts of tetrahydrofuran were mixed, and stirred for 30 minutes at 23° C. The obtained mixture was cooled to 0° C. To this mixture, 10.2 parts of a compound (E-2), 11.2 parts of pyridine and 30 parts of tetrahydrofuran were added over 1 hour while maintaining at the same temperature. The temperature of the mixture was then elevated to about 25° C., and the mixture was stirred for 1 hour at the same temperature. To the obtained reactant, 200 parts of ethyl acetate and 50 parts of ion-exchanged-water were added, stirred, and then separated to recover an organic layer. The obtained organic layer was concentrated, to this concentrate, 500 parts of n-heptane was added to obtain a solution, and the solution was stirred and filtrated, resulting in 40.18 parts of a compound (E-3). 35.21 parts of the compound (E-3), 160 parts of tetrahydrofuran, 22.8 parts of the compound (E-5) and 8.3 parts of pyridine were charged, and stirred for 30 minutes at 23° C. The obtained mixture was cooled to 0° C. To the obtained mixture, 33.6 parts of a compound of (E-4), 1-(3-dimethylaminopropyl)-3-ethyl carbodiimide hydrochloride, and 140 parts of chloroform were added, and stirred for 18 hours at 23° C. To this reactant solution, 850 parts of n-heptane and 77 parts of 5% of hydrochloric acid solution were added, the mixture was stirred for 30 minutes at 23° C. The obtained solution was allowed to stand, and then separated to recover an organic layer. To the recovered organic layer, 61 parts of 10% potassium carbonate was added, and the obtained solution was stirred for 30 minutes at 23° C., allowed to stand, and then separated to wash the organic layer. These washing operations were repeated for 2 times. To the washed organic layer, 230 parts of ion-exchanged water was added, and the obtained solution was stirred for 30 minutes at 23° C., allowed to stand, and then separated to wash the organic layer with water. These washing operations were repeated for 5 times. The obtained organic layer was concentrated, resulting in 31.5 parts of the compound (E).

MS (mass spectroscopy): 420.1 (molecular ion peak)

Synthesis Example 5

Synthesis of Compound Represented by the Formula (F)

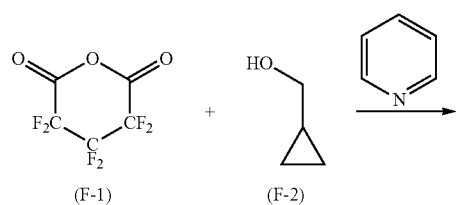

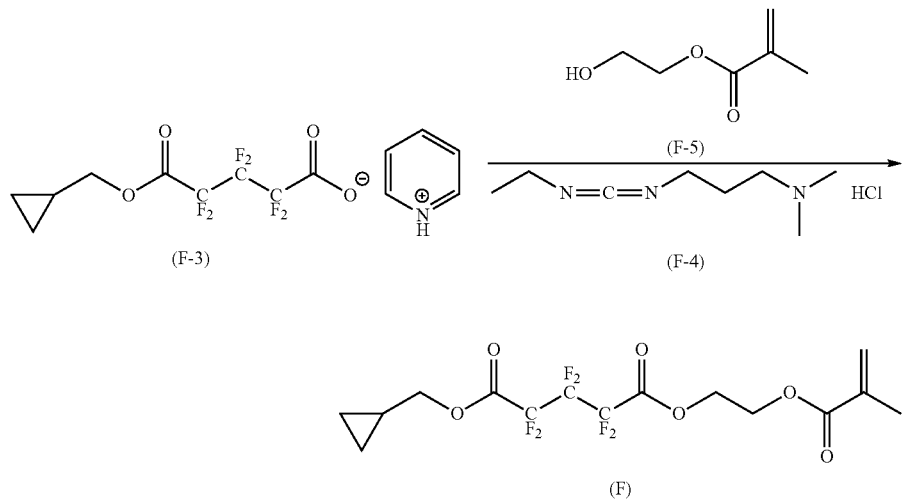

25.00 parts of a compound (F-1) and 25.00 parts of tetrahydro tetrahydrofuran were mixed, and stirred for 30 minutes at 23° C. The obtained mixture was cooled to 0° C. To this mixture, a mixture of 8.50 parts of a compound (F-2), 25.00 parts of tetrahydrofuran and 11.2 parts of pyridine was added, over 1 hour while maintaining at the same temperature. The temperature of the mixture was then elevated to about 25° C., and the mixture was stirred for 1 hour at the same temperature. To the obtained reactant, 190 parts of ethyl acetate and 50 parts of ion-exchanged water were added, and then separated to recover an organic layer. The obtained organic layer was concentrated. To the obtained concentrate, 150.0 parts of n-heptane was added, and the obtained mixture was stirred, and the supernatant was removed. The obtained mixture was concentrated, resulting in 28.7 parts of the compound (F-3).

19.80 parts of a compound (F-3), 90.0 parts of tetrahydrofuran, 10.3 parts of a compound (F-5) and 5.0 parts of pyridine were mixed, and stirred for 30 minutes at 23° C. The obtained mixture was cooled to 0° C. To this mixture, 15.2 parts of a compound (F-4), 1-(3-dimethylaminopropyl)-3-ethyl carbodiimide hydrochloride, was added, and stirred for 18 hours at 23° C. 450.0 parts of n-heptane and 47.0 parts of 5% of hydrochloric acid solution were added to the obtained mixture, the mixture was stirred for 30 minutes at 23° C. The obtained solution was allowed to stand, and then separated to recover an organic layer. To the recovered organic layer, 37.0 parts of 10% potassium carbonate was added, and the obtained solution was stirred for 30 minutes at 23° C., allowed to stand, and then separated to wash the organic layer. These washing operations were repeated for 2 times. To the washed organic layer, 120.0 parts of ion-exchanged water was added, and the obtained solution was stirred for 30 minutes at 23° C., allowed to stand, and then separated to wash the organic layer with water. These washing operations were repeated for 5 times. The obtained organic layer was concentrated to the obtained concentrate, resulting in 20.1 parts of the compound (F).

MS (mass spectroscopy): 406.1 (molecular ion peak)

Synthesis Example 6

Synthesis of a Salt Represented by the Formula (II-49)

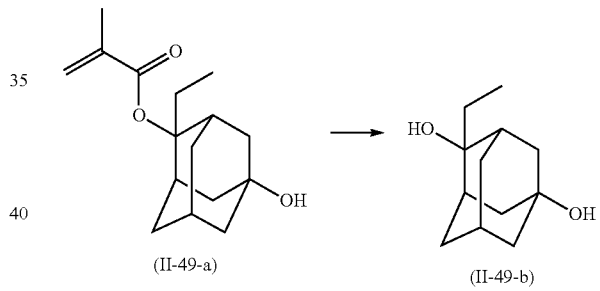

26.44 parts of the salt represented by the formula (II-49-a) (trade name: HADM, Idemitsu Kosan Co., Ltd.) and 80.00 parts of dioxane were charged, and stirred at 23° C., a solution in which 4.40 parts of sodium hydroxide was dissolved in 80.00 parts of ion-exchanged water was added in the form of drops thereto over 30 minutes. The resultant was stirred for 36 hour at 90° C. The obtained reacted mass was cooled, 400.0 parts of ion-exchanged water, 500.0 parts of ethyl acetate and 200.0 parts of sodium hydroxide were added to the obtained mass, stirred, and separated to obtain an organic layer. To the obtained organic layer, 400.0 parts of 3N sodium hydroxide was added, stirred, and separated to obtain an organic layer. To the obtained organic layer, 400.0 parts of ion-exchanged water was added, stirred, and separated to obtain an organic layer. This washing with water operation was repeated three times. The obtained organic layer was concentrated to obtain a concentrate. The concentrate was column-fractionated under the condition below, whereby giving 7.89 parts of the compound (II-49-b).

Developing medium: silica gel 60, 200 mesh (Merck & Co., Inc.)

Developing solvent: n-heptane/ethyl acetate=1/1 (bulk ratio)

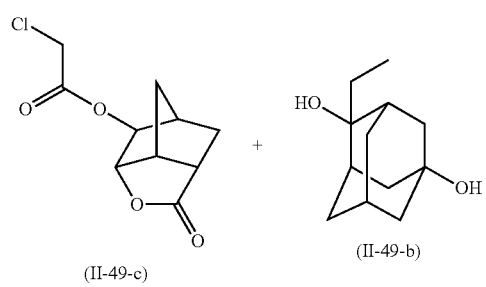

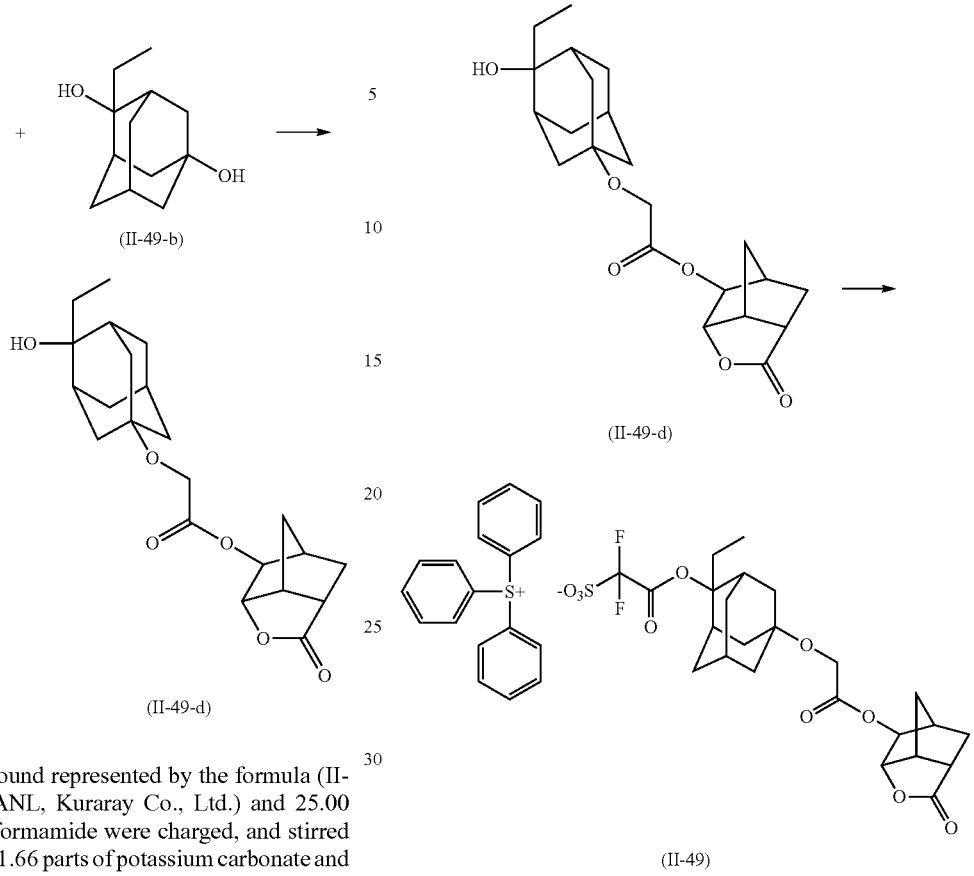

4.61 parts of a compound represented by the formula (II-49-c) (Trade name: CANL, Kuraray Co., Ltd.) and 25.00 parts of N,N'-dimethylformamide were charged, and stirred for 30 minutes at 23° C. 1.66 parts of potassium carbonate and 0.84 parts of potassium iodide were added thereto, and the obtained mixture was stirred for 1 hour at 50° C. The obtained mixture was cooled to 40° C., a solution in which 3.93 parts of a compound represented by the formula (II-49-b) was dissolved in 25.00 parts of N,N'-dimethylformamide was added in the form of drops thereto over 1 hour, and the mixture was stirred for 5 hours at 75° C. The obtained mixture was cooled to 23° C., 60.00 parts of chloroform and 60.00 parts of 1N hydrochloride were added thereto, stirred, and separated to obtain an organic layer. The obtained organic layer was washed with ion-exchanged water until an aqueous layer was neutralized. The obtained organic layer was concentrated to obtain a concentrate. The concentrate was column-fractionated under the condition below, whereby giving 2.24 parts of the compound (II-49-d).

Developing medium: silica gel 60, 200 mesh (Merck & Co., Inc.)

Developing solvent: ethyl acetate.

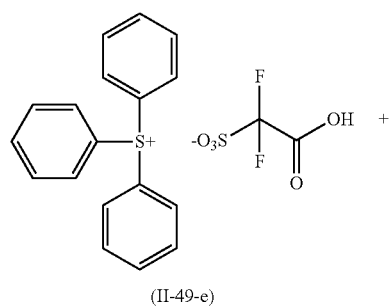

A salt represented by the formula (II-49-e) was synthesized by the method described in Example 1 of JP2008-127367A. 1.75 parts of the salt represented by the formula (II-49-e), 40.00 parts of the monochlorobenzene and 1.87 parts of the compound represented by the formula (II-49-d) were charged, and stirred for 30 minutes at 23° C. 0.16 parts of sulfuric acid and 10.00 parts of molecular sieve (Trade name: molecular sieve 4A, Wako Pure Chemical Industries, Ltd.) was added thereto, and the obtained mixture was stirred for 3 hours at 130° C. to reflux-dehydrate. The obtained reactant was concentrated, and to the obtained reactant, 100 parts of chloroform and 50 parts of ion-exchanged water were added, stirred, and separated to obtain an organic layer. The obtained organic layer was washed with water for three times. To the obtained organic layer, 1.00 part of activated carbon was added, and the mixture was stirred for 30 minutes at 23° C., and filtrated. The filtrate was concentrated to obtain a concentrate, to this concentrate, 20 parts of acetonitrile was mixed to dissolve, and concentrated. To the obtained residue, 20 parts of ethyl acetate was added, stirred, and remove a supernatant. To the obtained residue, 20 parts of tert-butyl methyl ether was added, stirred, and remove a supernatant. The obtained residue was dissolved in chloroform, and the obtained residue was concentrated to obtain 0.44 parts of the salt represented by the formula (II-49) as oil.

MS (ESI(+) Spectrum): M$^+$ 263.1

MS (ESI(−) Spectrum): M$^-$ 547.2

Synthesis Example 7

Synthesis of a Salt Represented by the Formula (II-41)

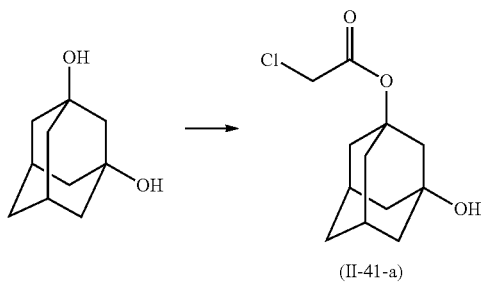 [SMILES: OC12CC3CC(C1)CC(O)(C3)C2 ; O=C(CCl)OC12CC3CC(CC(O)(C3)C1)C2]

(II-41-a)

250 parts of 1,3-adamenranediol and 2000 parts of tetrahydrofuran were charged, and stirred at room temperature, 142 parts of pyridine was added thereto, and raise temperature to 40° C. A mixture solution of 254 parts of chloroacetyl chloride and 500 parts of tetrahydrofuran was added in the form of drops thereto over 80 minutes. The resultant was stirred for 8 hour at 40° C., and cooled to 5° C. To the obtained reacted solution was added 100 parts of ion-exchanged water (5° C.), the obtained solution was stirred, and separated to collect an aqueous layer. To the obtained aqueous layer, 600 parts of ethyl acetate was added, the obtained solution was separated to collect an organic layer. To the obtained organic layer, 600.0 parts of 10% potassium carbonate (5° C.) was added to wash, and obtained solution was separated to obtain an organic layer. To the obtained organic layer, 600.0 parts of ion-exchanged water was further added to wash with water, and separated to obtain an organic layer. This washing with water operation was repeated three times. The obtained organic layer was concentrated to obtain a concentrate. The concentrate was column-fractionated under the condition below, whereby giving 75 parts of the compound (II-41-a).

Developing medium: silica gel 60, 200 mesh (Merck 8; Co., Inc.)

Developing solvent: n-heptane/ethyl acetate=1/1 (bulk ratio)

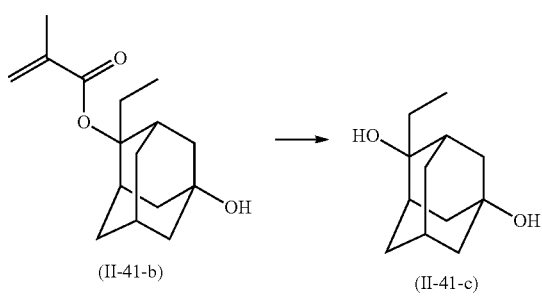 [SMILES: C=C(C)C(=O)OC1(CC)C2CC3CC1CC(O)(C3)C2 ; CCC1(O)C2CC3CC1CC(O)(C3)C2]

(II-41-b)  (II-41-c)

26.44 parts of the salt represented by the formula (II-41-b) (trade name: HADM, Idemitsu Kosan Co., Ltd.) and 80.00 parts of dioxane were charged, and stirred at 23° C., a solution in which 4.40 parts of sodium hydroxide was dissolved in 80.00 parts of ion-exchanged water was added thereto in the form of drops thereto over 30 minutes. The resultant was stirred for 36 hour at 90° C. The obtained reacted mass was cooled, 400.00 parts of ion-exchanged water, 500.0 parts of ethyl acetate and 200.0 parts of sodium hydroxide were added to the obtained mass, stirred, and separated to obtain an organic layer. To the obtained organic layer, 400.0 parts of 3N sodium hydroxide was added, stirred, and separated to obtain an organic layer. To the obtained organic layer, 400.0 parts of ion-exchanged water was added, stirred, and separated to obtain an organic layer. This washing with water operation was repeated three times. The obtained organic layer was concentrated to obtain a concentrate. The concentrate was column-fractionated under the condition below, whereby giving 7.89 parts of the compound (II-41-c).

Developing medium: silica gel 60, 200 mesh (Merck & Co., Inc.)

Developing solvent: n-heptane/ethyl acetate=1/1 (bulk ratio)

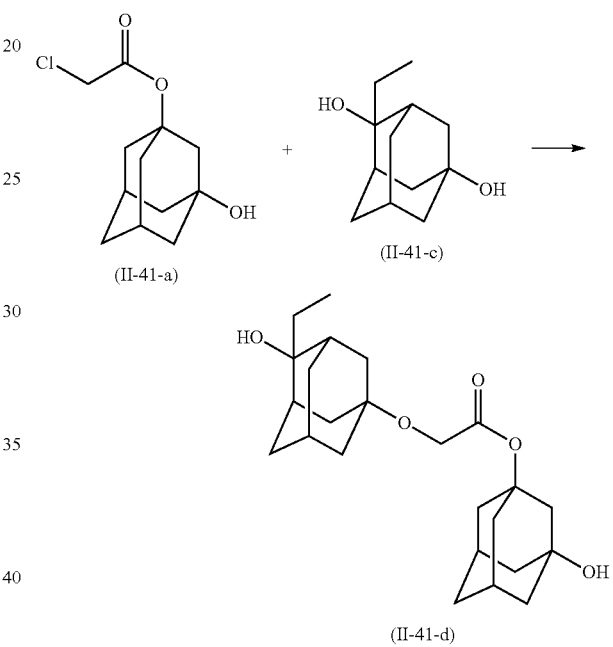

(II-41-a)  (II-41-c)

(II-41-d)

4.88 parts of a compound represented by the formula (II-41-a) and 25.00 parts of N,N'-dimethylformamide were charged, and stirred for 30 minutes at 23° C. 1.66 parts of potassium carbonate and 0.84 parts of potassium iodide were added thereto, and the obtained mixture was stirred for 1 hour at 50° C. The obtained mixture was cooled to 40° C., a solution in which 3.93 parts of a compound represented by the formula (II-41-c) was dissolved in 25.00 parts of N,N'-dimethylformamide was added in the form of drops thereto over 1 hour, and the mixture was stirred for 5 hours at 75° C. The obtained mixture was cooled to 23° C., 60.00 parts of chloroform and 60.00 parts of 1N hydrochloride were added thereto, stirred, and separated to obtain an organic layer. The obtained organic layer was washed with 60.00 parts of ion-exchanged water until an aqueous layer was neutralized. The obtained organic layer was concentrated to obtain a concentrate. The concentrate was column-fractionated under the condition below, whereby giving 2.54 parts of the compound (II-41-d).

Developing medium: silica gel 60, 200 mesh (Merck & Co., Inc.)

Developing solvent: ethyl acetate.

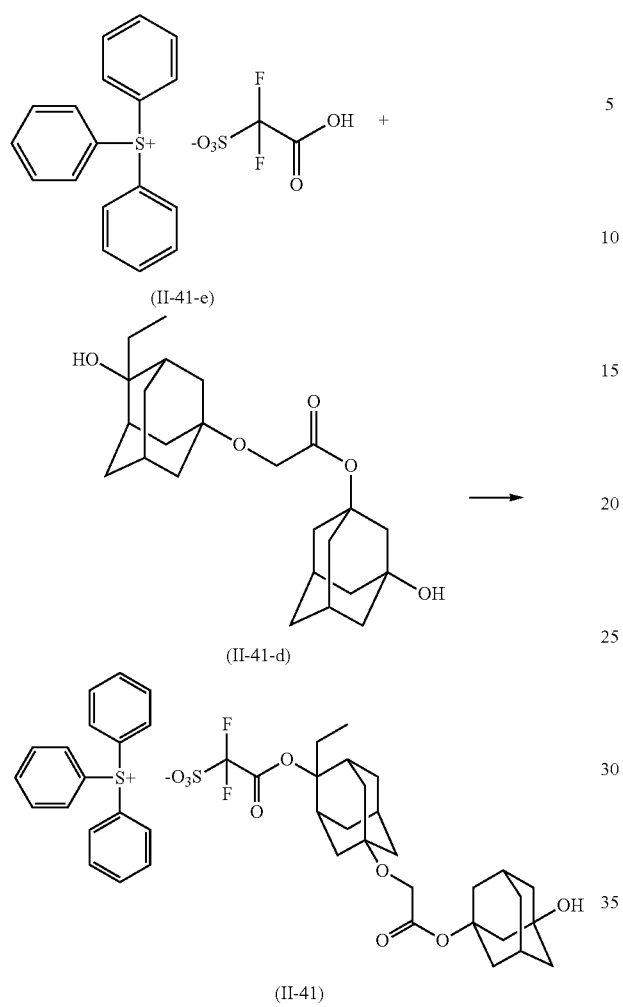

A salt represented by the formula (II-41-e) was synthesized by the method described in Example 1 of JP2008-127367A. 2.19 parts of the salt represented by the formula (II-41-e), 50.00 parts of the monochlorobenzene and 2.43 parts of the compound represented by the formula (II-41-d) were charged, and stirred for 30 minutes at 23° C. 0.20 parts of sulfuric acid and 10.00 parts of molecular sieve (Trade name: molecular sieve 4A, Wako Pure Chemical Industries, Ltd.) were added thereto, and the obtained mixture was stirred for 3 hours at 130° C. to reflux-dehydrate. The obtained reactant was concentrated, and to the obtained reactant, 100 parts of chloroform and 50 parts of ion-exchanged water were added, stirred, and separated to obtain an organic layer. The obtained organic layer was washed with water for three times. To the obtained organic layer, 1.00 part of activated carbon was added, and the mixture was stirred for 30 minutes at 23° C., and filtrated. The filtrate was concentrated to obtain a concentrate, to this concentrate, 20 parts of acetonitrile was mixed to dissolve, and concentrated. To the obtained residue, 20 parts of ethyl acetate was added, stirred, and remove a supernatant. To the obtained residue, 20 parts of tert-butyl methyl ether was added, stirred, and remove a supernatant. The obtained residue was dissolved in chloroform, and the obtained residue was concentrated to obtain 0.62 parts of the salt represented by the formula (II-41) as oil.

MS (ESI(+) Spectrum): M$^+$ 263.1

MS (ESI(−) Spectrum): M$^-$ 561.2

Synthesis Example 8

Synthesis of a Salt Represented by the Formula (II-1)

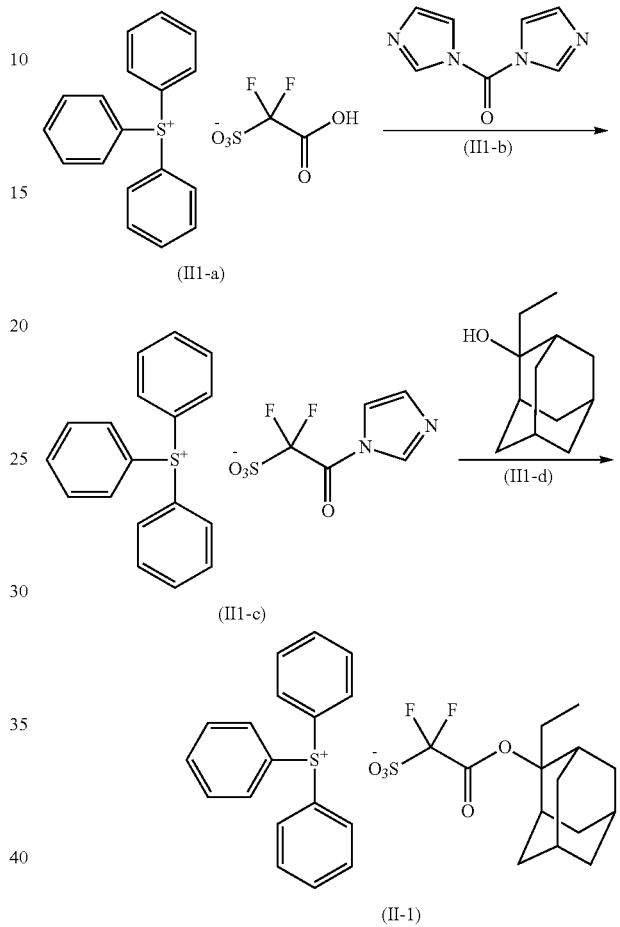

4.98 parts of the salt represented by the formula (II-1-a) and 25.00 parts of the acetonitrile were charged, and stirred for 30 minutes at 23° C. 2.17 parts of the compound represented by the formula (II1-b) was added thereto, and the obtained mixture was stirred for 2 hours at 70° C. to obtain a solution containing the compound represented by the formula (II1-c). A mixture containing 1.86 parts of the compound represented by the formula (II1-d), 14.91 parts of chloroform and 2.79 parts of acetonitrile was added to the obtained solution at 50° C. in the form of drops over 1 hour, and the obtained mixture was stirred for 12 hours at 50° C. The obtained reactant was concentrated. 40 parts of chloroform and 20 parts of 2% solution of oxalic acid were added to the obtained concentrate, the obtained mixture was stirred for 30 minutes at 23° C. The obtained mixture was allowed to stand, and separated to obtain an organic layer. To the obtained organic layer, 20 parts of ion-exchanged water was added, and the mixture was stirred for 30 minutes at 23° C. The obtained organic layer was allowed to stand, and separated to obtain an organic layer. These operations for washing were repeated five times. To the obtained organic layer, 0.80 parts of activated carbon was added, and the mixture was stirred for 30 minutes at 23° C., and filtrated. The filtrate was concentrated to obtain a concentrate, to this concentrate, 50.0 parts of tert-butyl methyl ether was added, stirred, a supernatant was removed, and concentrated. The obtained residue was dissolved in acetonitrile, and the obtained residue was concentrated to obtain 5.24 parts of the salt represented by the formula (II-1).

MS (ESI(+) Spectrum): M⁺ 263.1

MS (ESI(−) Spectrum): M⁻ 337.1

Synthetic Example of the Resin

The monomers used the synthesis of the resin are shown below.

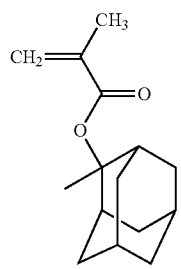
(a1-1-1)

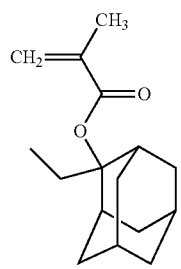
(a1-1-2)

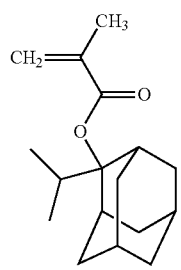
(a1-1-3)

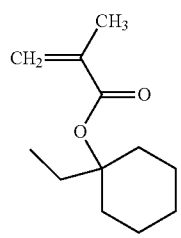
(a1-2-3)

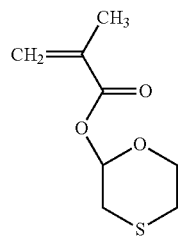
(a1-5-1)

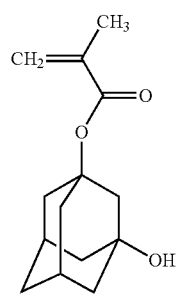
(a2-1-1)

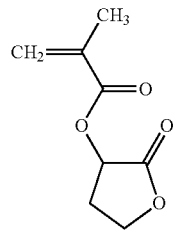
(a3-1-1)

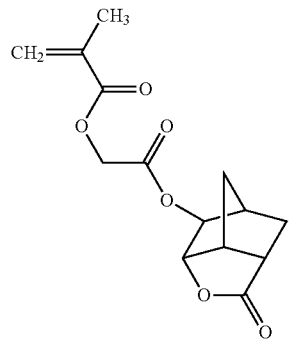
(a3-2-3)

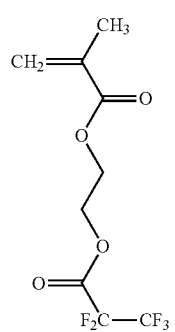
(a4-1-7)

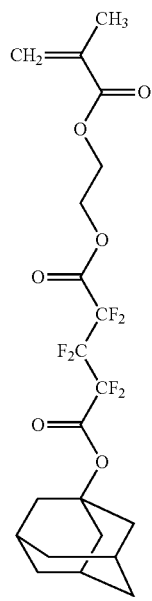
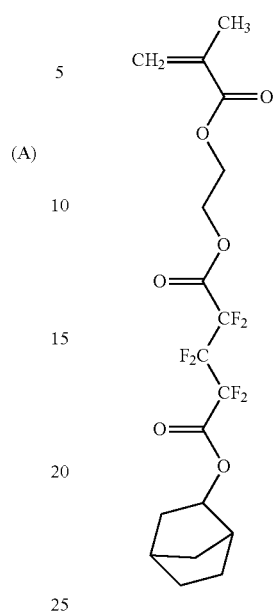
(A)
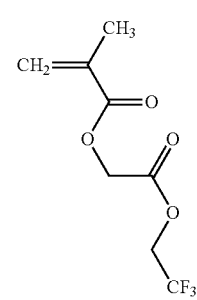
(D)
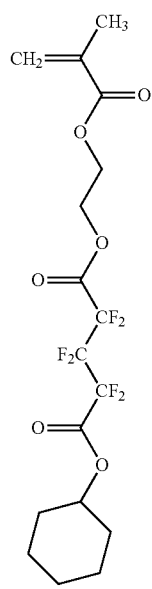
(B)
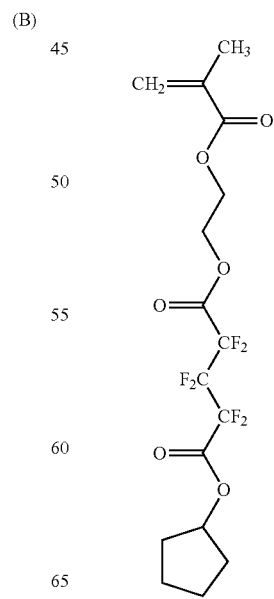
(E)

-continued (F)

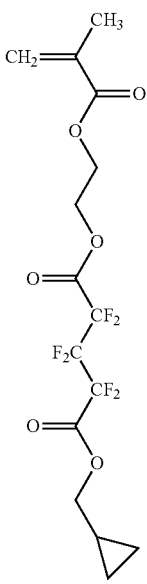

These monomers are referred to as "monomer (a1-1-1)" to "monomer (F)".

Synthetic Example 9

Synthesis of Resin A1-1

Monomer (a-4-1-7) and monomer (A) were mixed together with a mole ratio of Monomer (a-4-1-7): monomer (A)=90: 10, and dioxane was added thereto in an amount equal to 1.5 times by weight of the total amount of monomers to obtain a solution. Azobisisobutyronitrile and azobis(2,4-dimethylvaleronitrile) was added as an initiator to obtain a solution in an amount of 0.7 mol % and 2.1 mol % respectively with respect to the entire amount of monomers, and the resultant mixture was heated for about 5 hours at 75° C. After that, the obtained reacted mixture was poured into a large amount of methanol/water mixed solvent to precipitate a resin. The obtained resin was filtrated. Thus obtained resin was dissolved in another dioxane to obtain a solution, and the solution was poured into a mixture of methanol/water mixed solvent to precipitate a resin. The obtained resin was filtrated. These operations were repeated for two times, resulting in a 82% yield of copolymer having a weight average molecular weight of about 17000. This copolymer, which had the structural units of the following formula, was referred to Resin A1-1.

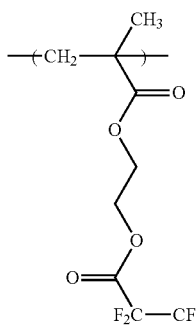

-continued

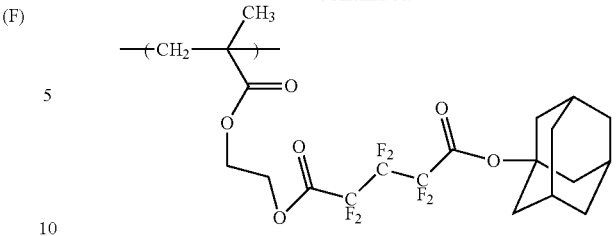

Synthetic Example 10

Synthesis of Resin A1-2

Monomer (B) was used, and dioxane was added thereto in an amount equal to 1.5 times by weight of the total amount of monomers to obtain a solution. Azobisisobutyronitrile and azobis(2,4-dimethylvaleronitrile) was added as an initiator to obtain a solution in an amount of 0.7 mol % and 2.1 mol % respectively with respect to the entire amount of monomers, and the resultant mixture was heated for about 5 hours at 75° C. After that, the obtained reacted mixture was poured into a large amount of methanol/water mixed solvent to precipitate a resin. Thus obtained resin was dissolved in another dioxane to obtain a solution, and the solution was poured into a mixture of methanol/water mixed solvent to precipitate a resin. The obtained resin was filtrated. These operations were repeated for two times, resulting in a 85% yield of polymer having a weight average molecular weight of about 20000. This polymer, which had the structural units of the following formula, was referred to Resin A1-2.

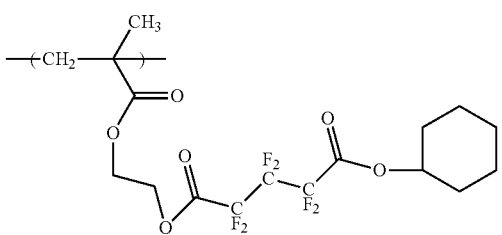

Synthetic Example 11

Synthesis of Resin A1-3

Monomer (C) was used, and dioxane was added thereto in an amount equal to 1.5 times by weight of the total amount of monomers to obtain a solution. Azobisisobutyronitrile and azobis(2,4-dimethylvaleronitrile) was added as an initiator to obtain a solution in an amount of 0.7 mol % and 2.1 mol % respectively with respect to the entire amount of monomers, and the resultant mixture was heated for about 5 hours at 75° C. After that, the obtained reacted mixture was poured into a large amount of methanol/water mixed solvent to precipitate a resin. Thus obtained resin was dissolved in another dioxane to obtain a solution, and the solution was poured into a mixture of methanol/water mixed solvent to precipitate a resin. The obtained resin was filtrated. These operations were repeated for two times, resulting in a 83% yield of polymer having a weight average molecular weight of about 19000. This polymer, which had the structural units of the following formula, was referred to Resin A 1-3.

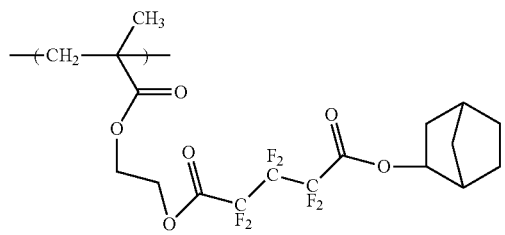

Synthetic Example 12

Synthesis of Resin A1-4

Monomer (E) was used, and dioxane was added thereto in an amount equal to 1.2 times by weight of the total amount of monomers to obtain a solution. Azobis(2,4-dimethylvaleronitrile) was added as an initiator to obtain a solution in an amount of 4.5 mol % with respect to the entire amount of monomers, and the resultant mixture was heated for about 5 hours at 60° C. After that, the obtained reacted mixture was poured into a large amount of n-heptane to precipitate a resin. The obtained resin was filtrated, resulting in a 89% yield of polymer having a weight average molecular weight of about 26000. This polymer, which had the structural units of the following formula, was referred to Resin A1-4.

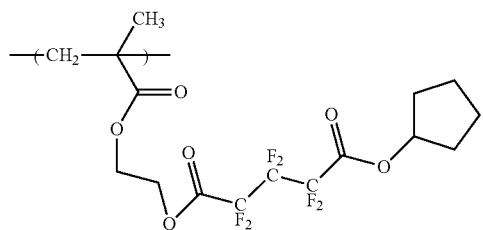

Synthetic Example 13

Synthesis of Resin A1-5

Monomer (F) was used, and dioxane was added thereto in an amount equal to 1.2 times by weight of the total amount of monomers to obtain a solution. Azobis(2,4-dimethylvaleronitrile) was added as an initiator to obtain a solution in an amount of 4.5 mol % with respect to the entire amount of monomers, and the resultant mixture was heated for about 5 hours at 60° C. After that, the obtained reacted mixture was poured into a large amount of n-heptane to precipitate a resin. The obtained resin was filtrated, resulting in a 90% yield of polymer having a weight average molecular weight of about 39000. This polymer, which had the structural units of the following formula, was referred to Resin A1-5.

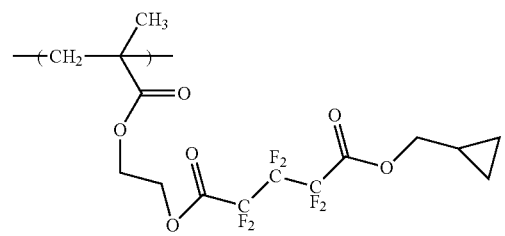

Synthetic Example 14

Synthesis of Resin A2-1

Monomer (a1-1-3), monomer (a1-2-3), monomer (a2-1-1), monomer (a3-1-1) and monomer (a3-2-3) were charged with molar ratio 30:14:6:20:30, and dioxane was added thereto in an amount equal to 1.5 weight times of the total amount of monomers to obtain a solution. Azobisisobutyronitrile and azobis(2,4-dimethylvaleronitrile) was added as an initiator thereto in an amount of 1 mol % and 3 mol % respectively with respect to the entire amount of monomers, and the resultant mixture was heated for about 5 hours at 73° C. After that, the reaction solution was poured into a mixture of methanol and ion-exchanged water (4:1) in large amounts to precipitate a resin. The obtained resin was filtrated. Thus obtained resin was dissolved in another dioxane to obtain a solution, and the solution was poured into a large amount of a mixture of methanol and water to precipitate a resin. The obtained resin was filtrated. These operations were repeated two times for purification, resulting in 65% yield of copolymer having a weight average molecular weight of about 8100. This copolymer, which had the structural units derived from the monomers of the following formula, was designated Resin A2-1.

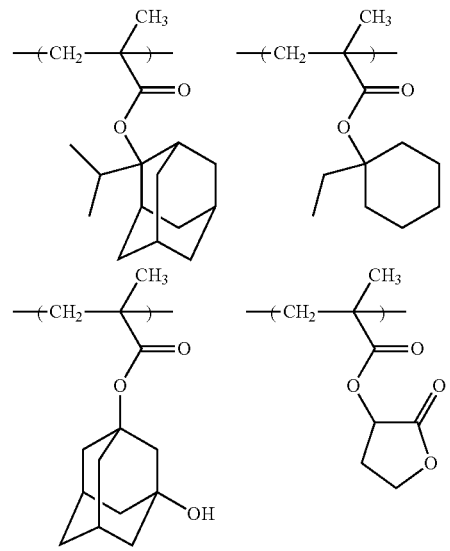

125
-continued

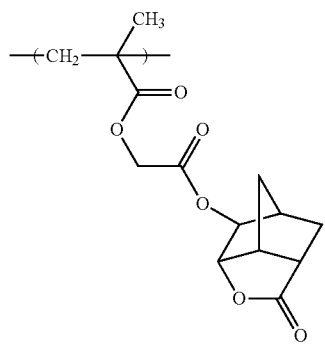

126
-continued

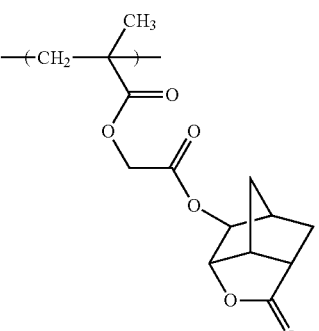

Synthetic Example 15

Synthesis of Resin A2-2

Monomer (a1-1-2), monomer (a1-2-3), monomer (a2-1-1), monomer (a3-1-1) and monomer (a3-2-3) were charged with molar ratio 30:14:6:20:30, and dioxane was added thereto in an amount equal to 1.5 weight times of the total amount of monomers to obtain a solution. Azobisisobutyronitrile and azobis(2,4-dimethylvaleronitrile) was added as an initiator thereto in an amount of 1 mol % and 3 mol % respectively with respect to the entire amount of monomers, and the resultant mixture was heated for about 5 hours at 73° C. After that, the reaction solution was poured into a mixture of methanol and ion-exchanged water (4:1) in large amounts to precipitate a resin. The obtained resin was filtrated. Thus obtained resin was dissolved in another dioxane to obtain a solution, and the solution was poured into a large amount of a mixture of methanol and water to precipitate a resin. The obtained resin was filtrated. These operations were repeated two times for purification, resulting in 68% yield of copolymer having a weight average molecular weight of about 7800. This copolymer, which had the structural units derived from the monomers of the following formula, was designated Resin A2-2.

Synthetic Example 16

Synthesis of Resin A2-3

Monomer (a1-1-2), monomer (a2-1-1) and monomer (a3-1-1) were mixed with molar ratio 50:25:25, and dioxane was added thereto in an amount equal to 1.5 weight times of the total amount of monomers. Azobisisobutyronitrile and azobis (2,4-dimethyl valeronitrile) was added as an initiator thereto in an amount of 1 mol % and 3 mol % respectively with respect to the entire amount of monomers, and the resultant mixture was heated for about 8 hours at 80° C. After that, the reaction solution was poured into a mixture of methanol and ion-exchanged water (4:1) in large amounts to precipitate a resin. The obtained resin was filtrated. Thus obtained resin was dissolved in another dioxane to obtain a solution, and the solution was poured into a large amount of a mixture of methanol and water to precipitate a resin. The obtained resin was filtrated. These operations were repeated three times for purification, resulting in 60% yield of copolymer having a weight average molecular weight of about 9200. This copolymer, which had the structural units derived from the monomers of the following formulae, was designated Resin A2-3.

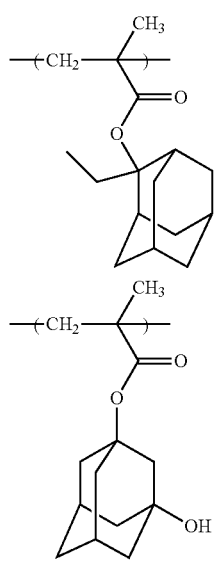

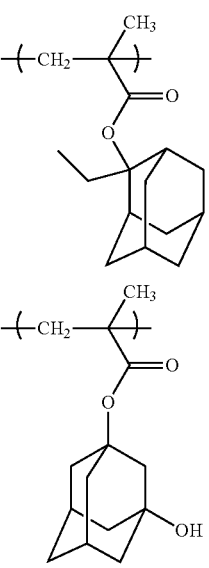

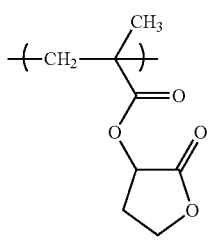

Synthetic Example 17

Synthesis of Resin A2-4

Monomer (a1-1-2), monomer (a1-2-3), monomer (a2-1-1), monomer (a3-2-3) and monomer (a3-1-1) were charged with molar ratio 30:14:6:20:30, and dioxane was added thereto in an amount equal to 1.5 weight times of the total amount of monomers to obtain a solution. Azobisisobutyronitrile and azobis(2,4-dimethylvaleronitrile) was added as an initiator thereto in an amount of 1 mol % and 3 mol % respectively with respect to the entire amount of monomers, and the resultant mixture was heated for about 5 hours at 75° C. After that, the reaction solution was poured into a mixture of methanol and ion-exchanged water (4:1) in large amounts to precipitate a resin. The obtained resin was filtrated. Thus obtained resin was dissolved in another dioxane to obtain a solution, and the solution was poured into a large amount of a mixture of methanol and water to precipitate a resin. The obtained resin was filtrated. These operations were repeated two times for purification, resulting in 78% yield of copolymer having a weight average molecular weight of about 7200. This copolymer, which had the structural units derived from the monomers of the following formula, was designated Resin A2-4.

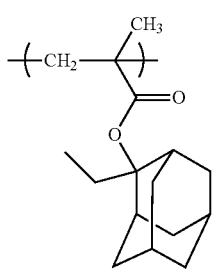
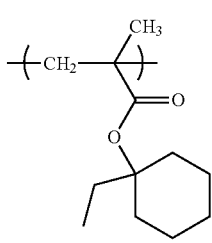
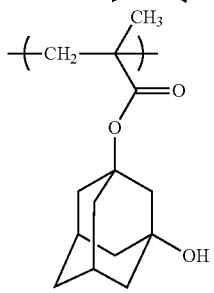

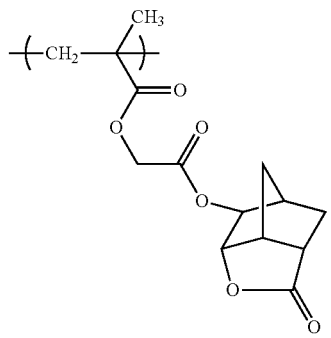
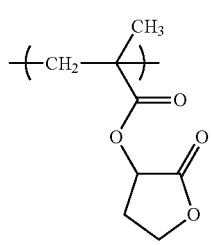

Synthetic Example 18

Synthesis of Resin A2-5

Monomer (a1-1-2), monomer (a1-5-1), monomer (a2-1-1), monomer (a3-2-3) and monomer (a3-1-1) were charged with molar ratio 30:14:6:20:30, and dioxane was added thereto in an amount equal to 1.5 weight times of the total amount of monomers to obtain a solution. Azobisisobutyronitrile and azobis(2,4-dimethylvaleronitrile) was added as an initiator thereto in an amount of 1 mol % and 3 mol % respectively with respect to the entire amount of monomers, and the resultant mixture was heated for about 5 hours at 75° C. After that, the reaction solution was poured into a mixture of methanol and ion-exchanged water in large amounts to precipitate a resin. The obtained resin was filtrated. Thus obtained resin was dissolved in another dioxane to obtain a solution, and the solution was poured into a large amount of a mixture of methanol and water to precipitate a resin. The obtained resin was filtrated. These operations were repeated two times for purification, resulting in 78% yield of copolymer having a weight average molecular weight of about 7200. This copolymer, which had the structural units derived from the monomers of the following formula, was designated Resin A2-5.

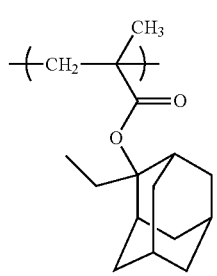
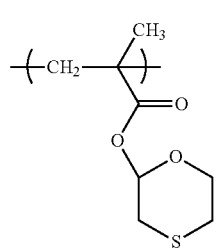

-continued

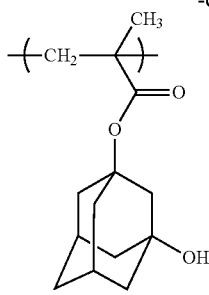

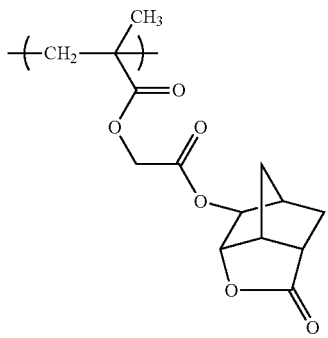

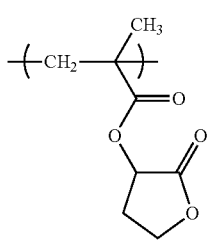

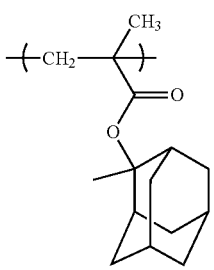

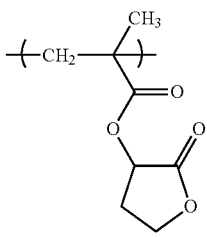

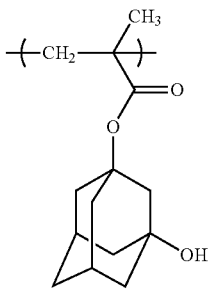

Synthetic Example 19

Synthesis of Resin X1

Monomer (a1-1-1), monomer (a3-1-1) and monomer (a2-1-1) were mixed with molar ratio 35:45:20, and dioxane was added thereto in an amount equal to 1.5 times by weight of the total amount of monomers to obtain a solution. Azobisisobutyronitrile and azobis(2,4-dimethylvaleronitrile) was added as an initiator to obtain a solution in an amount of 1.0 mol % and 3.0 mol % respectively with respect to the entire amount of monomers, and the resultant mixture was heated for about 5 hours at 75° C. After that, the obtained reacted mixture was poured into a mixture of a large amount of methanol and water to precipitate a resin. The obtained resin was filtrated. Thus obtained resin was dissolved in another dioxane to obtain a solution, and the solution was poured into a mixture of methanol and water to precipitate a resin. The obtained resin was filtrated. These operations were repeated 2 times for purification, resulting in a 75% yield of copolymer having a weight average molecular weight of about 7000. This copolymer, which had the structural units of the following formula, was referred to Resin X1.

Synthetic Example 20

Synthesis of Resin X2

Monomer (F) and monomer (a1-1-1) were mixed with molar ratio=80:20, and dioxane was added thereto in an amount equal to 1.5 times by weight of the total amount of monomers to obtain a solution. Azobisisobutyronitrile and azobis(2,4-dimethylvaleronitrile) was added as an initiator to obtain a solution in an amount of 0.5 mol % and 1.5 mol % respectively with respect to the entire amount of monomers, and the resultant mixture was heated for about 5 hours at 70° C. After that, the obtained reacted mixture was poured into a mixture of a large amount of methanol and water to precipitate a resin. The obtained resin was filtrated. Thus obtained resin was dissolved in another dioxane to obtain a solution, and the solution was poured into a mixture of methanol and ion-exchanged water to precipitate a resin. The obtained resin was filtrated. These operations were repeated 2 times, resulting in a 70% yield of copolymer having a weight average molecular weight of about 28000. This copolymer, which had the structural units of the following formula, was referred to Resin X2.

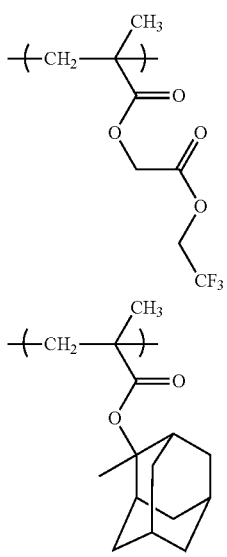

(Preparing Resist Composition)

Resist compositions were prepared by mixing and dissolving each of the components shown in Table 2, and then filtrating through a fluororesin filter having 0.2 μm pore diameter.

TABLE 2

| Ex. | Resin | Acid Generator | Basic Comp. | BP/PEB °C./°C. |
|---|---|---|---|---|
| 1 | A1-1/A2-2 = 0.7/10 | II-49 = 1.4 | C1 = 0.07 | 110/105 |
| 2 | A1-2/A2-1 = 0.7/10 | II-49 = 1.4 | C1 = 0.07 | 95/85 |
| 3 | A1-2/A2-2 = 0.7/10 | II-49 = 1.4 | C1 = 0.07 | 110/105 |
| 4 | A1-2/A2-2 = 0.7/10 | II-41 = 1.4 | C1 = 0.07 | 110/105 |
| 5 | A1-2/A2-2 = 0.7/10 | II-33 = 1.4 | C1 = 0.07 | 110/105 |
| 6 | A1-2/A2-3 = 0.7/10 | II-49 = 1.4 | C1 = 0.07 | 110/105 |
| 7 | A1-3/A2-2 = 0.7/10 | II-49 = 1.4 | C1 = 0.07 | 110/105 |
| 8 | A1-2/A2-2 = 0.7/10 | II-49/B1 = 0.7/0.7 | C1 = 0.07 | 110/105 |
| 9 | A1-2/X1 = 0.3/10 | II-49/B1 = 0.7/0.7 | C1 = 0.07 | 110/105 |
| 10 | A1-2/X1 = 0.3/10 | II-49/B2/B3 = 0.5/0.5/0.1 | C1 = 0.07 | 110/105 |
| 11 | A1-2/A2-4 = 0.7/10 | II-49 = 1.4 | C1 = 0.07 | 110/105 |
| 12 | A1-2/A2-5 = 0.7/10 | II-49 = 1.4 | C1 = 0.07 | 110/105 |
| 13 | A1-4/A2-5 = 0.7/10 | II-49 = 1.4 | C1 = 0.07 | 110/105 |
| 14 | A1-5/A2-5 = 0.7/10 | II-49 = 1.4 | C1 = 0.07 | 110/105 |
| 15 | A1-2/A2-5 = 0.7/10 | II-1 = 1.4 | C1 = 0.07 | 110/105 |
| Comparative Ex. | | | | |
| 1 | X2/X1 = 0.3/10 | B2/B3 = 1.0/0.1 | C1 = 0.07 | 110/105 |

<Resin>

Resins Prepared by the Synthetic Examples

<Acid Generator>

II-33: this was prepared by a method according to the method described in the Examples of JP2008-69146A

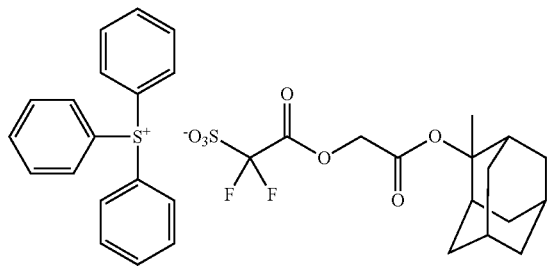

50 mg of this acid generator (II-33) was dissolved in 0.7935 g of dimethyl sulfoxide, 0.0216 g of 20% hydrochloric acid was added thereto, and stirred for 1 hour at 80° C. After that, decomposed substance of the acid generator (II-33) was analyzed. As a result, a carboxy group was generated and identified the compound below.

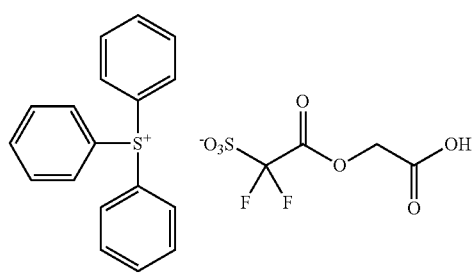

II-49:

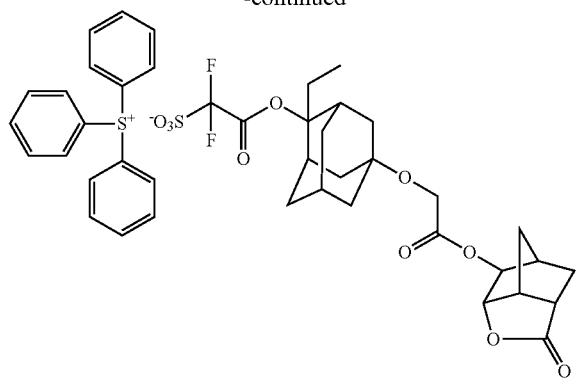

50 mg of this acid generator (II-4) was dissolved in 0.7948 g of dimethyl sulfoxide, 0.0212 g of 20% hydrochloric acid was added thereto, and stirred for 1 hour at 80° C. After that, decomposed substance of the acid generator (II-1) was analyzed. As a result, a carboxy group was generated and identified the compound below.

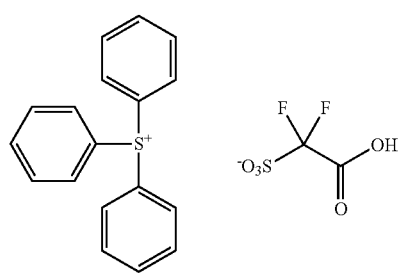

II-41:

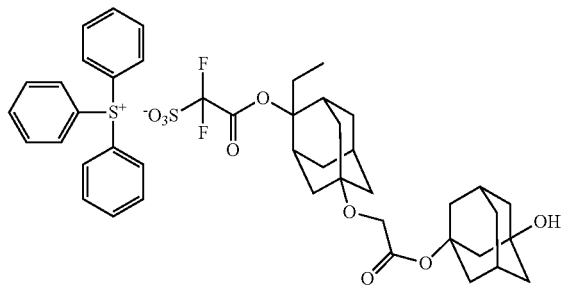

50 mg of this acid generator (II-41) was dissolved in 0.7958 g of dimethyl sulfoxide, 0.0216 g of 20% hydrochloric acid was added thereto, and stirred for 1 hour at 80° C. After that, decomposed substance of the acid generator (II-41) was analyzed. As a result, a carboxy group was generated and identified the compound below.

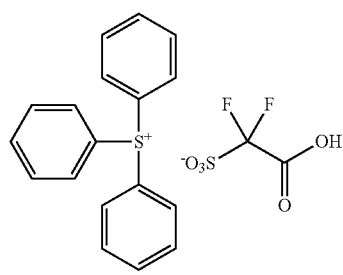

II-1:

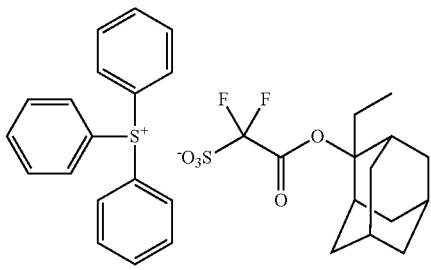

50 mg of this acid generator (II-1) was dissolved in 0.7921 g of dimethyl sulfoxide, 0.0208 g of 20% hydrochloric acid was added thereto, and stirred for 1 hour at 80° C. After that, decomposed substance of the acid generator (II-1) was analyzed. As a result, a carboxy group was generated and identified the compound below.

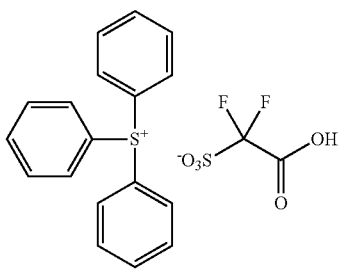

B1: this was prepared by a method according to the method described in the Examples of JP2010-152341A

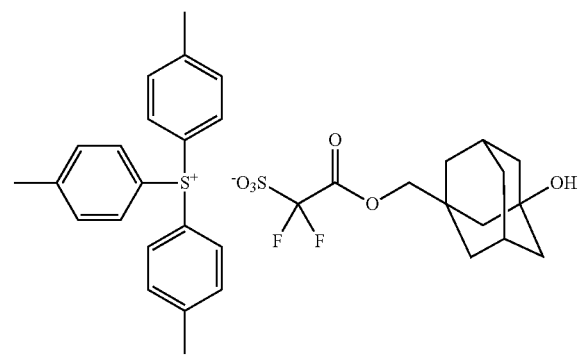

B2: this was prepared by a method according to the method described in the Examples of WO2008/99869A and JP2010-26478A

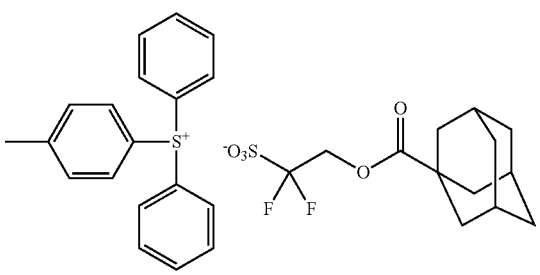

B3: this was prepared by a method according to the method described in the Examples of JP2005-221721A <Basic Compound: Qencher>

C1: 2,6-diisopropylaniline (obtained from Tokyo Chemical Industry Co., LTD)

<Solvent of Resist Composition>

| Propylene glycol monomethyl ether acetate | 265 parts |
| Propylene glycol monomethyl ether | 20 parts |
| 2-Heptanone | 20 parts |
| γ-butyrolactone | 3.5 parts |

(Producing Resist Pattern)

A composition for an organic antireflective film ("ARC-29", by Nissan Chemical Co. Ltd.) was applied onto 12-inch silicon wafers and baked for 60 seconds at 205° C. to form a 78 nm thick organic antireflective film.

The above resist compositions were then applied thereon by spin coating so that the thickness of the resulting film became 110 nm after drying.

The obtained wafers were then pre-baked for 60 sec on a direct hot plate at the temperatures given in the "PB" column in Table 2 to obtain a composition layer.

Line and space patterns were then exposed through stepwise changes in exposure quantity using an ArF excimer stepper for immersion lithography ("XT: 1900Gi" by ASML Ltd.: NA=1.35, ¾ Annular, X—Y deflection), on the wafers on which the composition layer thus been formed. The ultrapure water was used for medium of immersion.

After the exposure, post-exposure baking was carried out by 60 seconds at the temperatures given in the "PEB" column in Table 2.

Then, puddle development was carried out with 2.38 wt % tetramethylammonium hydroxide aqueous solution for 60 seconds to obtain a resist pattern.

Effective sensitivity was represented as the exposure amount at which a 50 nm line and space pattern resolved to 1:1 with the each resist film.

(Evaluation of Resolution)

A resist pattern exposed by effective sensitivity was observed with a scanning electron microscope.

a "∘∘" was given when the resist pattern was resolved with 43 nm line width, a "∘" was given when the resist pattern was resolved with 47 nm line width, a "x" was given when the resist pattern did not have much resolution with 47 nm line width, was resolved but top of the resist pattern was a rounded shape, or a skirt was observed or pattern collapse.

Table 3 illustrates the results thereof. The parenthetical number means resolution values.

(Line Edge Roughness (LER) Evaluation)

When the wall surface of the resist pattern following the lithography process was observed using a scanning electron microscope, a "∘∘" was given if the irregularity in the resist pattern side wall have a roughness width of 4 nm or less, a "∘" was given when the roughness width was more than 4 nm and 4.5 nm or less, and an "x" was given when the roughness width was more than 4.5 nm.

Table 3 illustrates the results thereof. The parenthetical number means roughness width values.

(Evaluation of Defects)

The above resist compositions were applied on each of the 12-inch-silicon wafers by spin coating so that the thickness of the resulting film became 150 nm after drying.

The obtained wafers were then pre-baked for 60 seconds on a direct hot plate at the temperatures given in the "PB" column in Table 2 to obtain a composition layer.

The thus obtained wafers with the produced composition layers were rinsed with water for 60 seconds using a developing apparatus (ACT-12, Tokyo electron Co. Ltd.).

Thereafter, the number of defects was counted using a defect inspection apparatus (KLA-2360, KLA-Tencor Co. Ltd.)

Table 3 illustrates the results thereof.

TABLE 3

| Ex. | Resolution | LER | Defects |
|---|---|---|---|
| 1 | ∘ (44) | ∘ (4.01) | 220 |
| 2 | ∘∘ (43) | ∘∘ (3.72) | 100 |
| 3 | ∘∘ (43) | ∘∘ (3.64) | 140 |
| 4 | ∘∘ (43) | ∘∘ (3.66) | 170 |
| 5 | ∘∘ (43) | ∘∘ (3.68) | 130 |
| 6 | ∘ (45) | ∘ (4.22) | 220 |
| 7 | ∘∘ (43) | ∘∘ (3.89) | 110 |
| 8 | ∘∘ (43) | ∘∘ (3.66) | 140 |
| 9 | ∘ (45) | ∘ (4.33) | 380 |
| 10 | ∘ (46) | ∘ (4.44) | 440 |
| 11 | ∘∘ (42) | ∘∘ (3.46) | 120 |
| 12 | ∘∘ (41) | ∘∘ (3.39) | 100 |
| 13 | ∘∘ (42) | ∘∘ (3.62) | 160 |
| 14 | ∘∘ (41) | ∘∘ (3.58) | 180 |
| 15 | ∘∘ (43) | ∘∘ (3.73) | 130 |
| Com. Ex. 1 | x (48) | x (4.78) | 720 |

According to the resist composition of the present invention, it is possible to achieve satisfactory excellent line edge roughness (LER) and resolution and less defects in the obtained resist pattern. Therefore, the present resist composition can be used for semiconductor microfabrication.

What is claimed is:

1. A resist composition comprising a resin having a structural unit represented by the formula (I), a resin being insoluble or poorly soluble in alkali aqueous solution, but becoming soluble in an alkali aqueous solution by the action of an acid and not including the structural unit represented by the formula (I), and an acid generator having an acid labile group,

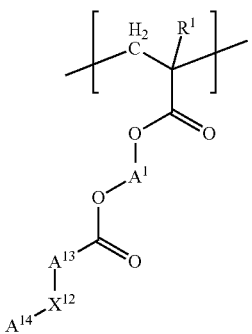
(I)

wherein $R^1$ represents a hydrogen atom or a methyl group;
$A^1$ represents a $C_1$ to $C_6$ alkanediyl group;
$A^{13}$ represents a $C_1$ to $C_6$ perfluoro alkanediyl group;
$X^{12}$ represents *—CO—O— or *—O—CO—, * represents a bond to $A_{13}$;
$A^{14}$ represents a $C_1$ to $C_{17}$ aliphatic hydrocarbon group that optionally has one or more halogen atoms.

2. The resist composition according to claim 1, wherein the acid generator having an acid labile group is an acid generator represented by the formula (II);

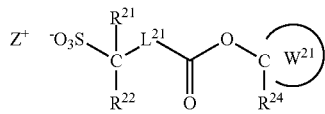
(II)

wherein $R^{21}$ and $R^{22}$ independently represent a fluorine atom or a $C_1$ to $C_6$ perfluoroalkyl group;
$L^{21}$ L represents a single bond or a $C_1$ to $C_{20}$ divalent hydrocarbon group, and one or more —$CH_2$— contained in the divalent hydrocarbon group may be replaced by —O— or —CO—;
$R^{24}$ represents a $C_1$ to $C_{12}$ hydrocarbon group;
ring $W^{21}$ represents an optionally substituted $C_3$ to $C_{18}$ hydrocarbon ring;
$Z^+$ represents an organic cation.

3. The resist composition according to claim 2, wherein $L^{21}$ in the formula (II) is a single bond or *—CO—O-L22-, $L^{22}$ represents a $C_1$ to $C_6$ alkanediyl group, * represents a bond to the carbon atom of —$CR^{21}R^{22}$—.

4. The resist composition according to claim 2, wherein $Z^+$ in the formula (II) is a triaryl sulfonium cation.

5. The resist composition according to claim 1, wherein $A^1$ in the formula (I) is an ethylene group.

6. The resist composition according to claim 1, wherein $X^{12}$ in the formula (I) is *—CO—O—, * represents a bond to $A_{13}$.

7. The resist composition according to claim 1, wherein $A^{14}$ in the formula (I) is a cyclopropylmethyl, cyclopentyl, cyclohexyl, norbornyl or adamantyl group.

8. The resist composition according to claim 1, which further comprises a solvent.

9. A method for producing a resist pattern comprising steps of:
(1) applying the resist composition of claim 1 onto a substrate;
(2) drying the applied composition to form a composition layer;
(3) exposing the composition layer;
(4) heating the exposed composition layer, and
(5) developing the heated composition layer.

* * * * *

UNITED STATES PATENT AND TRADEMARK OFFICE
CERTIFICATE OF CORRECTION

PATENT NO. : 8,741,543 B2  Page 1 of 1
APPLICATION NO. : 13/551874
DATED : June 3, 2014
INVENTOR(S) : Ichikawa et al.

It is certified that error appears in the above-identified patent and that said Letters Patent is hereby corrected as shown below:

ON THE TITLE PAGE:

Item [45], Date of Patent, delete "*Jun. 3, 2014" and insert --Jun. 3, 2014--.

Item [*], Notice, delete "This patent is subject to a terminal disclaimer.".

Signed and Sealed this
Twenty-eighth Day of October, 2014

Michelle K. Lee
*Deputy Director of the United States Patent and Trademark Office*